US005635882A

United States Patent [19]

Kaida

[11] Patent Number: 5,635,882
[45] Date of Patent: Jun. 3, 1997

[54] LATERALLY COUPLED PIEZO-RESONATOR LADDER-TYPE FILTER WITH AT LEAST ONE BENDING MODE PIEZO-RESONATOR

[75] Inventor: Hiroaki Kaida, Nagaokakyo, Japan

[73] Assignee: Murata Manufacturing Co., Ltd., Japan

[21] Appl. No.: 426,689

[22] Filed: Apr. 18, 1995

Related U.S. Application Data

[62] Division of Ser. No. 292,244, Aug. 17, 1994.

[30] Foreign Application Priority Data

| Aug. 17, 1993 | [JP] | Japan | 5-203426 |
| Sep. 2, 1993 | [JP] | Japan | 5-218585 |
| Sep. 30, 1993 | [JP] | Japan | 5-244569 |
| Sep. 30, 1993 | [JP] | Japan | 5-244570 |
| Oct. 1, 1993 | [JP] | Japan | 5-247183 |
| Dec. 16, 1993 | [JP] | Japan | 5-316282 |

[51] Int. Cl.⁶ .................................................. H03H 9/54
[52] U.S. Cl. .................................... 333/189; 310/368
[58] Field of Search ................................ 333/187, 189; 310/367, 368, 320

[56] References Cited

U.S. PATENT DOCUMENTS

| 2,443,471 | 6/1948 | Mason | 310/326 |
| 3,185,943 | 5/1965 | Honda et al. | 333/189 X |
| 3,411,023 | 11/1968 | Quate et al. | 330/5 X |
| 3,488,530 | 1/1970 | Staudte | 310/321 |
| 3,723,920 | 3/1973 | Sheahan et al. | 333/189 |
| 3,745,385 | 7/1973 | Nakajima | 310/358 |
| 4,101,795 | 7/1978 | Fukomoto et al. | 310/336 |
| 4,287,493 | 9/1981 | Masaie | 333/191 |
| 4,323,865 | 4/1982 | Tanaka et al. | 333/187 |
| 4,348,609 | 9/1982 | Inoue | 310/367 |
| 4,350,918 | 9/1982 | Sato | 310/367 |
| 4,355,257 | 10/1982 | Kawashima et al. | 310/361 |
| 4,356,421 | 10/1982 | Shimizu, et al. | 310/320 |

(List continued on next page.)

FOREIGN PATENT DOCUMENTS

| 0365268 | 4/1990 | European Pat. Off. | 310/367 |
| 0496583 | 1/1992 | European Pat. Off. | |
| 2547458 | 2/1984 | France | 310/346 |
| 2939844 | 7/1980 | Germany | |
| 3220032 | 12/1982 | Germany | |
| 55-49013 | 4/1980 | Japan | |
| 55-52621 | 4/1980 | Japan | 310/368 |
| 55-64414 | 5/1980 | Japan | 310/344 |
| 57-48818 | 3/1982 | Japan | 310/344 |
| 57-91016 | 6/1982 | Japan | 333/187 |
| 0137113 | 7/1985 | Japan | |
| 0154211 | 7/1986 | Japan | 333/187 R |
| 63-187907 | 8/1988 | Japan | 333/187 |
| 63-253711 | 10/1988 | Japan | |
| 63-260310 | 10/1988 | Japan | 310/367 |
| 63-260311 | 10/1988 | Japan | 310/367 |
| 63-311810 | 12/1988 | Japan | 310/367 |
| 0180109 | 7/1989 | Japan | 333/187 V |

(List continued on next page.)

OTHER PUBLICATIONS

Ormondroyd et al., "The Theory of the Dynamic Vibration Absorber" pp. 9–22. *Transactions of the American Society of Mechanical Engineers*, APM–50–7, 1929.

Co–pending U.S. Patent application No. 08/443,783.

(List continued on next page.)

*Primary Examiner*—Benny Lee
*Assistant Examiner*—Justin P. Bettendorf
*Attorney, Agent, or Firm*—Ostrolenk, Faber, Gerb & Soffen, LLP

[57] ABSTRACT

A ladder-type filter having a circuit structure obtained by connecting a plurality of series resonators and a plurality of parallel resonators with each other. At least two plate-type resonators are laterally coupled with each other with respect to a mounting surface. At least one of the series and parallel resonators is an energy trap type piezo-resonator having a plate type piezoelectric vibrating part, a support part which is coupled to the piezoelectric vibrating part, and a holding part which is coupled to the support part.

10 Claims, 51 Drawing Sheets

U.S. PATENT DOCUMENTS

| | | | |
|---|---|---|---|
| 4,365,181 | 12/1982 | Yamamoto | 310/320 |
| 4,443,728 | 4/1984 | Kudo | 310/312 |
| 4,447,753 | 5/1984 | Ochiai | 310/312 |
| 4,454,444 | 6/1984 | Fujiwara et al. | 310/360 |
| 4,462,092 | 7/1984 | Kawabuchi et al. | 310/336 X |
| 4,484,382 | 11/1984 | Kawashima | 310/312 X |
| 4,511,202 | 4/1985 | Kasai | 333/189 |
| 4,555,682 | 11/1985 | Gounji et al. | 333/189 |
| 4,562,372 | 12/1985 | Nakamura et al. | 310/368 X |
| 4,564,825 | 1/1986 | Takahashi et al. | 333/191 |
| 4,571,794 | 2/1986 | Nakamura | 29/25.35 |
| 4,609,844 | 9/1986 | Nakamura et al. | 310/368 X |
| 4,757,581 | 7/1988 | Yamada et al. | 310/368 X |
| 4,900,971 | 2/1990 | Kawashima | 310/361 |
| 5,001,383 | 3/1991 | Kawashima | 310/367 |
| 5,006,824 | 4/1991 | Paff | 333/197 |
| 5,059,853 | 10/1991 | Kawashima | 310/367 |
| 5,107,164 | 4/1992 | Kimura | 310/367 |
| 5,117,147 | 5/1992 | Yoshida | 310/320 |
| 5,118,980 | 6/1992 | Takahashi | 310/320 |
| 5,159,301 | 10/1992 | Kaida et al. | 333/187 |
| 5,192,925 | 3/1993 | Kaida | 333/187 |
| 5,218,260 | 6/1993 | Kawashima | 310/361 |
| 5,260,675 | 11/1993 | Ogawa et al. | 333/189 |
| 5,274,297 | 12/1993 | Hermann et al. | 310/367 X |
| 5,302,880 | 4/1994 | Kaida | 310/370 |
| 5,341,550 | 8/1994 | Kaida | 310/321 X |
| 5,394,123 | 2/1995 | Inoue et al. | 333/189 |
| 5,422,532 | 6/1995 | Inoue et al. | 310/326 |
| 5,442,251 | 8/1995 | Kaida et al. | 310/321 |

FOREIGN PATENT DOCUMENTS

| | | | |
|---|---|---|---|
| 0279510 | 3/1990 | Japan . | |
| 0275213 | 3/1990 | Japan . | |
| 0279511 | 3/1990 | Japan | 310/367 |
| 3226106 | 10/1991 | Japan | 333/187 |
| 4192909 | 7/1992 | Japan . | |
| 5075372 | 3/1993 | Japan . | |
| 1358596 | 6/1970 | United Kingdom . | |
| 2004434 | 3/1979 | United Kingdom . | |
| 2043995 | 10/1979 | United Kingdom . | |
| 2102199 | 5/1982 | United Kingdom . | |
| 2117968 | 3/1983 | United Kingdom . | |
| 2213013 | 8/1989 | United Kingdom . | |
| 2277228 | 10/1994 | United Kingdom . | |
| 9216997 | 10/1992 | WIPO . | |

OTHER PUBLICATIONS

Co-pending U.S. Patent application No. 08/292,244.
Co-pending U.S. Patent application No. 08/423,466.
Co-pending U.S. Patent application No. 08/444,831.
*Transducers & Their Elements: Design & Application,* Alexander D. Khazan "Strain-gage Elements," p.41, 1993.
*Mechanical Vibrations,* J.P. Hartog, 1984, "3.2. The Undamped Dynamic Vibration Absorber.", pp. 87-93.
Vibration Engineering, Osamu Taniguchi, pp. 112-116, and English Translation .
Co-pending U.S. Patent Application No. 08/458,171.
Co-pending Patent Application No. 08/452,516.
Co-pending U.S. Patent Application No. 08/227,607.
Co-pending U.S. Patent Application No. 08/285,233.
Co-pending U.S. Patent Application No. 08/506,262.
Co-pending U.S. Patent Application No. 08/459,185.
Inoue et al., "First and Second Order Group Timing Tank Ceramic Filters for PCM Carriers Systems," Japanese Journal of Applied Physics, vol. 20 (1981) Supplement 20-4, pp. 101-104.
U.S. Application 08/227,279.
U.S. Application 08/287,530.

LATERALLY COUPLED PIEZO-RESONATOR LADDER-TYPE FILTER WITH AT LEAST ONE BENDING MODE PIEZO-RESONATOR

RELATED APPLICATIONS

This application is a divisional of U.S. application Ser. No. 08/292,244 filed Aug. 17, 1994.

BACKGROUND OF THE INVENTION

1. Field of the Invention

The present invention relates to a ladder-type filter comprising at least one series resonator and at least one parallel resonator which are connected with each other in the form of a ladder, and more particularly, the present invention relates to a ladder-type filter which has an improved resonator structure forming the series and parallel resonators.

2. Description of the Background Art

FIG. 1 shows an exemplary structure of a conventional ladder-type filter. This ladder-type filter is formed by a plurality of angular piezo-resonators utilizing an expansion vibration mode. Namely, a two-stage ladder-type filter having four elements shown in a circuit diagram in FIG. 2 is formed by rectangular plate type series resonators 1 and 2 and rectangular plate type parallel resonators 3 and 4.

Referring to FIG. 1, numeral 2a denotes an electrode which is formed on one major surface of the series resonator 2, while a similar electrode is also formed on another major surface of the series resonator 2. Further, similar electrodes are also formed on both major surfaces of the series resonator 1. On the other hand, electrodes 3a and 4a are formed entirely over both major surfaces of the series resonators 3 and 4, respectively.

Numerals 5 to 11 denote metal terminals, which are employed to electrically connect the series resonators 1 and 2 and the parallel resonators 3 and 4 with each other as shown in FIG. 2. These metal terminals 5 to 11 are stored in a case member 12, which is made of an insulating material, with the series resonators 1 and 2 and the parallel resonators 3 and 4. A cover member (not shown) closes an upper opening 12a of the case member 12, thereby forming a ladder-type filter component. The metal terminals 9 to 11 are drawn out from the case member 12, to be employed as terminals for connection with an exterior component.

In order to drive the aforementioned ladder-type filter, it is necessary that the series resonators 1 and 2 and the parallel resonators 3 and 4 which are stored in the case member 12 can vibrate in desired modes. In other words, the resonators 1 to 4 must not be inhibited from vibration in the case member 12. Therefore, the metal terminal 11 which is located on an end portion is formed of a spring terminal having a spring property.

In the ladder-type filter shown in FIG. 1, however, a considerably large unnecessary space is defined due to the metal terminal 11 which is formed by a spring terminal for allowing vibration of the resonators 1 to 4 stored in the case member 12, and hence, the overall ladder-type filter has a considerably large size. For example, the completed two-stage ladder-type filter containing four elements shown in FIG. 1 is about 7.0 mm by 8.0 mm by 8.0 mm.

In recent years, there has been a demand for a ladder-type filter which is formed as a surface-mount type electronic component.

To this end, co-pending U.S. patent application Ser. No. 07/941,081 and International Patent Laying-Open No. WO 92/16997 describe a ladder-type filter which can be reduced in overall size and formed as a surface-mount type electronic component. In this ladder-type filter, series and parallel resonators are formed by tuning fork type piezo-resonators defining tuning fork type vibrating parts on one edge of a piezoelectric plate. Further, a plurality of tuning fork type piezo-resonators forming the series and parallel resonators are stacked with each other through a cavity forming member for ensuring cavities for allowing vibration of the tuning fork type vibrating parts, to be integrated with each other.

In the aforementioned ladder-type filter employing tuning fork type piezo-resonators, it is possible to implement simplification of assembling steps, miniaturization and surface mounting. In this ladder-type filter, however, it is impossible to ensure a sufficient bandwidth, due to employment of the tuning fork type piezo-resonators.

SUMMARY OF THE INVENTION

The preferred embodiments of the present invention provide a ladder-type filter which achieves simplification of manufacturing steps, miniaturization and surface mounting, as well as insurance of a sufficient bandwidth.

According to one aspect of the preferred embodiments of the present invention, a ladder-type filter includes at least one series resonator forming a series arm, and at least one parallel resonator forming a parallel arm, and at least two of the series and parallel resonators are laterally coupled with each other.

The ladder-type filter according to the preferred embodiments of the present invention can be reduced in height, since at least two of the series and parallel resonators are laterally coupled with each other in a direction which is parallel to a mounting surface. Further, the ladder-type filter can also be readily formed as a chip-type component, due to such a structure.

According to the preferred embodiments of the present invention, further, at least one of the series and parallel resonators comprises an energy trap type piezo-resonator having a plate type piezoelectric vibrating part, a support part which is coupled to the piezoelectric vibrating part, and a holding part which is coupled to the support part, so that no vibrational energy is transmitted to the support part. Therefore, it is possible to fix this piezo-resonator to another piezo-resonator or a case substrate through the holding part, without deteriorating resonance characteristics of the piezo-resonator.

The energy trap type piezo-resonator can be selected from various types of piezo-resonators.

A first type piezo-resonator is an energy trap type piezo-resonator utilizing a width expansion mode.

As will be explained below, the width expansion mode is a newly discovered vibration mode that results in little or no vibration being transmitted to a support part. Because of the structure of the width expansion mode vibrator, vibration is trapped within the vibration part and is not transmitted to the support part. The width expansion mode vibrator includes a rectangular plate type piezoelectric vibrating part having longer and shorter sides which are selected so as to define a ratio b/a ranging over ±10% of the following value:

$$b/a = n(-1.47\sigma + 1.88) \quad (1)$$

where a and b represent lengths of the shorter and longer sides, respectively, σ represents the Poisson's ratio of the material forming the piezoelectric vibrating part and n represents an integer, and further comprising a support part which is coupled to the center of each shorter side of the piezoelectric vibrating part, and a holding part which is coupled to an outer end of the support part.

As clearly understood from the preferred embodiments described later, the aforementioned width expansion mode is one of the vibration modes of a rectangular plate type vibrator, which vibrates in a vibrating state between expansion mode vibration of a square vibrator and width mode vibration of a rectangular vibrator.

In the aforementioned piezo-resonator utilizing a width expansion mode, it is possible to support the piezoelectric vibrating part while trapping its vibrational energy by simply fixing or integrating the support part to or with the center of each shorter side of the piezoelectric vibrating part, whereby the support structure can be simplified. Thus, it is possible to form a miniature ladder-type filter by combining this piezo-resonator with another resonator through the holding part which is provided on the outer side of the support part.

Further, the piezoelectric vibrating part is excited in a width expansion mode, whereby it is also possible to obtain a ladder-type filter having a wider frequency band as compared with the prior art.

According to another aspect of the preferred embodiments of the present invention, the ratio between the longer and shorter sides of the rectangular plate type piezoelectric vibrating part utilizing a width expansion mode is set in the aforementioned specific preferred range, whereby width expansion mode vibration is efficiently excited and trapped. This phenomenon has been experimentally confirmed by the inventor.

A second type piezo-resonator is an energy trap type piezo-resonator utilizing a shear mode comprising a piezoelectric vibrating part having a plate type piezoelectric member which is polarized in one direction and first and second resonance electrodes which are formed on the piezoelectric member for applying an alternating voltage in a direction perpendicular to the polarization direction, so that a surface of the piezoelectric member which is parallel to the polarization direction has a rectangular shape with a ratio b/a being in a range of ±10% of the following value:

$$b/a = n(0.3\sigma + 1.48) \quad (2)$$

assuming that a and b represents lengths of shorter and longer sides of the rectangular piezoelectric surface, respectively, $\sigma$ represents the Poisson's ratio of the piezoelectric member and n represents an integer, a support part which is coupled to the piezoelectric vibrating part, and a holding part which is coupled to the support part.

In the second type piezo-resonator, the piezoelectric vibrating part is formed to have the aforementioned specific shape, whereby vibrational energy is effectively trapped in the piezoelectric vibrating part when an alternating voltage is applied across the first and second resonance electrodes to resonate the piezoelectric vibrating part. This phenomenon has been experimentally confirmed by the inventor.

The vibrational energy is effectively trapped in the piezoelectric vibrating part also in the second type energy trap piezo-resonator as described above, whereby the second type energy trap piezo-resonator can be supported through the holding part with substantially no deterioration of resonance characteristics. Thus, it is possible to readily form a miniature ladder-type filter by combining the piezo-resonator with another resonator through the holding part.

Since this piezo-resonator utilizes a shear mode, it is possible to widen the frequency band of the ladder-type filter as compared with a piezoelectric tuning fork type resonator.

A third type piezo-resonator is an energy trap type piezo-resonator comprising a plate type piezoelectric vibrating part having a pair of opposite rectangular surfaces and four side surfaces coupling the pair of rectangular surfaces with each other, first and second resonance electrodes which are formed on the pair of rectangular surfaces of the piezoelectric vibrating part, a support part which is coupled to an end of that of the side surfaces of the piezoelectric vibrating part along each shorter side of the rectangular surface, and a holding part which is coupled to the support part. In this piezo-resonator, a ratio b/a is set in a range of ±10% of the following value:

$$b/a = n(0.3\sigma + 1.48) \quad (3)$$

assuming that a and b represent shorter and longer sides of the rectangular surfaces, $\sigma$ represents the Poisson's ratio of the material forming the piezoelectric vibrating part and n represents an integer, for exciting bending mode vibration of degree 2n through a piezoelectric transverse effect. Also in the third type piezo-resonator, the piezoelectric vibrating part is formed to have the aforementioned specific shape, whereby bending mode vibration of degree 2n is effectively trapped in the piezoelectric vibrating part. This phenomenon has been experimentally confirmed by the inventor.

Resonance energy is effectively trapped in the piezoelectric vibrating part also in a ladder-type filter employing the third type piezo-resonator, whereby the third type piezo-resonator can be readily combined with another resonator or bonded to a case substrate through the holding part, with substantially no deterioration of resonance characteristics. Thus, it is possible to form a miniature ladder-type filter having stable characteristics, which can be simplified in support structure.

A fourth type of piezo-resonator is an energy trap type piezoelectric resonator having a dynamic damper provided between a piezoelectric vibrating part and a holding part. In this structure, vibrational energy is effectively trapped in a vibration portion connected to the dynamic damper, due to a phenomenon of a dynamic damper. Such a phenomenon of a dynamic damper is described in detail in "Vibration Engineering" by Osamu Taniguchi, Carona Publishing Co., Ltd., pp. 113 to 116, for example. Briefly stated, the phenomenon of a dynamic damper is such a phenomenon that vibration of a principal vibrator which must be prevented from vibration is suppressed when a subvibrator is coupled to the principal vibrator with proper selection of its natural frequency. The aforementioned dynamic damper corresponds to the subvibrator in this phenomenon of a dynamic damper, while the support part which vibrates by vibration from a resonance part corresponds to the principal vibrator.

In a ladder-type filter employing the fourth type piezo-resonator, at least one resonator is formed by the piezo-resonator having the dynamic damper whereby vibrational energy trap efficiency is improved. Thus, it is possible to miniaturize the piezo-resonator, whereby the ladder-type filter can also be miniaturized by employment of the piezo-resonator.

One feature of the fourth type energy trap piezo-resonator resides in provision of the dynamic damper as described above, and the piezoelectric vibrating part itself is not restricted. When the dynamic damper is provided in any of the aforementioned first to third type energy trap piezo-resonators, it is possible to suppress slightly leaking vibration by the dynamic damper, if any, thereby further improving energy trap efficiency. Alternatively, it is possible to properly employ a piezoelectric vibrating part such as that utilizing a length mode, an ordinary piezoelectric vibrating part utilizing a shear mode, or that of a square plate utilizing an expansion mode, for example, which is different from those provided in the first to third type energy trap piezo-resonators. Namely, the fourth type energy trap piezo-resonator having a dynamic damper can employ any of piezoelectric vibrating parts which are excited in various vibration modes in response to a target resonance frequency, whereby it is possible to readily obtain a ladder-type filter which can be employed in various frequency bands.

Due to provision of the dynamic damper, vibrational energy is effectively trapped in a portion up to the dynamic damper, whereby the piezo-resonator can be held through the holding part similarly to the first to third energy trap piezo-resonators, with substantially no deterioration of resonance characteristics. Thus, it is possible to readily form a miniature ladder-type filter having stable characteristics which is reduced in height, in particular.

According to a preferred mode of the present invention, the aforementioned support and holding parts are coupled to both sides of the piezoelectric vibrating part so that the piezoelectric vibrating part is supported by the support parts on both sides thereof, whereby a ladder-type filter having a more stable structure can be obtained. When the holding parts are thus arranged on both sides of the piezoelectric vibrating part, it is possible to hold the piezo-resonator through the holding parts which are arranged on both sides, whereby the support structure is also stabilized.

As hereinabove described, the ladder-type filter according to the preferred embodiments of the present invention has at least two plate type resonators which are laterally coupled with each other in parallel with a mounting surface. In more concrete terms, it is possible to form such a coupled structure by arranging the coupled structure between first and second case substrates so that the former is held by the latter, thereby readily forming a chip-like ladder-type filter. Alternatively, the coupled structure may be stacked on a base substrate so that a cap member is fixed to the base substrate to enclose the coupled structure, thereby forming a chip-like ladder-type filter.

While at least one of the series and parallel resonators has a plate type piezoelectric part, a support part and a holding part as described above, all resonators may have plate type piezoelectric vibrating parts, support parts and holding parts. In this case, all resonators can be coupled with each other through the holding parts as well as fixed to case substrates or the like, whereby a chip-like ladder-type filter can be readily formed.

In the aforementioned structure provided with holding parts on both sides of the piezo-resonator according to the preferred embodiments of the present invention, first and second spacer plates are preferably provided on both sides of at least two aforementioned piezo-resonators. The first and second spacer plates are coupled to the respective piezo-resonators to allow vibration of vibrating parts thereof, whereby a resonance plate is defined by the aforementioned at least two piezo-resonators and the first and second spacer plates. When such a resonance plate is defined, it is possible to readily form a chip-like ladder-type filter having a laminate structure.

When the aforementioned at least two piezo-resonators and the first and second spacer plates defining the resonator plate are integrally formed with each other by the same member, side spaces of the resonator are reliably enclosed so that it is possible to readily obtain a ladder-type filter which is excellent in environment-resistant characteristics such as moisture resistance.

Further, an additional resonance plate may be stacked on the aforementioned resonance plate. Namely, the inventive ladder-type filter may comprise two or more resonance plates.

The piezoelectric vibrating part is preferably provided with first and second resonance electrodes for exciting the piezoelectric vibrating part, while a lead electrode is formed on the holding part. In this case, the first and second resonance electrodes are electrically connected to the lead electrode. Thus, it is possible to resonate the piezoelectric vibrating part by electrically connecting the lead electrode with the exterior.

More preferably, a plurality of external electrodes are formed on outer surfaces of the inventive ladder-type filter, so that the plurality of external electrodes are electrically connected with the aforementioned prescribed lead electrode. Thus, it is possible to form the ladder-type filter as a chip-type electronic component having a plurality of external electrodes.

In each of the first to third type energy trap piezo-resonators, the piezoelectric material forming the piezoelectric vibrating part may be prepared from a piezoelectric single crystal of $LiTaO_3$ or $LiNbO_3$, in addition to piezoelectric ceramics. Alternatively, a piezoelectric thin film may be applied to a surface of a metal plate or a semiconductor plate, to form the piezoelectric vibrating part by such a composite member. When the piezoelectric vibrating part is formed by the composite member, the aforementioned Poisson's ratio $\sigma$ is selected in consideration of that of the composite material.

The foregoing and other objects, features, aspects and advantages of the preferred embodiments of the present invention will become more apparent from the following detailed description of the preferred embodiments of the present invention when taken in conjunction with the accompanying drawings.

BRIEF DESCRIPTION OF THE DRAWINGS

FIG. 11 illustrates relation between the Poisson's ratios and the ratios b/a;

FIG. 19 illustrates relation between Poisson's ratios σ of piezoelectric materials and ratios b/a;

DETAILED DESCRIPTION OF PREFERRED EMBODIMENTS

Non-restrictive preferred embodiments of the present invention are now described, to clarify the present invention.

<First Type Energy Trap Piezo-Resonator>

A first type piezo-resonator having a characteristic structure which is employed in the present invention is first described, followed by description of a ladder-type filter employing the first type piezo-resonator.

Figure 1:
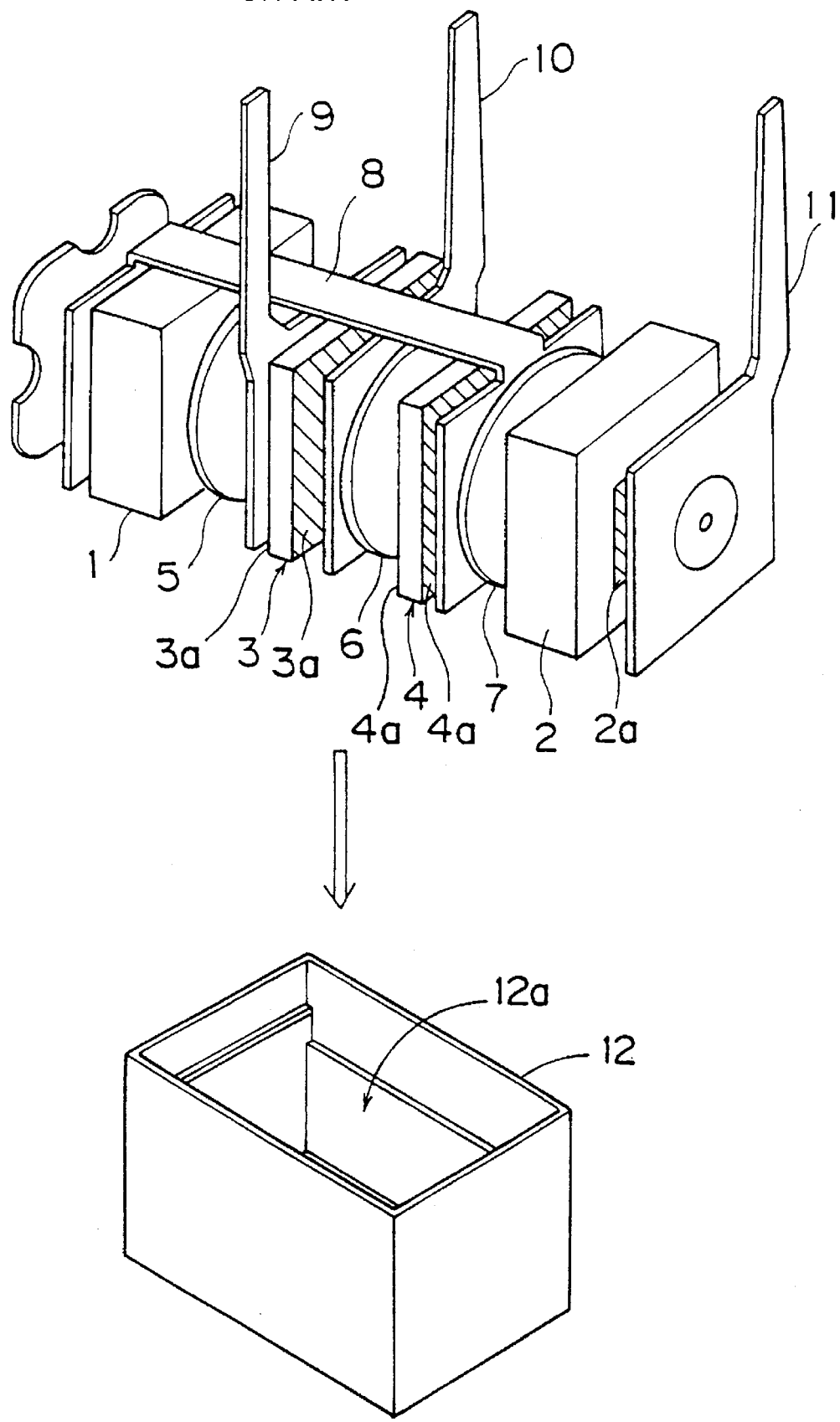
FIG. 1 is an exploded perspective view for illustrating a conventional ladder-type filter.
Figure 2:
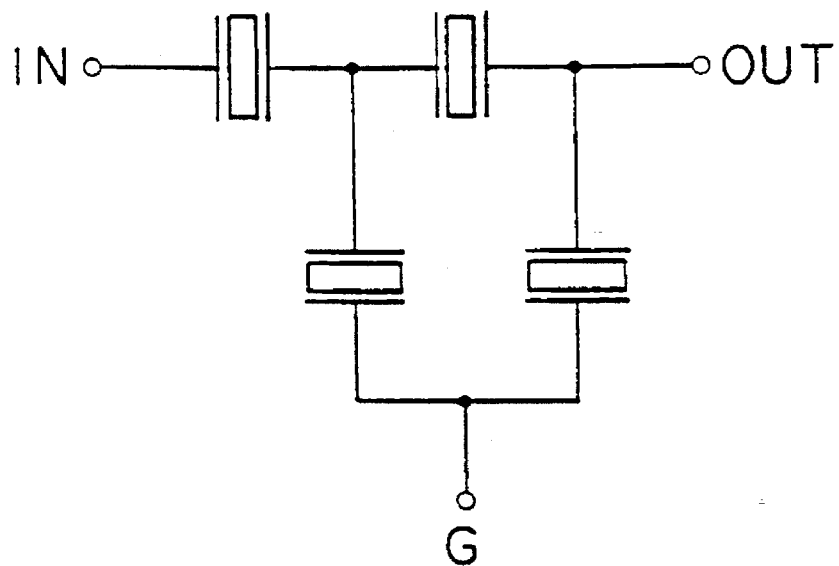
FIG. 2 shows the circuit structure of the conventional ladder-type filter.
Figure 3:
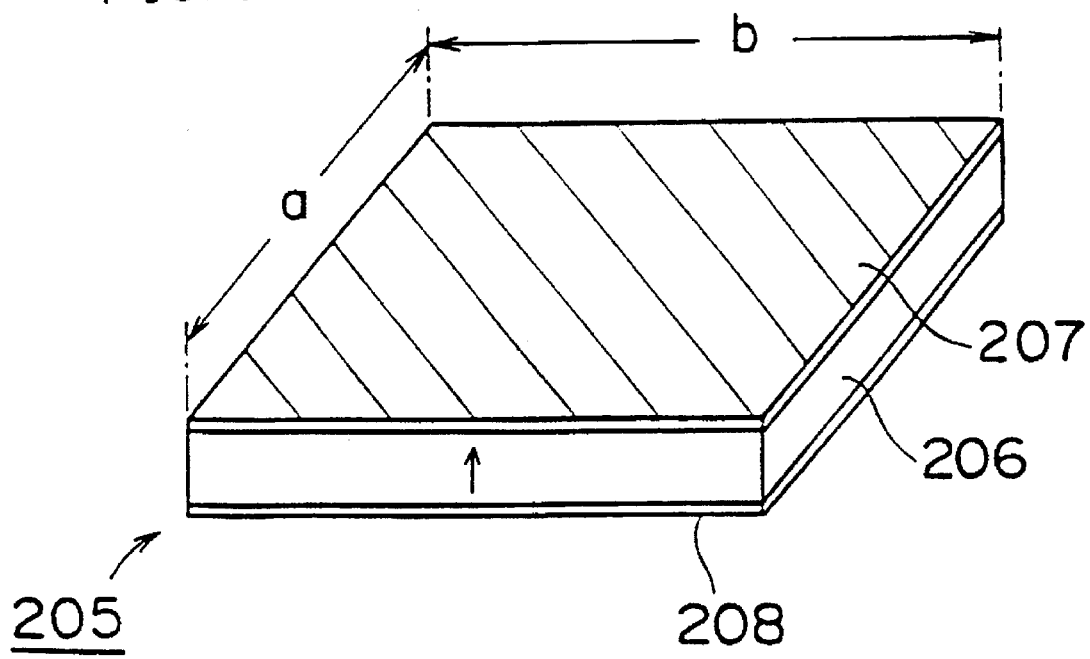
FIG. 3 is a perspective view for illustrating a piezoelectric vibrating part which is employed in a piezo-resonator of a width expansion mode.

FIG. 3 is a perspective view for illustrating a piezoelectric vibrating part in a first type energy trap piezo-resonator 205 which is employed in the preferred embodiments of the present invention. In this piezo-resonator 205, electrodes 207 and 208 are formed on both major surfaces of a rectangular piezoelectric ceramic plate 206 which is polarized so that axes of polarization are regularized along the thickness direction. Assuming that a and b represents lengths of shorter and longer sides of the piezoelectric ceramic plate 206, the ratio b/a is selected in the aforementioned specific preferred range, whereby a width expansion mode is strongly excited as hereinafter described. Description is now made on the fact that a width expansion mode is strongly excited when the ratio b/a is set in the aforementioned specific range.

Figure 4:
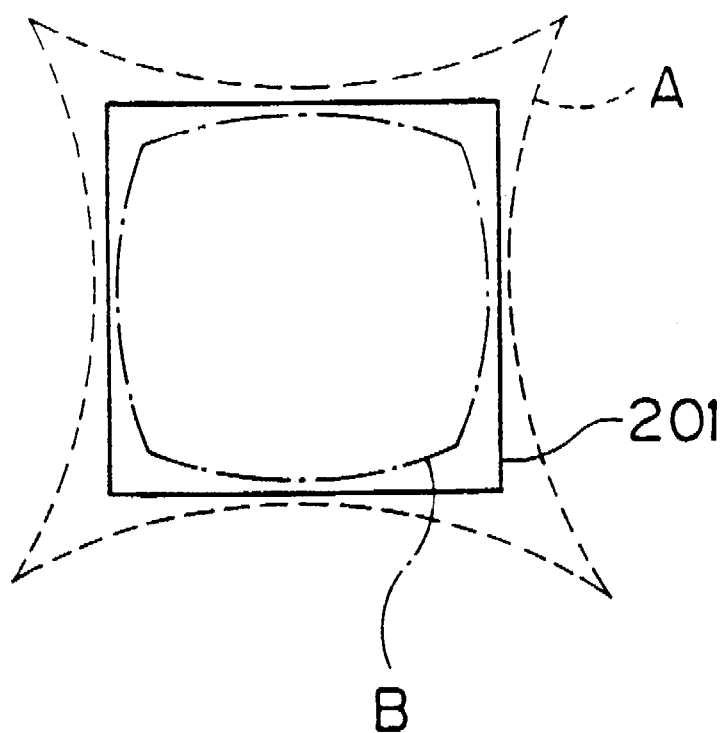
FIG. 4 is a schematic plan view for illustrating an expansion mode.
Figure 5:
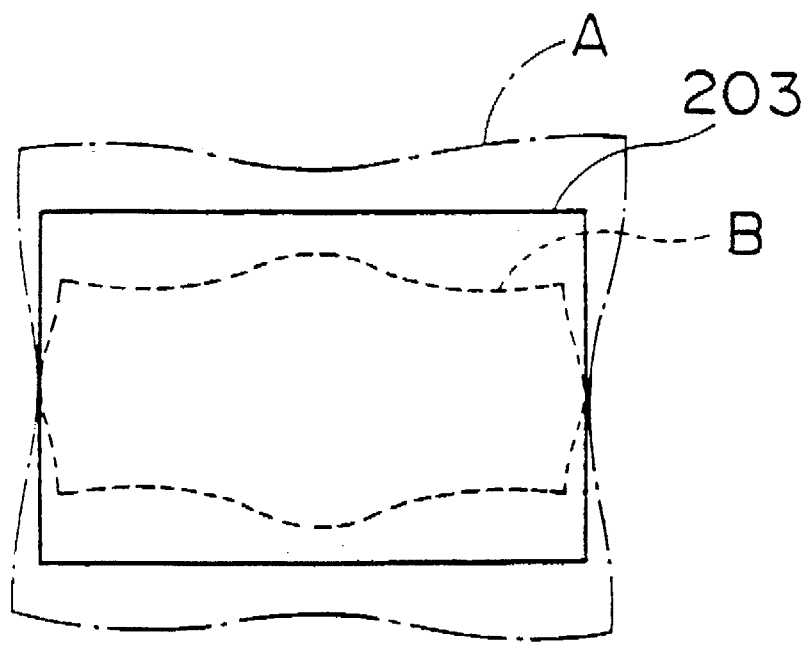
FIG. 5 is a schematic plan view for illustrating a width expansion mode.
Figure 6:
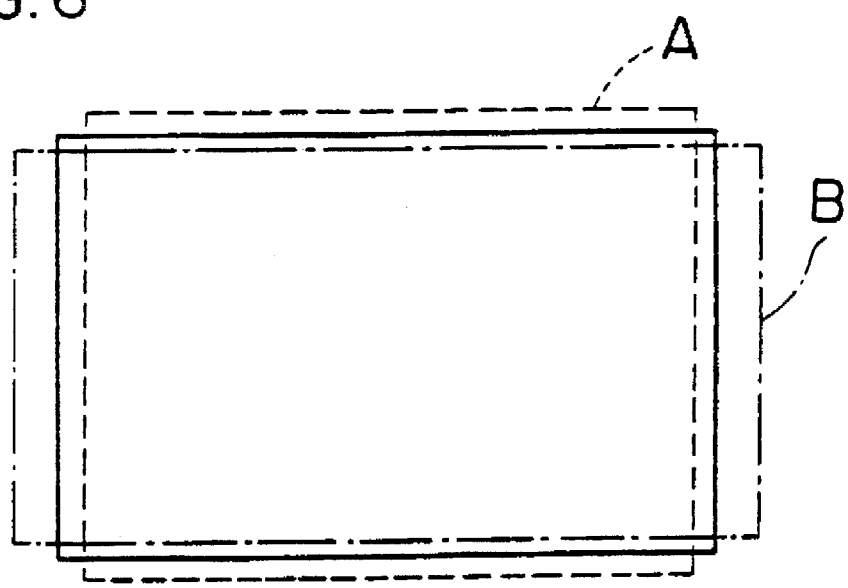
FIG. 6 is a schematic plan view for illustrating a width mode.

FIGS. 4 to 6 are schematic plan views showing vibrating states of vibrators, for illustrating an expansion mode, a width expansion mode and a width mode, respectively. The inventor has analyzed vibrating states of rectangular plate type vibrators by a finite element method, while varying lengths of shorter and longer sides thereof. When the ratio b/a of the length b of each longer side to the length a of each shorter side is 1, i.e., when the vibrator is in the form of a square, vibration of an expansion vibration mode is strongly excited as shown in FIG. 4. Namely, vibration is repeated between a state shown by broken lines A and that shown by one-dot chain lines B in a vibrator 201 having a square planar shape shown in FIG. 4, whereby an expansion mode is strongly excited.

When the ratio b/a is considerably greater than 1, i.e., when b/a>>1, a rectangular vibrator vibrates between a state shown by broken lines A and that shown by solid lines B as shown in FIG. 6, whereby width mode vibration is strongly excited.

When the ratio b/a is greater than 1 and less than that exciting the aforementioned width mode vibration, vibration between states shown by one-dot chain lines A and broken lines B, i.e., width expansion mode vibration, is strongly excited in a vibrator 203 shown in FIG. 5.

The aforementioned width expansion mode has been named as such since the same is regarded as an intermediate vibration mode between the well-known expansion and width modes.

On the basis of the aforementioned discovery, the inventor has prepared samples of the piezo-resonator 205 shown in FIG. 3 from piezoelectric ceramic plates having ratios b/a which were selected at specific values.

Figure 7A:
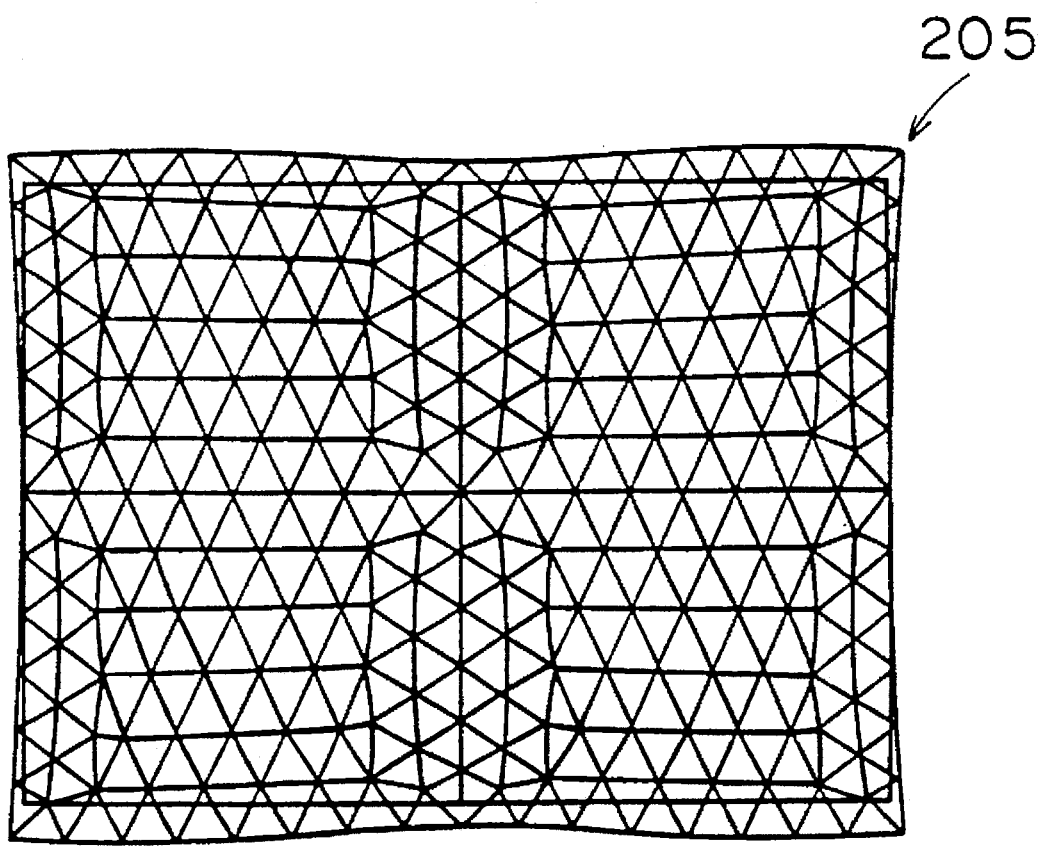
FIGS. 7A and 7B are a diagram showing displacement deviation of width expansion mode vibration analyzed by a finite element method, and a diagram for illustrating coordinates in FIG. 7A, respectively.

When the ratios b/a were varied in the samples of the piezo-resonator 205 to excite the aforementioned width expansion mode, it was confirmed that the width expansion mode is most strongly excited when the ratio b/a satisfies $1.47\sigma+1.88$. Displacement distribution in this sample of the piezo-resonator 205 was analyzed by a finite element method, whereby a result shown in FIG. 7A was obtained.

Figure 7B:
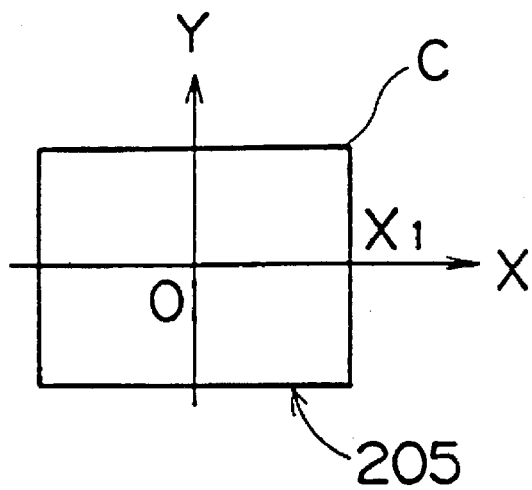
Figure 8:
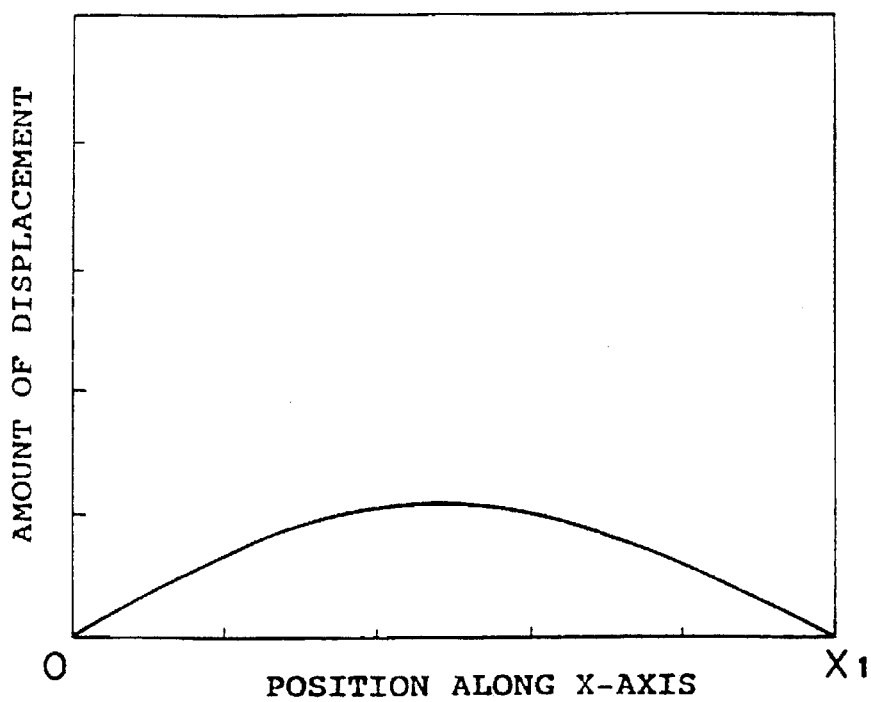
FIG. 8 illustrates relation between positions along a direction x and amounts of displacement in the displacement distribution shown in FIG. 7.

In the displacement distribution analyzed by the finite element method, displaced states of respective parts were measured while defining x- and y-axes as shown in FIG. 7B with an origin which was set at the center of a major surface of the piezo-resonator 205, whereby a result shown in FIG. 8 was obtained. It is understood that the amounts of displacement are minimized at the center O and a point $X_1$ in FIG. 7B, i.e., at the center of the shorter side, and maximized at an intermediate portion therebetween in positions of the piezo-resonator 205 excited in the aforementioned width expansion mode along the x-axis. This means that nodal points are located at the centers of the major surface and the shorter sides in the piezo-resonator 205 utilizing a width expansion mode. Thus, it is understood that it is possible to support the piezo-resonator 205 without hindering the width expansion mode, by supporting the center of the major surface or one or both of the shorter sides via another support member.

Figure 9:
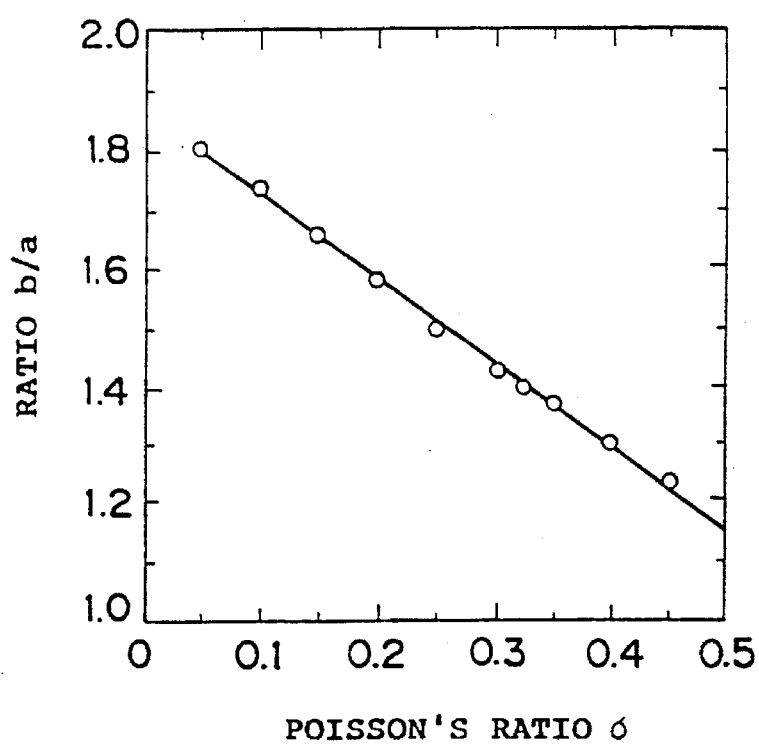
FIG. 9 illustrates relation between Poisson's ratios and dimensional ratios b/a for exciting a width expansion mode.

It has also been discovered that the aforementioned ratio b/a is relative to the Poisson's ratio of the piezo-resonator 205. When the Poisson's ratios of vibrators were varied to measure ratios b/a for exciting the aforementioned the aforementioned width expansion mode and to plot such ratios b/a, a result shown in FIG. 9 was obtained. As understood from the straight line shown in FIG. 9, therefore, it has been confirmed possible to reliably excite a width expansion vibration mode by selecting the ratio b/a to satisfy the following equation:

$$b/a=-1.47\sigma+1.88 \qquad (4)$$

Figure 10:
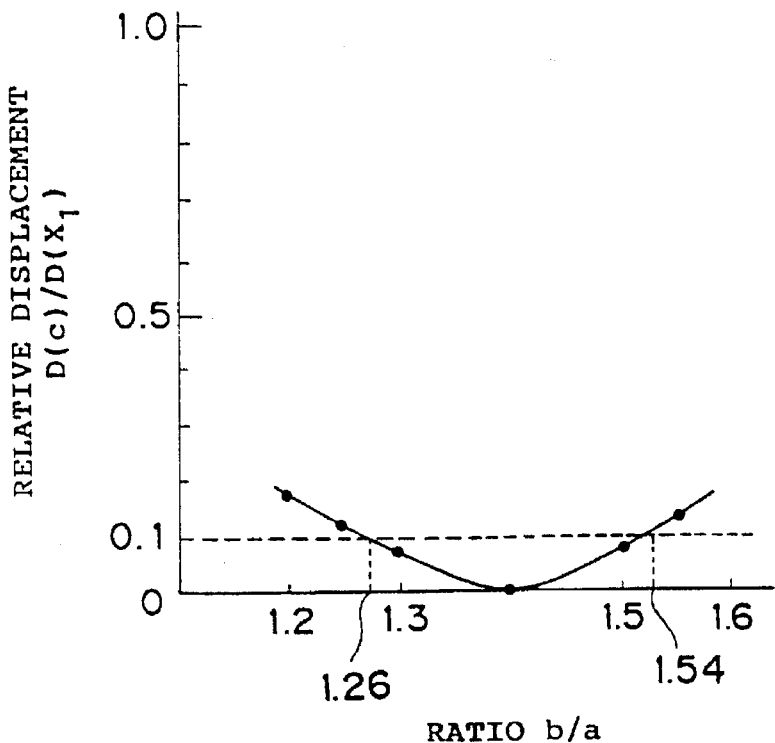
FIG. 10 illustrates relation between the ratios b/a and the amounts of relative displacement in the displacement distribution shown in FIG. 7.

Further, it has also been recognized that the width expansion vibration mode is strongly excited not only when the ratio b/a satisfies the equation (4) but when the ratio b/a slightly deviates from the equation (4). Therefore, piezoelectric ceramic plates having Poisson's ratios σ of 0.324 were employed and the ratios b/a were varied to confirm presence/absence of excitation of a width expansion vibration mode. Assuming that $D(X_1)$ represents an amount of displacement at the point X1 in FIG. 7B and D(C) represents an amount of displacement at a point C (see FIG. 7) maximizing the amount of displacement in a width expansion mode, relative displacement $D(X_1)/(C)$ of the point $X_1$ to the point C was measured. FIG. 10 shows the result.

It is clearly understood from FIG. 10 that the relative displacement is within ±10% when the Poisson's ratio σ is 0.324, as long as the ratio b/a is in a range of 1.26 to 1.54. Then, a plurality of samples of the piezo-resonator 205 shown in FIG. 3 were prepared so that the ratios b/a were in a range of ±10%, a described above.

Figure 11:
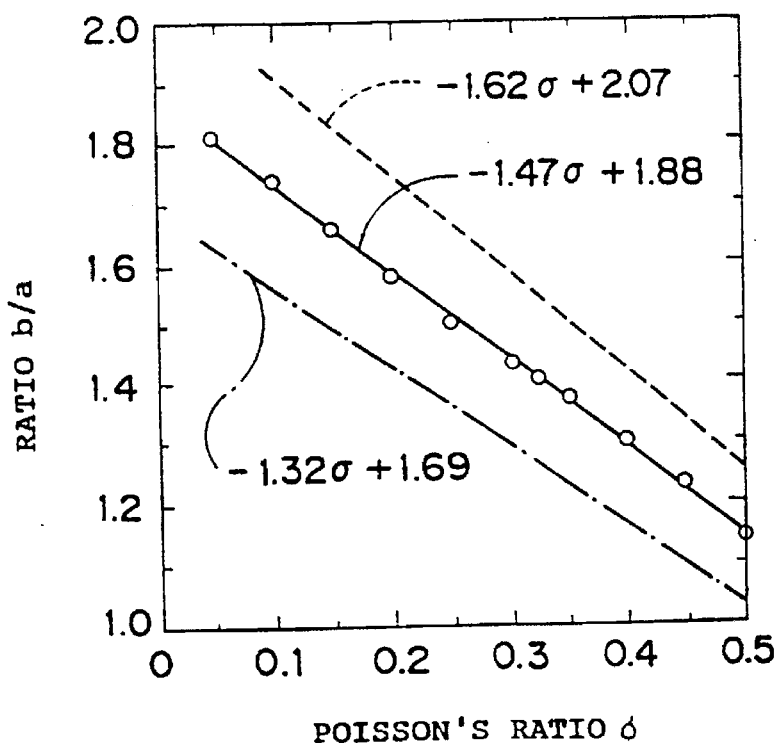

As shown in FIG. 11, therefore, it is understood that the aforementioned width expansion vibration mode is excellently excited when the ratio b/a is set in a range of ±10% from a point satisfying the equation (4). It has also been discovered that the width expansion vibration mode is excellently excited also when the ratio b/a is n times the value (−1.47σ+1.88), where n represents an integer.

Figure 12A:
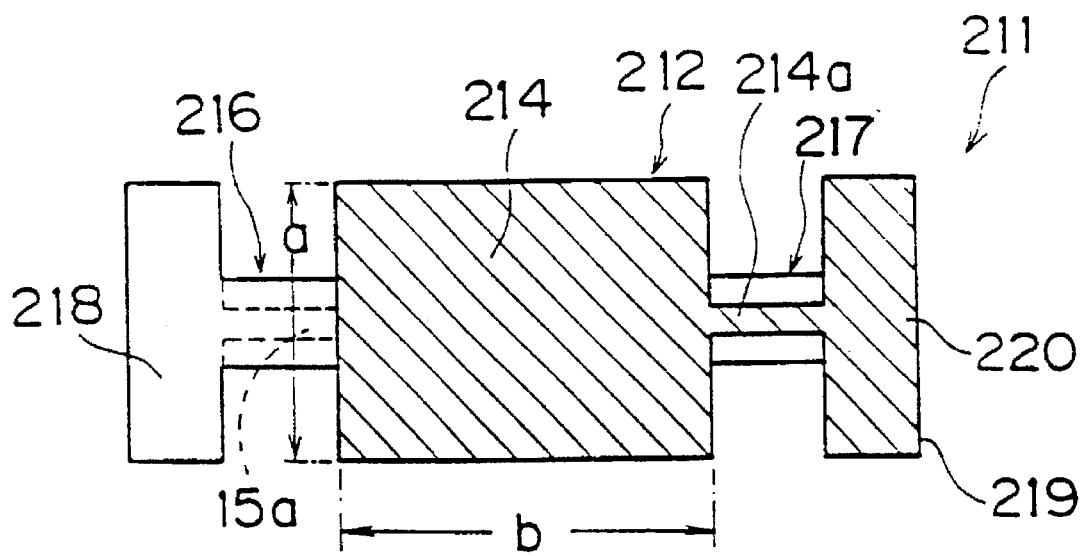
FIGS. 12A and 12B are a plan view and a side elevational view showing an example of a first type energy trap piezo-resonator, respectively.
Figure 12B:
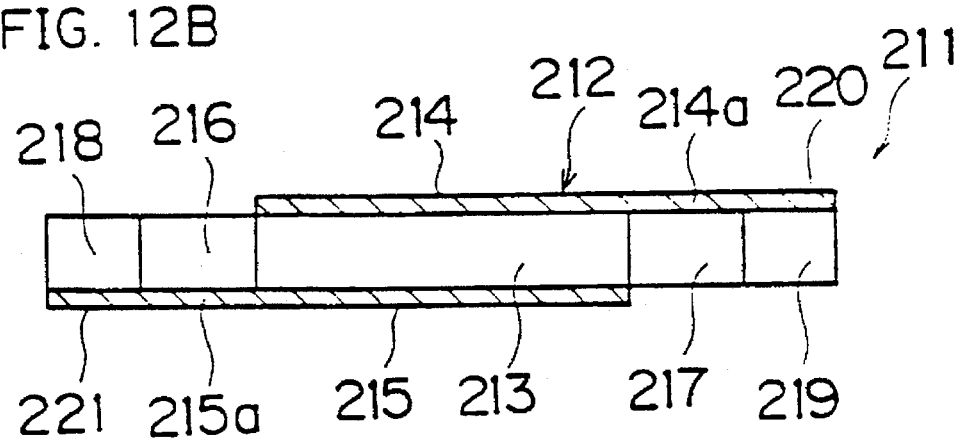

FIGS. 12A and 12B are a plan view and a front elevational view showing an example of a piezo-resonator utilizing a width expansion mode, i.e., a first type piezo-resonator manufactured on the basis of the aforementioned recognition. This piezo-resonator 211 has a piezoelectric vibrating part 212 serving as a rectangular plate type vibrator. The piezoelectric vibrating part 212 has a rectangular planar shape, and has a structure such that resonance electrodes 214 and 215 are formed entirely over both major surfaces of a piezoelectric ceramic plate 213 which is uniformly polarized along its thickness. Support members 216 and 217 are coupled to centers of shorter sides, which serve as nodal points upon excitation in a width expansion vibration mode, of the piezoelectric vibrating part 212. Holding parts 218 and 219 are coupled to outer end portions of the support members 216 and 217, respectively.

The support members 216 and 217 and the holding parts 218 and 219 are integrally formed with the piezoelectric ceramic plate 213. Namely, a rectangular piezoelectric ceramic plate 213. Namely, a rectangular piezoelectric ceramic plate is prepared and machined into the shape shown in FIG. 12A. Alternatively, the support members 216 and 217 and the holding parts 218 and 219 may be formed by members which are independent of the piezoelectric vibrating part 212, to be coupled as illustrated by a proper method such as bonding.

The resonance electrodes 214 and 215 are electrically connected to lead electrodes 220 and 221, which are formed on single major surfaces of the holding parts 218 and 219, by lead conductive parts 214a and 215a which are formed on single surfaces of the support members 216 and 217, respectively.

When an alternating voltage is applied across the lead electrodes 220 and 221, the piezoelectric vibrating part 212 is excited in a width expansion mode in the piezo-resonator 211. In this case, the central portions of the shorter sides of the piezoelectric vibrating part 212 hardly vibrate and form nodal points of vibration, whereby the width expansion mode vibration is hardly inhibited despite the support members 216 and 217 which are coupled to the piezoelectric vibrating part 212. Thus, it is possible to effectively trap the vibration based on the width expansion mode between the support members 216 and 217.

It has been recognized that it is possible to form an energy trap type piezo-resonator which is suitably employed over a frequency range of about 800 kHz to 2 MHz since the piezoelectric vibrating part 212 exhibits resonance frequencies of about 800 kHz and 2 MHz when the same are 2.5 mm n width and 3.5 mm in length and 1.0 mm in width and 1.4 mm in length, respectively.

As to the resonance frequency, the effective frequency band is varied with the material for the piezoelectric resonance part, as a matter of course. Therefore, it is possible to obtain energy trap type piezo-resonators which are suitably employed in various frequency bands by preparing piezoelectric vibrating parts from various piezoelectric materials.

Figure 13:
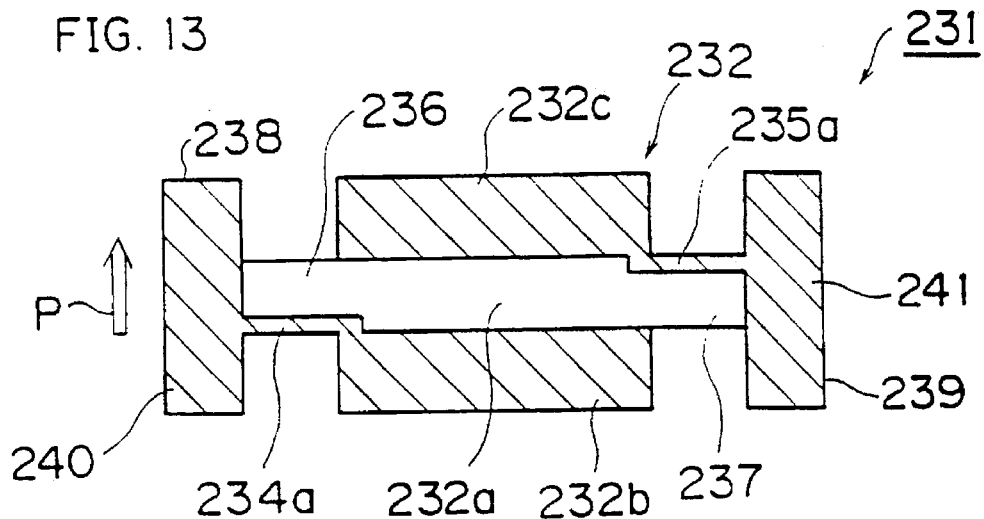
FIG. 13 is a plan view showing another example of the first energy trap type piezo-resonator.

FIG. 13 shows another example of an energy trap piezo-resonator utilizing a width expansion mode. This piezo-resonator utilizing a width expansion mode. This piezo-resonator 231 has a piezoelectric vibrating part 232 serving as a rectangular plate type vibrator. In this piezoelectric vibrating part 232, a pair of resonance electrodes 232b and 232c are formed on an upper surface of a piezoelectric plate 232a, along edges of its longer sides. The piezoelectric plate 232a is polarized along arrow P, i.e., in a direction from the resonance electrode 232b toward the resonance electrode 232c. Also in this example, the ratio b/a of the length b of each longer side of the piezoelectric vibrating part 232 to the length a of each shorter side is set in a range of ±10% from a point satisfying the equation (1).

When an alternating voltage is applied across the resonance electrodes 232b and 232c, therefore, the piezoelectric vibrating part 232 vibrates in a width expansion mode. In this case, the piezoelectric vibrating part 232 is displaced in a direction parallel to the electric field as applied, whereby the piezo-resonator 231 of this example, support members 336 and 237 are coupled to nodal points of vibration of the piezoelectric vibrating part 232 which is resonated in the width expansion mode, while holding parts 238 and 239 are coupled to outer end portions of the support members 236 and 237, respectively. Referring to FIG. 13, numerals 234 and 235a denote lead conductive parts, and numerals 240 and 241 denote lead electrodes, respectively.

As clearly understood from the example shown in FIG. 13, the resonator utilizing a width expansion mode according to the preferred embodiments of the present invention is applicable not only to a resonator utilizing a piezoelectric transverse effect, but also to a resonator utilizing a piezoelectric longitudinal effect.

Figure 14:
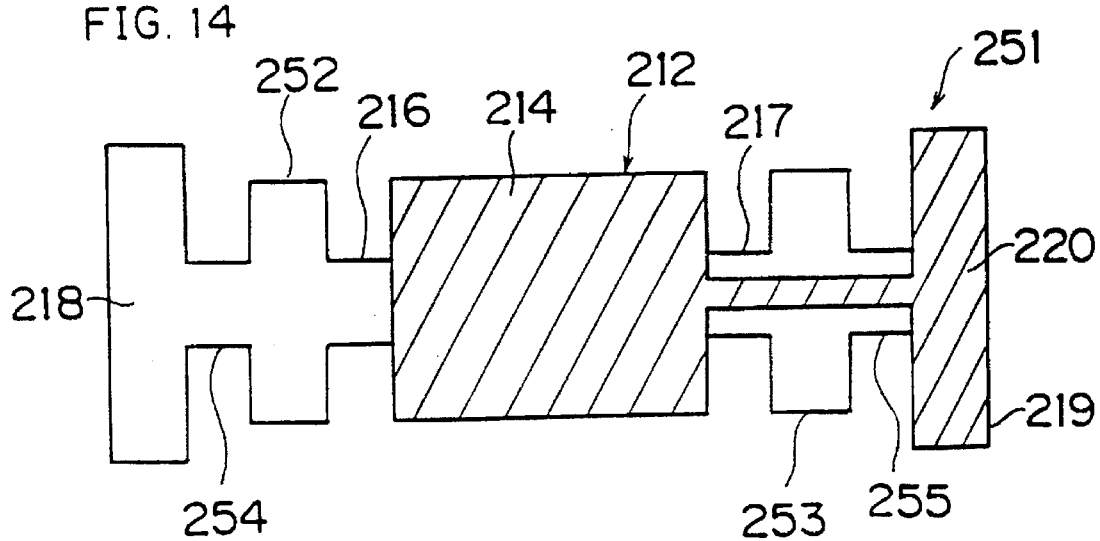
FIG. 14 is a plan view showing still another example of the first energy trap type piezo-resonator.

FIG. 14 is a plan view showing still another example of an energy trap piezo-resonator utilizing a width expansion mode which is employed in the preferred embodiments of the present invention. The piezo-resonator 251 shown in FIG. 14 is characterized in that the same is provided with dynamic dampers 252 and 253 and coupling portions 254 and 255, while other points of this example are similar to those of the energy trap type piezo-resonator 211 shown in FIG. 12. Therefore, identical portions are denoted by the same reference numerals, to omit redundant description.

The dynamic dampers 252 and 253, which are coupled to outer sides of support members 216 and 217, are formed as vertically extending bar-type portions. The coupling parts 254 and 255 are formed between the dynamic dampers 252 and 253 and holding parts 218 and 219, respectively.

Since the support members 216 and 217 are coupled to nodal points of vibration of a piezoelectric resonance part 212, leakage of vibration toward the support members 216 and 217 is extremely small. In this example, however, the dynamic dampers 252 and 253 are resonated by the slightly leaking vibration, thereby suppressing this vibration. Thus, it is possible to effectively trap vibrational energy in a vibrating portion located between the dynamic dampers 252 and 253. Therefore, it is possible to form a piezo-resonator having a substantially reduced size.

The piezo-resonator 251 shown in FIG. 14 is also an example of a fourth type energy trap piezo-resonator which is employed in the inventive ladder-type filter, since one of its features resides in provision of the dynamic dampers 252 and 253.

<Second Type Piezo-Resonator>

Figure 15:
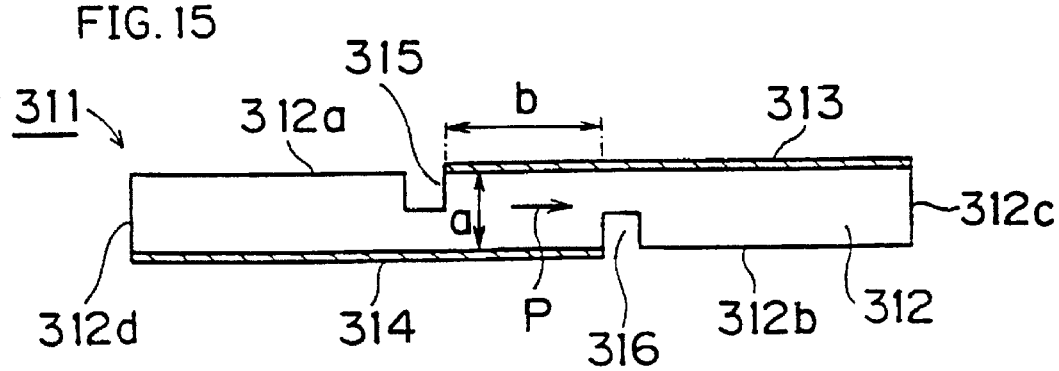
FIG. 15 is a side elevational view showing an example of a second energy trap type piezo-resonator.
Figure 16:
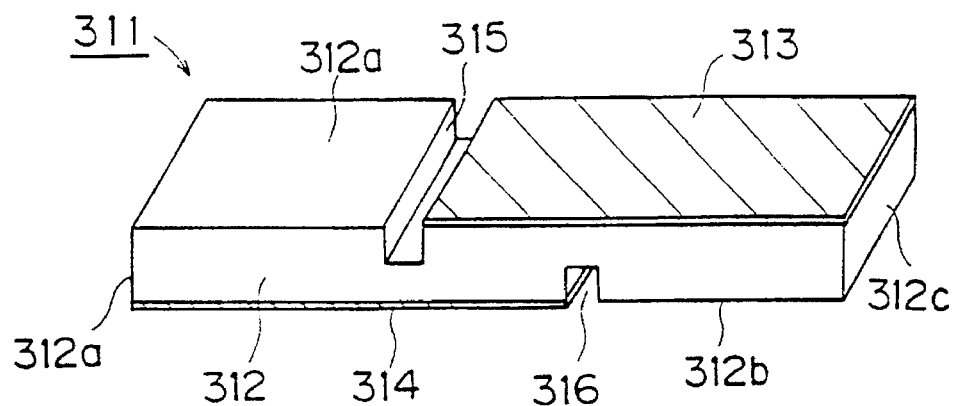
FIG. 16 is a perspective view showing the piezo-resonator appearing in FIG. 15.

FIGS. 15 and 16 are a side elevational view and a perspective view for illustrating an energy trap type piezo-resonator 311 (second type piezo-resonator) utilizing shear mode, which is employed in the preferred embodiments of the present invention.

The piezo-resonator 311 is formed by a rectangular piezoelectric ceramic plate 312. This piezoelectric ceramic plate 312 is polarized so that axes of polarization are regularized in a direction parallel to its major surface, i.e., along arrow P.

A first resonance electrode 313 is formed on an upper surface 312a of the piezoelectric ceramic plate 312 to extend from an end surface 312c toward another end surface 312d, but not to reach this end surface 312d. Similarly, a second resonance electrode 314 is formed on a lower surface 312b of the piezoelectric ceramic plate 312 extending from the end surface 312d toward the end surface 312c, but without reaching this end surface 312c.

Further, first and second cross-directionally extending grooves 315 and 316 are formed in the upper and lower surfaces 312e and 312b of the piezoelectric ceramic plate 312, respectively. The first and second resonance electrodes 313 and 314 overlap with each other through the piezoelectric ceramic plate 312 in a portion of the piezoelectric ceramic plate 312 which is held between the first and the second grooves 315 and 316, thereby forming a piezoelectric vibrating part. In other words, the first and the second grooves 315 and 316 are formed on forward ends of the first and the second resonance electrodes 313 and 314, respectively, thereby defining a resonance part therebetween. When an alternating voltage is applied across the first and second resonance electrodes 313 and 314 to make the piezoelectric vibrating part vibrate, shear mode vibration is strongly excited so that this shear mode vibration is effectively trapped in the piezoelectric vibrating part due to formation of the first and second grooves 315 and 316.

In the piezo-resonator 311, the portion located between the grooves 315 and 316 define the piezoelectric vibrating part, while piezoelectric plate portions located under and above the grooves 315 and 316 from support parts in the present invention, respectively. Further, piezoelectric plate portions extending outwardly beyond the grooves 315 and 316 define holding parts in the preferred embodiments of the present invention. In addition, the resonance electrodes 313 and 314 serve as electrodes for resonating the piezoelectric vibrating part in portions located therein, while the same serve as the aforementioned lead electrodes in portion reaching the holding parts.

In the piezo-resonator 311, a piezoelectric surface which is parallel to the piezoelectric vibrating part is in the form of a rectangular surface having longer and shorter sides of lengths b and a, respectively. The ratio b/a is set in a range of ±10% from a value satisfying the equation (2), assuming that a σ represents the Poisson's ratio of the piezoelectric material forming the piezoelectric ceramic plate 312. In other words, the grooves 315 and 316 are formed so that the ratio b/a is in the aforementioned specific preferred range, thereby determining the dimensions of the piezoelectric vibrating part. It has been experimentally confirmed by the inventor that vibrational energy of a shear mode is further effectively trapped in the piezoelectric vibrating part.

It has been experimentally confirmed by the inventor that vibrational energy of a shear mode is further effectively trapped in the piezoelectric vibrating part when the ratio b/a is set in the aforementioned specific preferred range in the piezo-resonator 311. This is now described with reference to FIGS. 17A to 21.

Figure 17A:
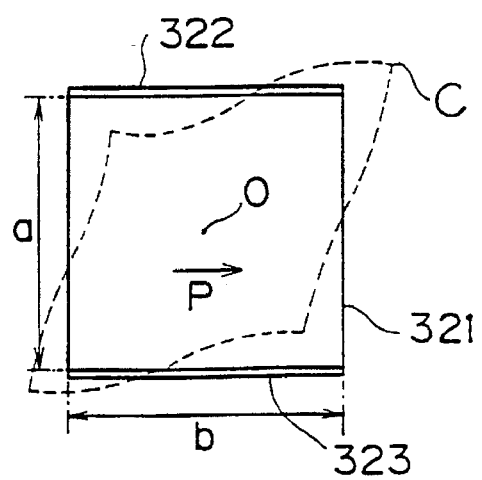
FIGS. 17A and 17B are a model diagram for illustrating a vibrating state of a vibrator vibrating in a shear vibration mode and a diagram showing coordinates in FIG. 17A, respectively.

As shown in FIG. 17A in a side elevational view, it is assumed that resonance electrodes 322 and 323 are formed on a piezoelectric member 321 which is polarized along arrow P, i.e., in a direction parallel to its upper and lower surfaces, with a ratio b/a of 1. When an alternating voltage is applied across the resonance electrodes 322 and 323, the piezoelectric member 321 vibrates in a contour shear mode. Consequently, the piezoelectric member 321 vibrates in a vibrating state shown by broken lines A in FIG. 17A and another vibrating state which is horizontally symmetrical to that shown by the broken lines A.

Figure 17B:
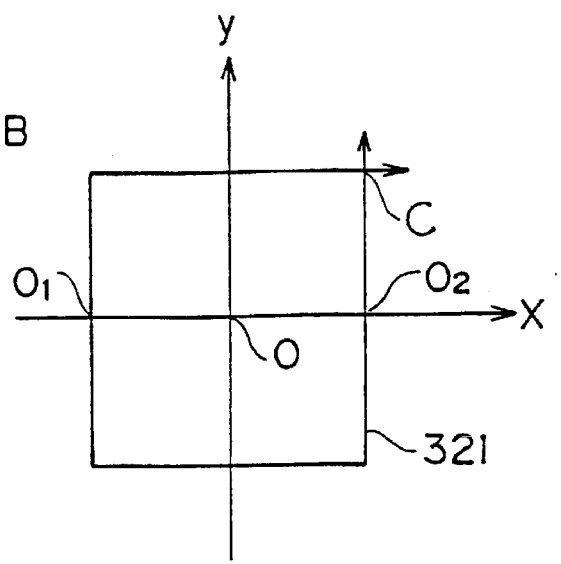

FIG. 17B shows positions of the respective portions of the vibrator 321 in an x-y coordinate system. In this case, a corner portion C is displaced at the maximum in vibration, in both of directions x and y. A central point O of the piezoelectric member 321 serves as a nodal point of vibration. On the other hand, displacement is also recognized in points $O_1$ and $O_2$ which are at intermediate vertical positions of side surfaces of the piezoelectric member 321.

Since displacement is thus recognized also in the points $O_1$ and $O_2$, it is understood that vibrational energy trap efficiency is insufficient when piezoelectric plates are further connected to outer side surfaces of the piezoelectric member 321 to form a resonator of a contour shear mode.

Figure 18:
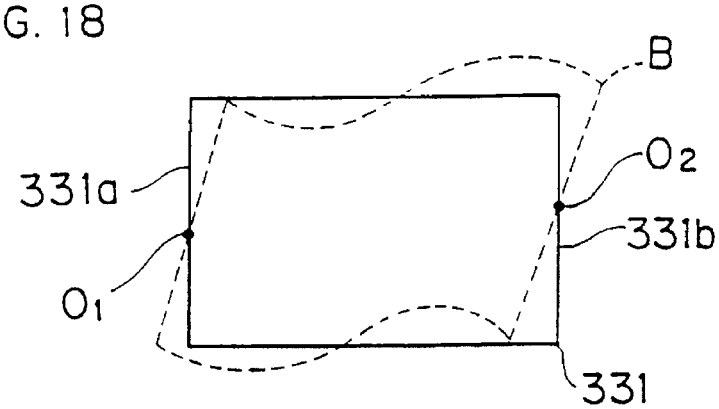
FIG. 18 is a schematic side elevational view showing a piezoelectric member.

On the other hand, it has been recognized that displacement distribution is as shown in FIG. 18 when the ratio b/a is as follows:

$$b/a=0.3\sigma+1.48$$

Figure 19:
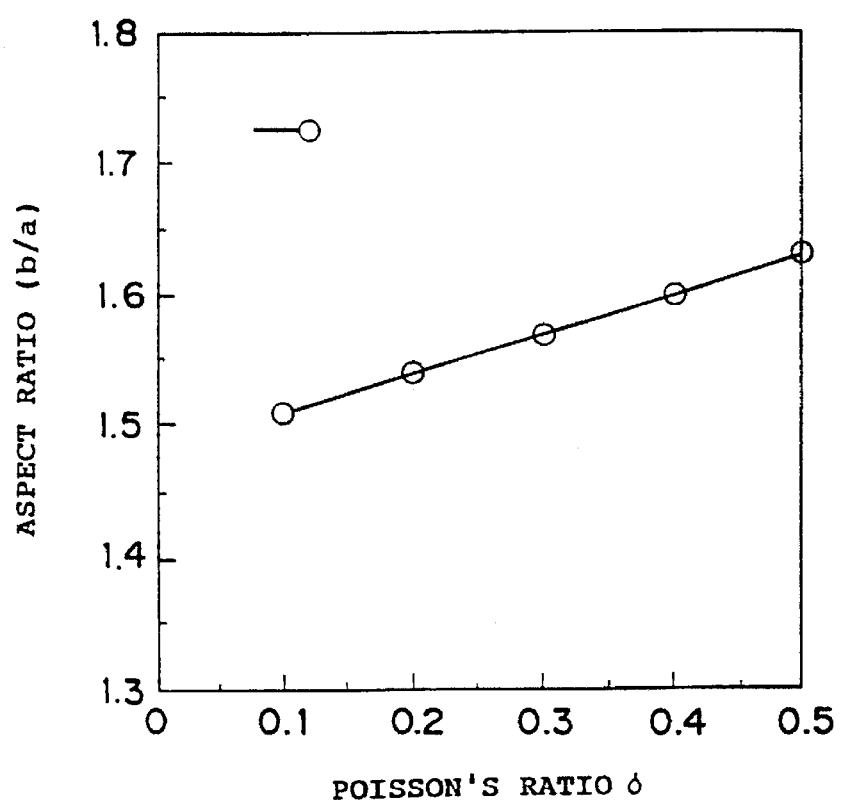

Namely, a piezoelectric member 331 shown in FIG. 18 in a schematic side sectional view vibrates between a vibrating state shown by broken lines B and that which is horizontally symmetrical to this vibrating state. In this case, a displacement vector on each short side has only a component in a direction x, as shown in FIG. 19. On side surfaces 331a and 331b of the piezoelectric member 331, further, directions of displacement are reversed in upper and lower halves.

The aforementioned ratio b/a was varied and various piezoelectric materials were employed, to examine states of displacement of structures obtained by connecting supports with piezoelectric members. As a result, it has been confirmed that relation shown in FIG. 19 holds between the Poisson's ratios of the piezoelectric materials as employed and the ratios b/a. From the result shown in FIG. 19, it has been recognized that it is possible to reduce transmission of displacement toward the supports, i.e., to effectively trap vibrational energy in the vibrating resonance portion of the piezoelectric vibrating part, by setting the ratio b/a as follows:

$$b/a=0.3\sigma+1.48$$

Further, it has also been also confirmed that vibrational energy can be effectively trapped also when the ratio b/a is n times the value (0.3σ+1.48), where n represents an integer.

Thus, it has been confirmed that it is possible to trap vibration in the piezoelectric vibrating part by selecting dimensions thereof to satisfy the equation (2). On the basis of this result, a piezoelectric material having a Poisson's ratio σ of 0.31 was employed as a material for the piezoelectric vibrating part 341 having a ratio of b/a of 1.57.

Figure 20:
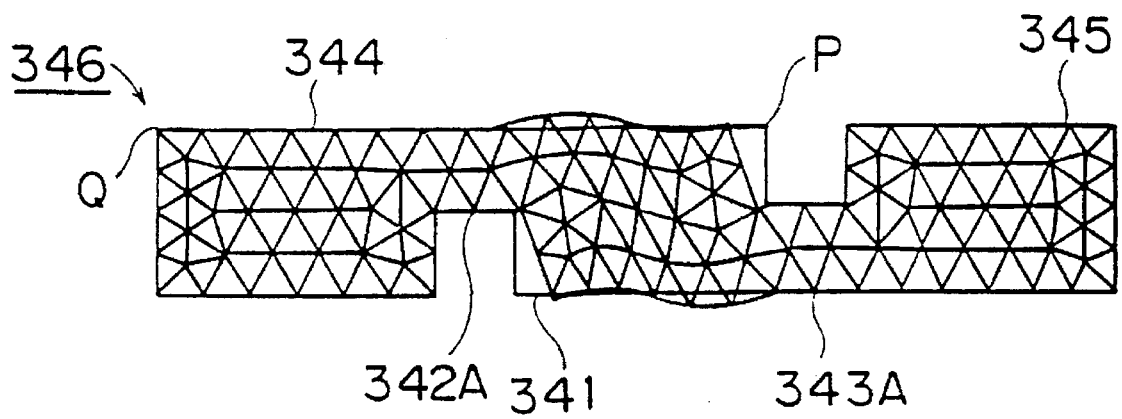
FIG. 20 illustrates displacement distribution of vibration in a second type piezo-resonator analyzed by a finite element method.
Figure 21:
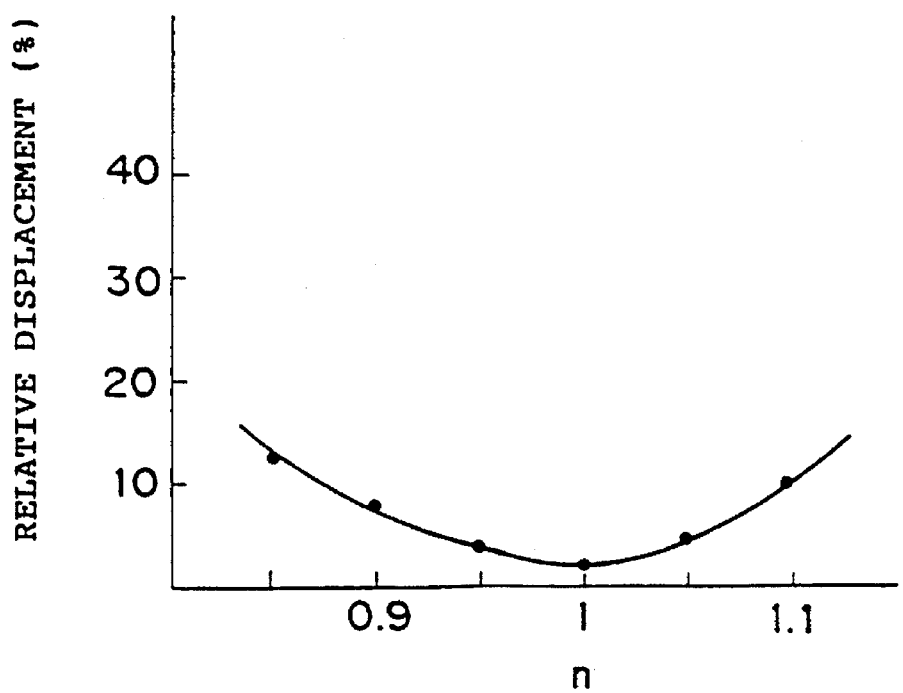
FIG. 21 illustrates relation between amounts of relative displacement and values of integers n.

When support parts 344 and 345 having thicknesses which are equal to that of a piezoelectric vibrating part 341 were integrally formed with the piezoelectric vibrating part 341 through support parts 342A and 343A for forming resonator 346 which in turn was subjected to examination of displacement distribution by a finite element method, a result shown in FIG. 20 was obtained.

It is clearly understood from FIG. 20 that shear mode vibration energy in the piezoelectric vibrating part 341 hardly leaked toward the support parts 342A and 343A in this resonator 346. Namely, it is understood that it is possible to form a resonator utilizing a shear mode having high energy trap efficiency by selecting the ratio b/a to satisfy the equation (2).

Then, the factor n in the above equation n(0.3σ+1.48) was changed to a non-integer number and varied in a range of 0.85 to 1.1 at a certain Poisson's ratio σ, to measure a ratio of an amount of displacement at a point Q exhibiting the minimum value to that of a point P exhibiting the maximum value shown in FIG. 20, i.e., relative displacement is not more than 10% when the value of the non-integer number n is within a range of about 0.9 to 1.1. On the other hand, it has been recognized that substantially no problem is caused in formation of a resonator when the relative displacement is not more than 10%. Therefore, it is possible to effectively trap vibrational energy in the resonance part when the ratio b/a is within a range of ±10% from a value satisfying the equation (2).

In the second type of piezo-resonator 311 shown in FIGS. 15 and 16, the first and second grooves 315 and 316 are formed so that the thickness a of the piezoelectric ceramic plate in the piezoelectric vibrating part and the longitudinal dimension b along he polarization direction P of the resonance part, i.e., lengths a and b of the shorter and longer sides of the rectangular piezoelectric surface which is parallel to the polarization direction of the piezoelectric vibrating part are set at the ratio b/a within the range of ±10% from the value expressed in the equation (2), thereby improving energy trap efficiency.

Figure 22:
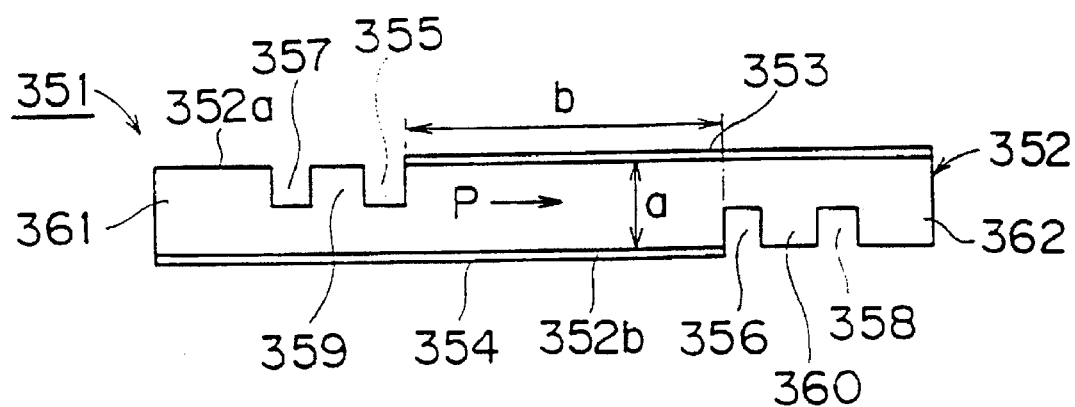
FIG. 22 is a side elevational view showing another example of the second type piezo-resonator.

FIG. 22 is a side elevational view showing another example of the second type piezo-resonator.

In this piezo-resonator 351, a third groove 357 is formed in a portion outward beyond a first groove 355 on an upper surface 352 of a piezoelectric ceramic plate 352 which is polarized along arrow P while a fourth groove 358 is formed in a portion outward beyond a second groove 356 also on a lower surface 352b of the piezoelectric ceramic plate 352, thereby forming first and second dynamic dampers 359 and 360, respectively. These dynamic dampers 359 and 360 are resonated by leaking vibration due to a well-known phenomenon of a dynamic damper, to cancel the leaking vibration. Therefore, the dynamic dampers 359 and 360 have dimensions selected for canceling the vibration via a phenomenon of a dynamic damper.

The piezo-resonator 351 is identical to the piezo-resonator 311 except that the third and fourth grooves 357 and 358 are formed to define the dynamic dampers 359 and 360, and hence other portions are denoted by corresponding reference numerals, to omit redundant description.

In the piezo-resonator 351, the ratio b/a in the resonance part is set in a range of ±10% from a value expressed in the equation (2), whereby vibrational energy is effectively trapped in the resonance part. Further, slightly leaking vibration is cancelled by the dynamic dampers 359 and 360 due to the a phenomenon of a dynamic damper. When the piezo-resonator 351 is mechanically held at holding parts 361 and 362 which are located outside the third and fourth grooves 357 and 358, respectively, therefore, substantially no deterioration is caused in resonance characteristics. Thus, it is possible to further improve energy trap efficiency compared with the piezo-resonator 311, thereby providing a further miniaturized piezo-resonator.

The piezo-resonator 351, having the dynamic dampers 359 and 360, is also the further type piezo-resonator employed in the preferred embodiments of the present invention.

Figure 23:
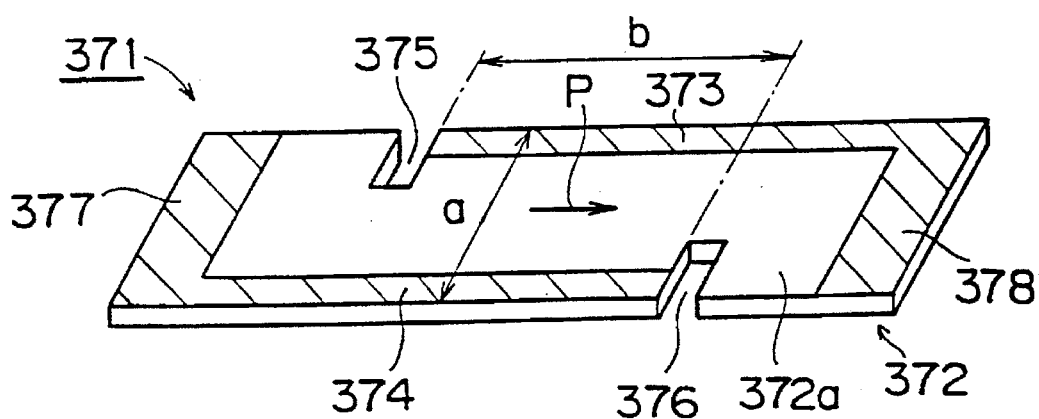
FIG. 23 is a perspective view showing still another example of the second type piezo-resonator.

FIG. 23 is a perspective view showing still another example of the second type energy trap piezo-resonator. This piezo-resonator 371 is formed by an elongated rectangular piezoelectric ceramic plate 372 which is polarized along its longitudinal direction P. In the piezoelectric ceramic plate 372, first and second resonance electrodes 373 and 374 are formed on its upper surface along both edges. Further, grooves 375 and 376 are formed in the both edges, respectively. A piezoelectric plate portion which is held between these grooves 375 and 376 defines a piezoelectric vibrating part. In this piezoelectric vibrating part, an upper surface, i.e., a piezoelectric surface which is parallel to he polarization direction P, has a rectangular shape. The shape of the upper surface of the piezoelectric vibrating part is selected so that lengths a and b of shorter and longer sides are at a ratio b/a within a range of ±10% from a value satisfying the above equation (2). When an alternating voltage is applied across the first and second resonance electrodes 373 and 374, therefore, the piezoelectric vibrating part is resonated in a shear mode similarly to the piezo-resonator 311 shown in FIG. 15, and the resonance energy is effectively trapped in the piezoelectric vibrating part. Piezoelectric plate portions located on sides of the grooves 375 and 376 define support parts of the preferred embodiments of the present invention, while those located outward beyond the grooves 375 and 376 define holding parts according to the preferred embodiments of the present invention, respectively. Further, lead electrodes 377 and 378 are formed on upper surfaces of the holding parts to be electrically connected to the first and second resonance electrodes 373 and 374, respectively.

Figure 24:
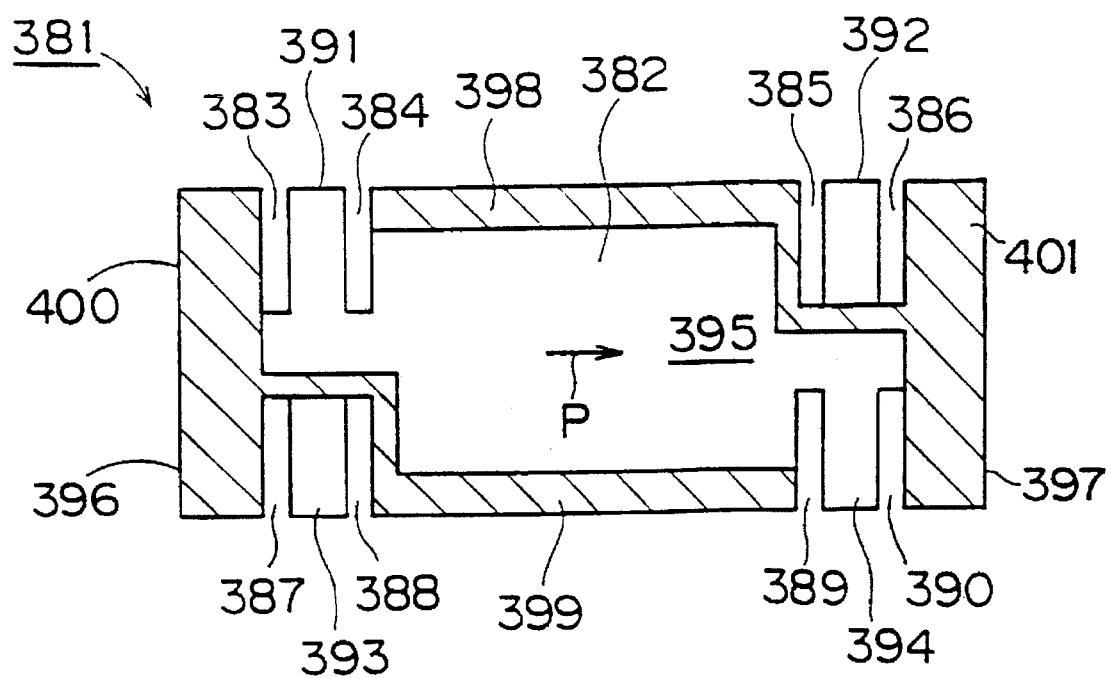
FIG. 24 is a plan view showing a further example of the second type piezo-resonator.

FIG. 24 is a plan view showing a further example of the second type energy trap piezo-resonator. In this piezo-resonator 381, grooves 383 to 386 are formed on one side surface while grooves 387 to 390 are formed on another side surface, thereby defining dynamic dampers 391 to 394, respectively. Further, a piezoelectric substrate portion located between the grooves 384 and 385 defines a piezoelectric vibrating part 395 according to the preferred embodiments of the present invention. In addition, holding parts 396, respectively. Support parts according to the preferred embodiments of the present invention are defined by piezoelectric substrate portions which are held between the grooves 384 and 388 as well as between the grooves 385 and 389. Further, a piezoelectric substrate portion located between the grooves 383 and 387 and thin piezoelectric substrate portion located between the grooves 386 and 390 define coupling parts, respectively.

The piezoelectric vibrating part 395 is polarized along arrow P, i.e., along the longitudinal direction of a piezoelectric substrate 382. On the other hand, resonance electrodes 398 and 399 are formed on an upper surface of the piezoelectric substrate 382 in parallel with the polarization direction P. An upper surface of the piezoelectric vibrating part 395 has a rectangular shape, and the ratio b/a is set in a range of ±10% from a value satisfying the equation (2) assuming that a and b represent lengths of shorter and longer sides of the upper surface.

When an alternating voltage is applied across the resonance electrodes 398 and 399, therefore, the piezoelectric vibrating part 395 is resonated in a shear mode, so that resonance energy is effectively trapped in the piezoelectric vibrating part 395. Further, the dynamic dampers 391 to 394 suppress slight leaking vibration by a phenomenon of a dynamic damper. In the piezo-resonator 381, therefore, vibrational energy is reliably trapped in the portions provided between the dynamic dampers 391 to 394.

Lead electrodes 400 and 401 are formed on the holding parts 396 and 397, respectively.

Figure 25:
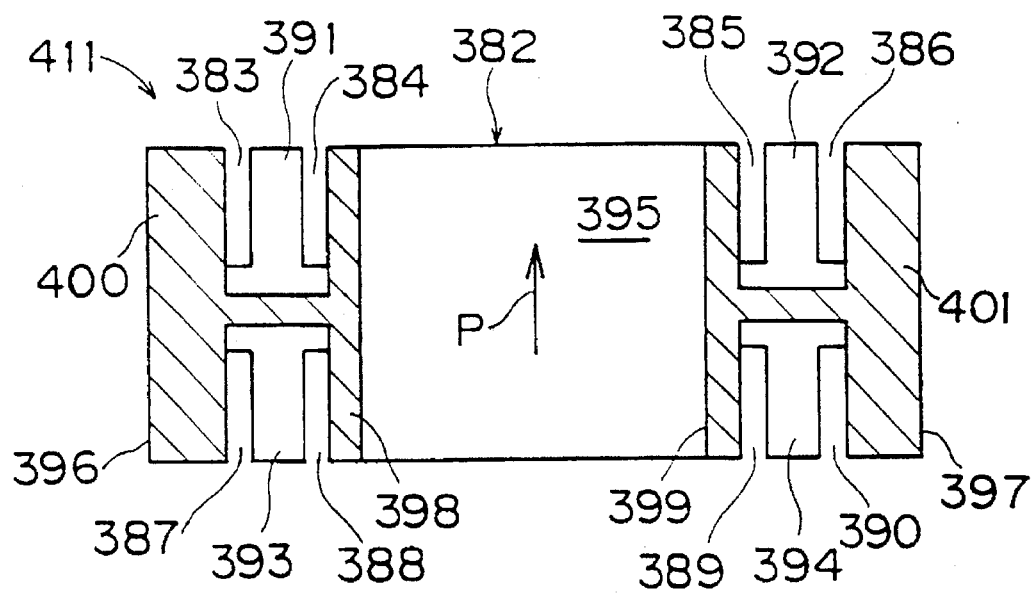
FIG. 25 is a plan view showing a further example of the second type piezo-resonator.

FIG. 25 shows a modification of the piezo-resonator 381 shown in FIG. 24. This piezo-resonator 411 is different from the piezo-resonator 381 in that a piezoelectric vibrating part 395 is polarized along arrow P, i.e., in parallel with the width direction of a piezoelectric substrate 382, and resonance electrodes 398 and 399 are formed to extend along the width direction.

Figure 26:
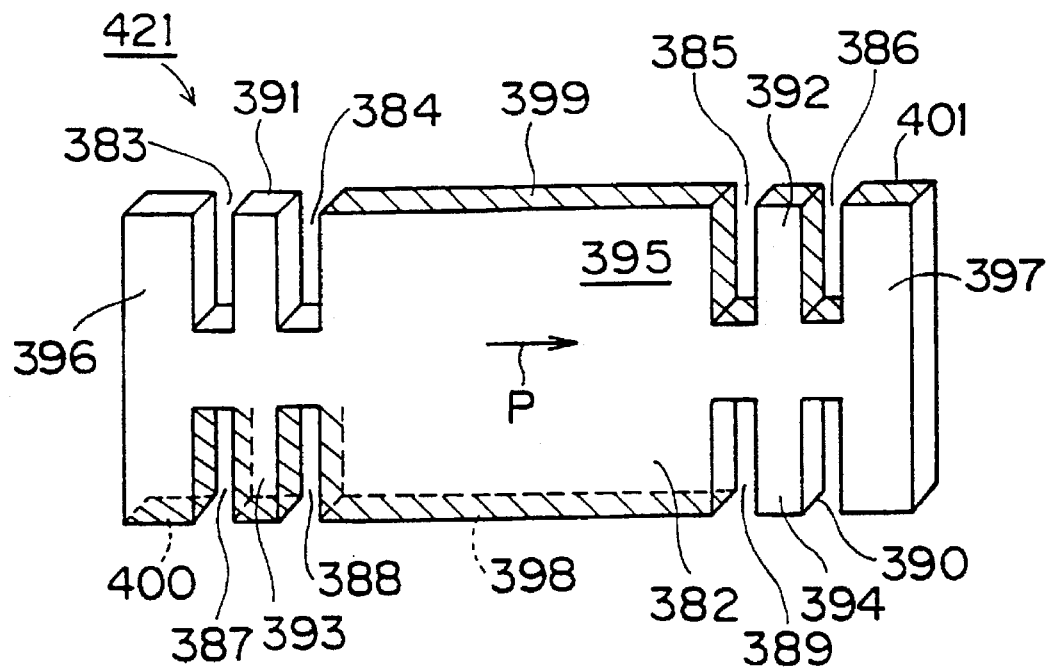
FIG. 26 is a perspective view showing a further example of the second type piezo-resonator.

FIG. 26 is a perspective view showing another modification of the piezo-resonator 381 shown in FIG. 24. In this piezo-resonator 421, a piezoelectric vibrating part 395 is polarized along arrow P., i.e., in parallel with the longitudinal direction of a piezoelectric substrate 382. This piezo-resonator 421 is different from the piezo-resonator 381 in positions provided with electrodes.

In the piezo-resonator 421, resonance electrodes 398 and 399 are formed on both side surfaces of the piezoelectric substrate 382 in the piezoelectric vibrating part 395.

In the piezo-resonator 421, further, lead electrodes 400 and 401 are formed on the side surfaces of the piezoelectric substrate 382 holding parts 396 and 397, respectively. Further connecting conductive parts for electrically connecting the lead electrodes 400 and 401 with the resonance electrodes 398 and 399 are also formed along the side surfaces of the piezoelectric substrate 382, respectively.

As clearly understood from the piezo-resonator 421, resonance electrodes may be formed on side surfaces of a piezoelectric plate forming a piezoelectric vibrating part in addition to upper and lower surfaces thereof in the second type piezo-resonator. In the piezo-resonator 381 shown in FIG. 24, for example, the resonance electrode 399 may be formed on a lower surface of the piezoelectric substrate 382, while one of the resonance electrodes 398 and 399 may be formed on one major surface of the piezoelectric substrate 382 in the piezo-resonator 421, for example.

Also in the second type piezo-resonator, a piezoelectric vibrating part, support parts and holding parts, as well as dynamic dampers which are provided as needed may be formed by machining a single piezoelectric substrate, or these parts may be formed by separate members.

Figure 27:
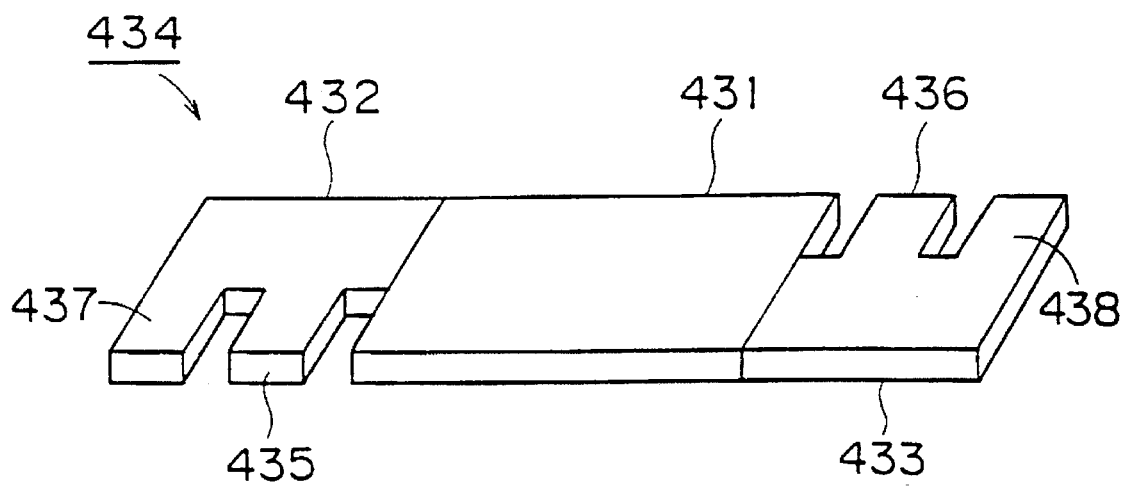
FIG. 27 is a perspective view showing a structure obtained by integrating a piezoelectric vibrating part, support parts, dynamic dampers and holding parts with each other for forming second type piezo-resonator.

As shown in FIG. 27, for example, insulating plates 432 and 433 may be bonded to a rectangular piezoelectric plate 431 of the same thickness for forming a piezoelectric vibrating part, thereby forming a substrate 434. It is possible to form the aforementioned second type piezo-resonator by this substrate 434. While dynamic dampers 435 and 436 and holding parts 437 and 438 are integrally formed with the insulating plates 432 and 433 in the substrate 434 shown in FIG. 27, these parts may alternatively be formed by separate members.

Figure 28:
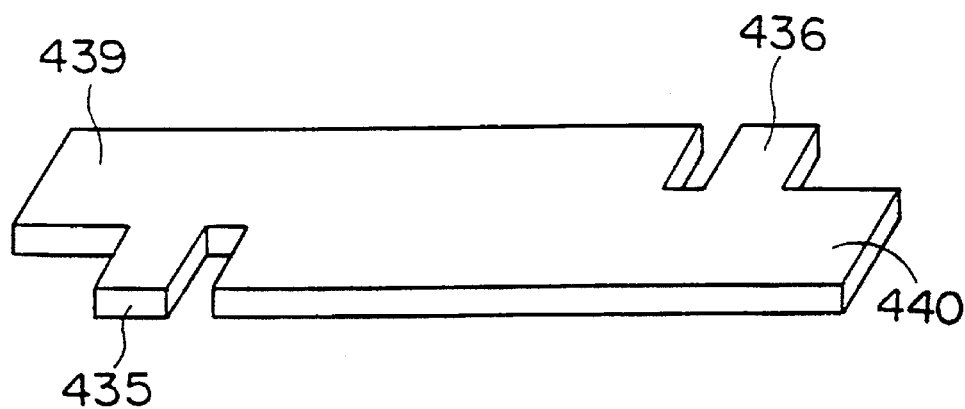
FIG. 28 is a perspective view showing a piezoelectric plate having coupling parts and holding parts which are integrated with each other.

As shown in FIG. 28, further, substrate parts 439 and 440 of the same widths may be formed outside dynamic dampers 435 and 453. In this case, the substrate parts 439 and 440 also serve as both of coupling and holding parts.

First Preferred Embodiment

Figure 29:
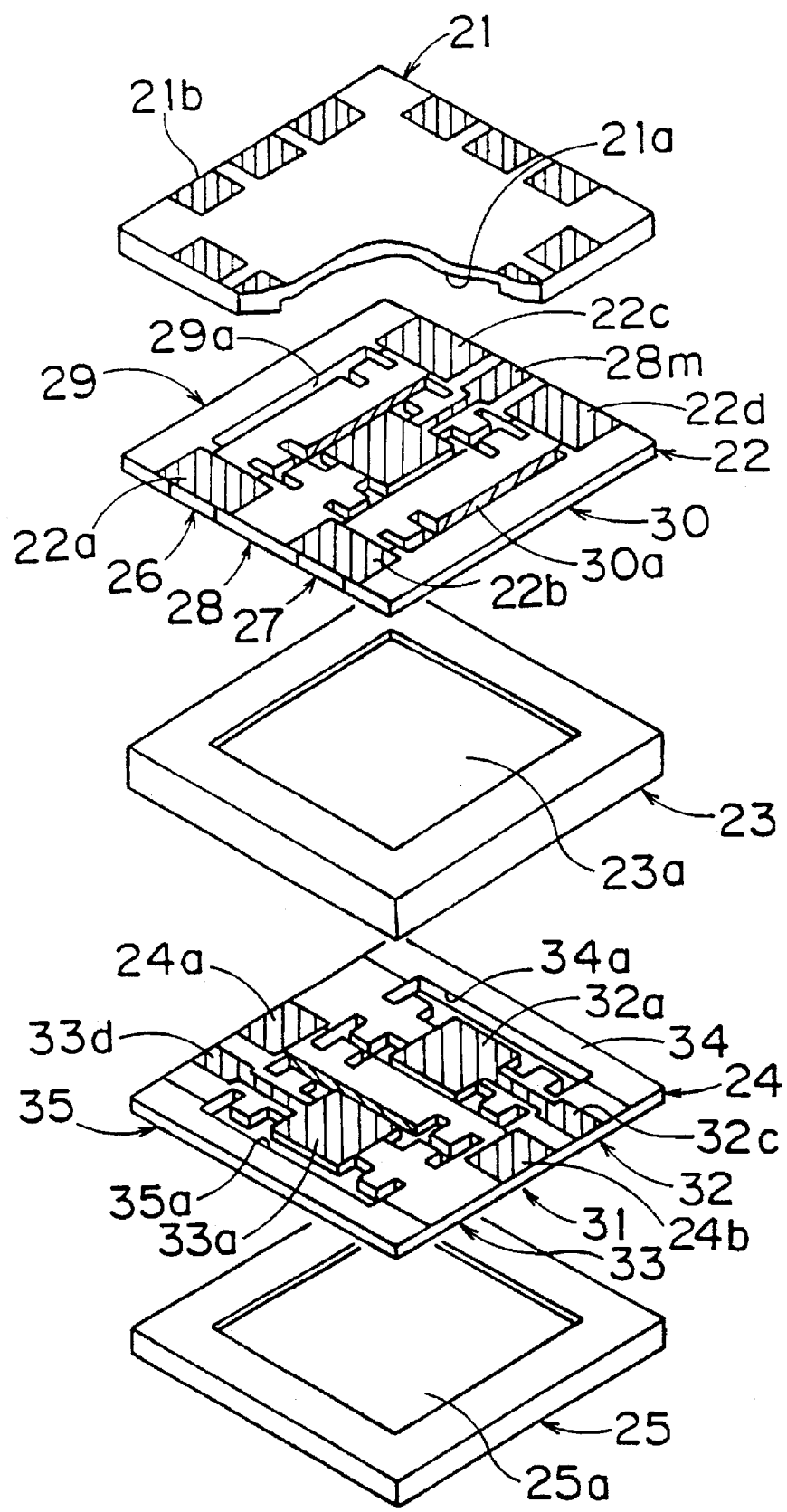
FIG. 29 is an exploded perspective view showing a ladder-type filter according to a first preferred embodiment of the present invention.
Figure 30:
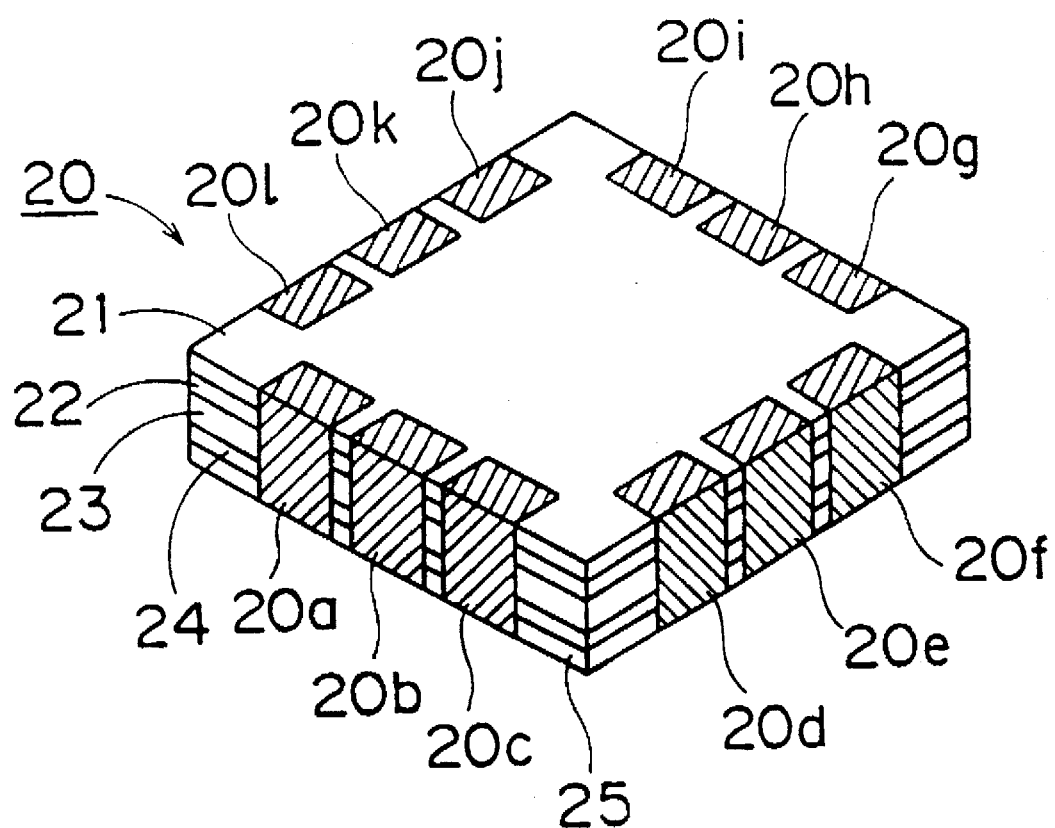
FIG. 30 is a perspective view showing the appearance of the ladder-type filter according to the first preferred embodiment.

FIG. 29 is an exploded perspective view showing a ladder-type filter 20 according to a first preferred embodiment of the present invention, and FIG. 30 is a perspective view showing its appearance.

The ladder-type filter 20 has a structure obtained by stacking a case substrate 21, a first resonance plate 22, an isolating spacer 23, a second resonance plate 24 and a case substrate 25 shown in FIG. 29.

The first resonance plate 22 has a structure formed by bonding and integrating piezo-resonators 26 and 27 having dynamic dampers and utilizing a shear vibration mode and a piezo-resonator 28 having dynamic dampers and utilizing a width expansion mode thereby coupling the same with each other, and further bonding spacer plates 29 and 30 which are substantially equal in thickness to the piezo-resonators 26 to 28 to outer sides of the integrated structure by an adhesive. The spacer plates 29 and 30 are made of a suitable insulating material having a certain degree of strength such as insulating ceramics such as alumina or synthetic resin, and has notches 29a and 30a for allowing vibration of vibrating parts of the piezo-resonators 26 and 27.

Figure 31A:
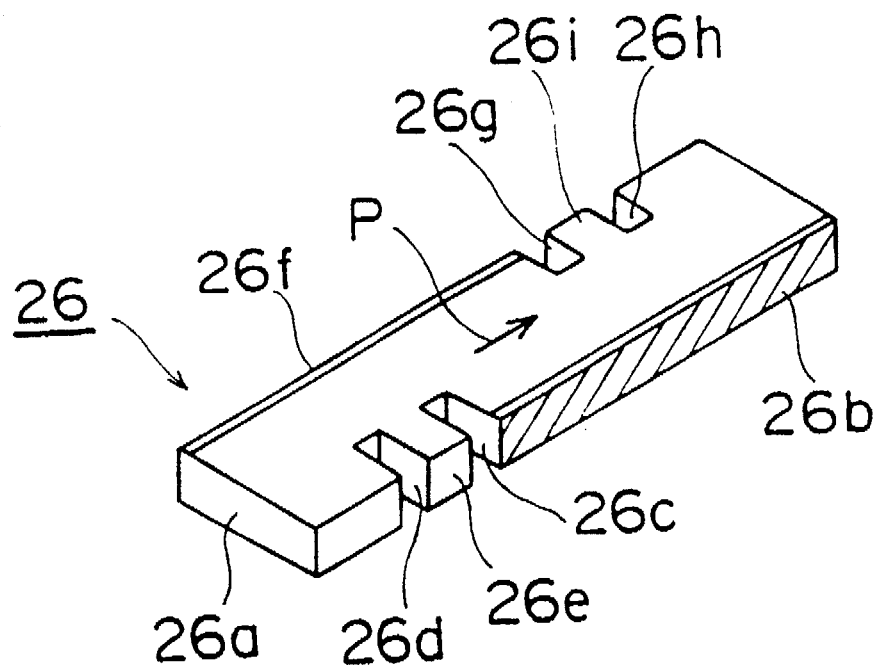
FIGS. 31A and 31B are perspective views for illustrating a piezo-resonator having dynamic dampers which is employed in the first preferred embodiment.

As shown in FIG. 31A, the piezo-resonator 26 having dynamic dampers is formed by an elongated rectangular piezoelectric ceramic plate 26a which is uniformly polarized along arrow P. A resonance electrode 26b is formed on one side surface of the piezoelectric ceramic plate 26a, to extend from a first end toward a second end of the piezoelectric ceramic plate 26a. A forward end of the resonance electrode 26b is terminated at a portion reaching a cavity 26c which is defined by notching the side surface. Another cavity 26d is formed at a prescribed distance from the cavity 26c, thereby defining a dynamic damper 26e between the cavities 26c and 26d.

Similarly, a resonance electrode 26f is formed on another side surface of the piezoelectric ceramic plate 26a to extend from the second end toward the first end thereof. Similarly to the side provided with the resonance electrode 26b, two cavities 26g and 26h are formed to define a dynamic damper 26i therebetween.

In the second type piezo-resonator 26, an overlapping portion of the resonance electrodes 26b and 26f defines a piezoelectric vibrating part, and a dimensional ratio b/a of this piezoelectric vibrating part is set in a range of ±10% from a value satisfying the above equation (2). Namely, the piezo-resonator 26 is formed similarly to the piezo-resonator 371 shown in FIG. 23. Portions located between the piezoelectric vibrating part and the dynamic dampers 26e and 26i define support parts, piezoelectric ceramic plate portions located outward beyond those provided with the cavities 26d and 26h define holding parts, and piezoelectric ceramic portions having relatively narrow widths located between the holding parts and the dynamic dampers 26e and 26i define coupling parts.

When an alternating voltage is applied across the resonance electrodes 26b and 26f in the piezo-resonator 26 having dynamic dampers, the overlapping region of the resonance electrodes 26b and 26f is resonated in a shear vibration mode, to implement an operation for serving as a piezo-resonator. Further, the resonance part is formed to have the aforementioned specific dimensional ratio, whereby resonance energy is effectively trapped.

Even if vibration caused in the overlapping region of the resonance electrodes 26b and 26f leaks, this vibration is reliably trapped in a portion up to the dynamic dampers 26e and 26i. Namely, even if resonance of a shear vibration mode outwardly leaks from the resonance part, the dynamic dampers 26e and 26i are resonated by the leaking vibration, to damp this leaking vibration by a phenomenon of a dynamic damper. Therefore, substantially no vibration is transmitted to the piezoelectric ceramic plate portions which are located outward beyond the dynamic dampers 26e and 26i. Therefore, it is possible to mechanically hold the piezo-resonator 26 without inhibiting resonance of the resonance part, by coupling the piezoelectric ceramic plate portions extending outwardly beyond the dynamic dampers 26e and 26i to other members.

Referring again to FIG. 29, the piezo-resonator 28 having dynamic dampers employed for the first resonance plate 22 is described with reference to FIG. 31B. The piezo-resonator 28 having dynamic dampers is the aforementioned first or fourth type piezo-resonator, and formed by a piezoelectric ceramic plate 28a having a planar shape shown in FIG. 31B. This piezoelectric ceramic plate 28a is provided on its center with a piezoelectric vibrating part 28b having a rectangular planar shape. The piezoelectric vibrating part 28b is polarized along arrow P, and provided with resonance electrodes 28c on both major surfaces (that provided on a lower surface is not shown in FIG. 31B).

In the piezoelectric vibrating part 28b, a dimensional ratio b/a is selected to be in a range of ±10% from a value satisfying the equation (1).

When an alternating voltage is applied across the resonance electrodes 28c which are provided on both major surfaces of the piezoelectric vibrating part 28b, the piezoelectric vibrating part 28b is resonated in a width expansion vibration mode, while resonance energy is effectively trapped in this piezoelectric vibrating part 28b due to the ratio b/a which is set in the aforementioned specific range.

On the other hand, elongated bar-type support parts 28d and 28e are coupled to centers of opposite side surfaces of the piezoelectric vibrating parts 28b, while dynamic dampers 28f and 28g are formed on outer sides of the support parts 28d and 28e, respectively. The dynamic dampers 28f and 28g are formed to vibrate in a bending mode, to be resonated by vibration transmitted from the piezoelectric vibrating part 28b. Even if resonance energy leaks from the piezoelectric vibrating part 28b, therefore, this energy is reliably trapped in a vibrating portion between the dynamic dampers 28f and 28g.

Further, coupling parts 28h and 28i are coupled to outer sides of the dynamic dampers 28f and 28g, respectively, while holding parts 28j and 28k are coupled to outer ends of the coupling parts 28h and 28i, respectively. The holding parts 28j and 28k are adapted to couple the piezo-resonator 28 with other members or to mechanically hold the same, and have relatively large areas, as shown in FIG. 31B.

Figure 31B:
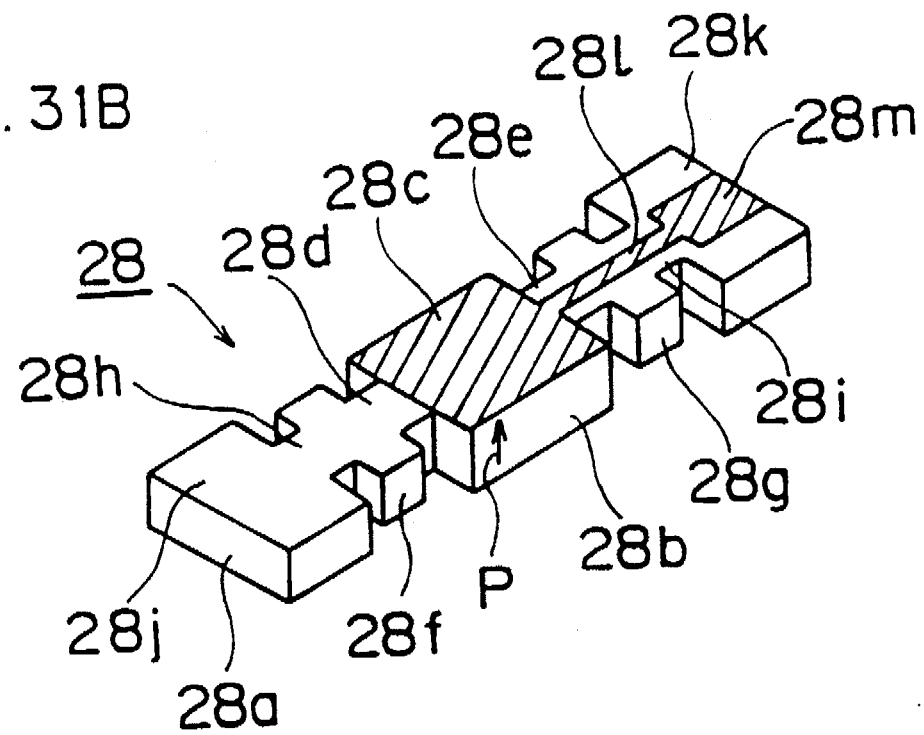

Each of the piezo-resonators 26 and 28 having dynamic dampers shown in FIGS. 31A and 31B can be formed by machining a single piezoelectric ceramic plate as described above, while the respective parts thereof may alternatively be formed by separate members to be coupled with each other through an adhesive or the like. In place of the piezoelectric ceramic plate 28a shown in FIG. 31B, for example, a rectangular piezoelectric ceramic plate for forming a piezoelectric vibrating part may be employed so that members forming the support parts 28d and 28e, the dynamic dampers 28f and 28g, the coupling parts 28h and 28i and the holding parts 28j and 28k are bonded to its side portions by an adhesive or the like and integrated with each other. It is pointed out here that a piezoelectric ceramic plate and parts for defining each piezo-resonator may be formed by machining a piezoelectric ceramic plate, or coupling a plurality of members with each other also in each piezo-resonator having dynamic dampers in each of second to tenth preferred embodiments described later.

The resonance electrode 28c appearing in FIG. 31B is electrically connected to an electrode 28m which is formed on an upper surface of the holding part 28k through a connecting conductive part 28l. Similarly, the other resonance electrode which is formed on the lower surface of the resonance part 28b is also electrically connected to an electrode which is formed on a lower surface of the holding part 28j through a connecting conductive part.

Referring again to FIG. 29, the piezo-resonator 27 having dynamic dampers, which has the same structure as the piezo-resonator 26 having dynamic dampers, and the piezo-resonators 26 and 28 having dynamic dampers are integrated with each other by bonding side surfaces of the holding parts thereof with each other by an insulating adhesive, while the first and second spacer plates 29 and 30 are further bonded on side portions of the integrated substance, thereby forming the first resonance plate 22.

The resonance plate 22 is provided on its upper surface with electrodes 22a and 22d for electrically connecting the piezo-resonators 26 to 28 with each other for forming a ladder-type filter as described later. The electrode 22a is electrically connected with the resonance electrode 26f (see FIG. 31A) of the piezo-resonator 26. Similarly, the electrode 22c is electrically connected with the resonance electrode 26b, while the electrodes 22b and 22d are electrically connected with single ones of the resonance electrodes formed on the side surfaces of the piezo-resonator 27. The piezo-resonator 28 is provided with an electrode 28m, which is connected with the resonance electrode 28c to reach an edge of the resonance plate 22 as shown in FIG. 31B, as well as another electrode which is electrically connected with the resonance electrode provided on its lower surface to reach an opposite edge on the lower surface of the resonance plate 22.

In the second resonance plate 24, piezo-resonators 32 and 33 having dynamic dampers and utilizing a width vibration mode, which are formed similarly to the piezo-resonator 28 having dynamic dampers, are bonded to both sides of a piezo-resonator 31 having dynamic dampers utilizing a shear vibration mode provided with the same structure as the piezo-resonator 26. Further, first and second spacer plates 34 and 35 having the same thickness as the piezo-resonators 31 to 33, which are made of a suitable insulating material having a certain degree of strength such as insulating ceramics or synthetic resin, are bonded to side portions of the piezo-resonators 32 and 33. As shown in FIG. 29, the spacer plates 34 and 35 have substantially U-shaped notches 34a and 35a on edges close to the piezo-resonators 32 and 33. These notches 34a and 35a are adapted to ensure spaces for allowing vibration of resonance and dynamic resonance parts of the piezo-resonators 32 and 33.

The structures of the piezo-resonators 31 to 33 themselves are similar to those of the piezo-resonators 26 and 28, and hence redundant description is omitted.

In the second resonance plate 24, electrodes 24a and 24b are formed on the upper surface to reach different edges. The electrodes 24a and 24b are electrically connected to single ones of the resonance electrodes which are provided on both side surfaces of the piezo-resonator 31. In the piezo-resonators 32 and 33, on the other hand, electrodes 32c and 33d provided on the holding parts which are electrically connected with resonance electrodes 32a and 33a provided on the upper surfaces are formed to reach different edges of the resonance plate 24. Further, resonance electrodes which are formed on lower surfaces of the resonance parts of the piezo-resonators 32 and 33 are electrically connected to electrodes reaching opposite edges on the lower surfaces.

The case substrates 21 and 25 have cavities 21a and 25a on lower and upper surfaces thereof, respectively. The cavities 21a and 25a are adapted to allow vibration of the resonance parts and the dynamic dampers of the adjacent piezo-resonators upon stacking. The isolating spacer 23 is also provided with a cavity 23a on its upper surface, as well as with another cavity (not clearly shown in FIG. 29) of the same shape on its lower surface. These cavities are adapted to allow vibration of the resonance parts and the dynamic dampers of the vertically arranged piezo-resonators.

Alternatively, the case substrate 21, the isolating spacer 23 and the case substrate 25 may be in the form of flat plates with no provision of the cavities 21a, 23a and 25a. In this case, it is necessary to form similar spaces for allowing vibration of the piezoelectric vibrating parts and the dynamic dampers, by interposing rectangular frame type spaces having thicknesses corresponding to depths of the cavities 21a, 23a and 25a, or applying an insulating adhesive in the form of rectangular frames.

The case substrates 21 and 25 and the isolating spacer 23 can be prepared from an insulating material having a certain degree of strength such as insulating ceramics such as alumina or synthetic resin, for example.

According to this preferred embodiment, the case substrate 21, the first resonance plate 22, the isolating spacer 23, the second resonance plate 24 and the case substrate 25 are stacked with and bonded to each other by an insulating adhesive, to be integrated as a ladder-type filter having a laminate structure. This is now described with reference to FIG. 30.

As clearly understood from FIG. 30, the ladder-type filter 20 according to this preferred embodiment has a structure obtained by stacking a plurality of rectangular plate type members, and is provided with terminal electrodes 20a to 20l extending from the side surfaces to reach the upper and lower surfaces. It is possible to form the terminal electrodes 20a to 20l by applying and baking conductive paste, or through evaporation, plating or sputtering. Alternatively, a plurality of electrodes 21b may be previously formed on the upper surface of the case substrate 21 as shown in FIG. 29 with formation of a plurality of terminal electrode portions on the lower surface of the case substrate 25 so that an electrode material is thereafter applied to the side surfaces of the laminate as shown in FIG. 30, thereby forming the terminal electrodes 20a to 20l extending from the side surfaces to reach the upper and lower surfaces.

Figure 32:
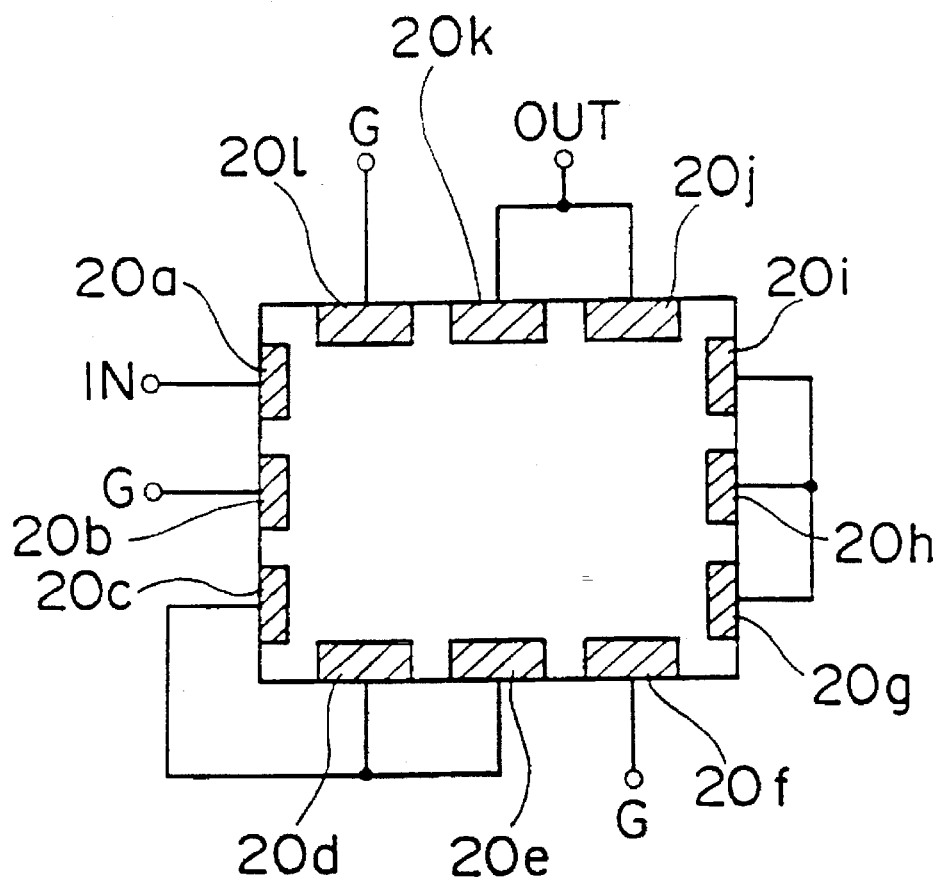
FIG. 32 is a typical plan view for illustrating connected states of terminal electrodes in the first preferred embodiment.
Figure 33:
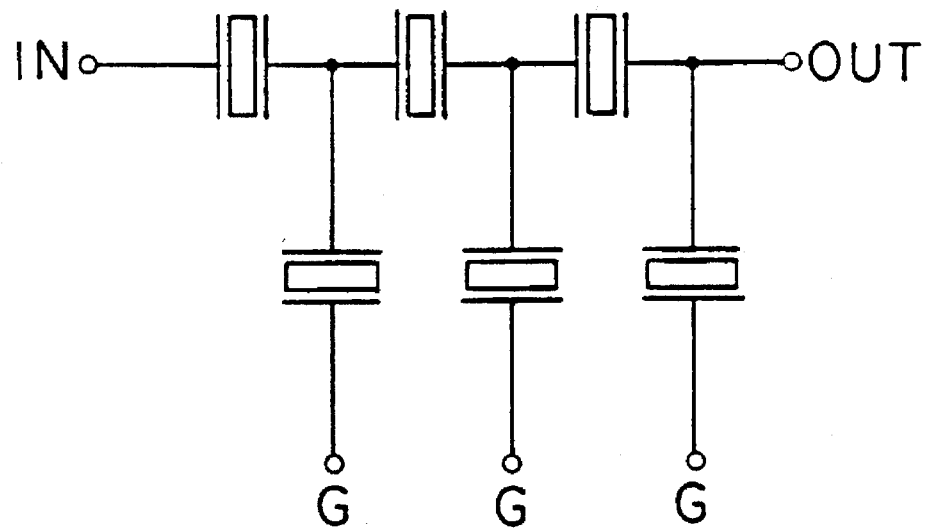
FIG. 33 illustrates the circuit structure of the ladder-type filter according to the first preferred embodiment.

It is possible to drive the ladder-type filter 20 obtained in the aforementioned manner as that shown in a circuit diagram of FIG. 33, by connecting the terminal electrodes 20a to 20l as shown in FIG. 32 so that the terminal electrode 20a serves as an input end, the terminal electrodes 20k and 20j serve as output ends and the terminal electrodes 20l, 20f and 20b are connected to ground potentials.

In the ladder-type filter 20 according to this preferred embodiment, series and parallel resonators are formed by the piezo-resonators 26 to 28 and 31 to 33 having dynamic dampers employing shear and width vibration modes.

Therefore, it is possible to readily widen a passband as compared with a ladder-type filter employing tuning fork type piezo-resonators.

As clearly understood from FIG. 29, the plate type piezo-resonators 26 to 28 are laterally coupled with each other in the resonance plate 22 of the ladder-type filter 20. Also in the resonance plate 24, the plate type piezo-resonators 31 to 33 are laterally coupled with each other. Thus, it is possible to form a three-stage chip-like ladder-type filter without substantially increasing its thickness. In other words, it is possible to facilitate reduction in height of the ladder-type filter since a plurality of plate type piezo-resonators are laterally coupled with each other in parallel with the mounting surface.

Further, vibrational energy is effectively trapped in a portion between the dynamic dampers in the piezo-resonators having dynamic dampers, whereby the piezo-resonators can be readily coupled and integrated with each other through the holding parts, as described above.

Second Preferred Embodiment

Figure 34:
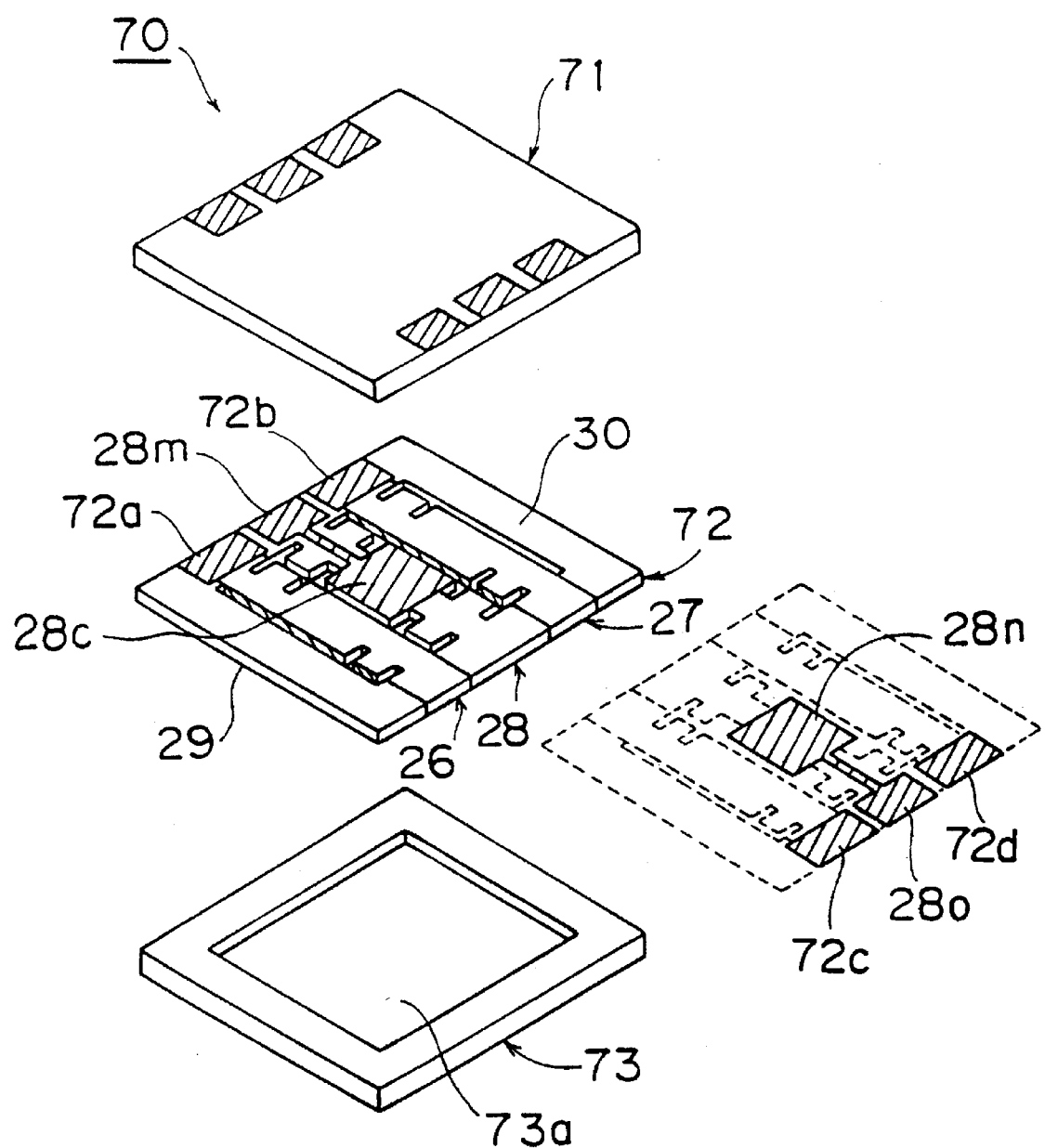
FIG. 34 is an exploded perspective view for illustrating a ladder-type filter according to a second preferred embodiment of the present invention.

FIG. 34 is an exploded perspective view showing a T-type connection filter 70 which is employed in a ladder-type filter according to a second preferred embodiment of the present invention, and FIG. 325 is a perspective view showing the appearance of the T-type filter 70.

The T-type filter 70 is formed by stacking a case substrate 71, a resonance plate 72 and a case substrate 73 with each other. The case substrates 71 and 73 are similar in structure to the case substrates 21 nd 25 in the first preferred embodiment. Namely, a cavity 73a is formed in an upper surface of the case substrate 73, while a similar cavity (not shown in particular) is also formed in a lower surface of the case substrate 71.

On the other hand, the resonance plate 72 is substantially similar in structure to the resonance plate 22 which is employed in the first preferred embodiment. Namely, a piezo-resonator 28 having dynamic dampers utilizing a width expansion mode is arranged at the center and piezo-resonators 26 and 27 having dynamic dampers utilizing a shear mode are bonded to side portions thereof, while spacers 29 and 30 are further bonded to outer sides of the piezo-resonators 26 and 27, respectively. According to this preferred embodiment, however, electrodes 72a and 72b which are connected to single resonance electrodes of the piezo-resonators 26 and 27, respectively, are also drawn out on an edge drawing out an electrode 28m which is connected to a resonance electrode 28c on an upper surface of the piezo-resonator 28.

As shown by broken lines on the right side of FIG. 34, further, an electrode 28o which is electrically connected to a resonance electrode 28n is drawn out on the same edge as electrodes 72c and 72d which are electrically connected with other resonance electrodes of the piezo-resonators 26 and 27, respectively, also on the lower surface.

Figure 35:
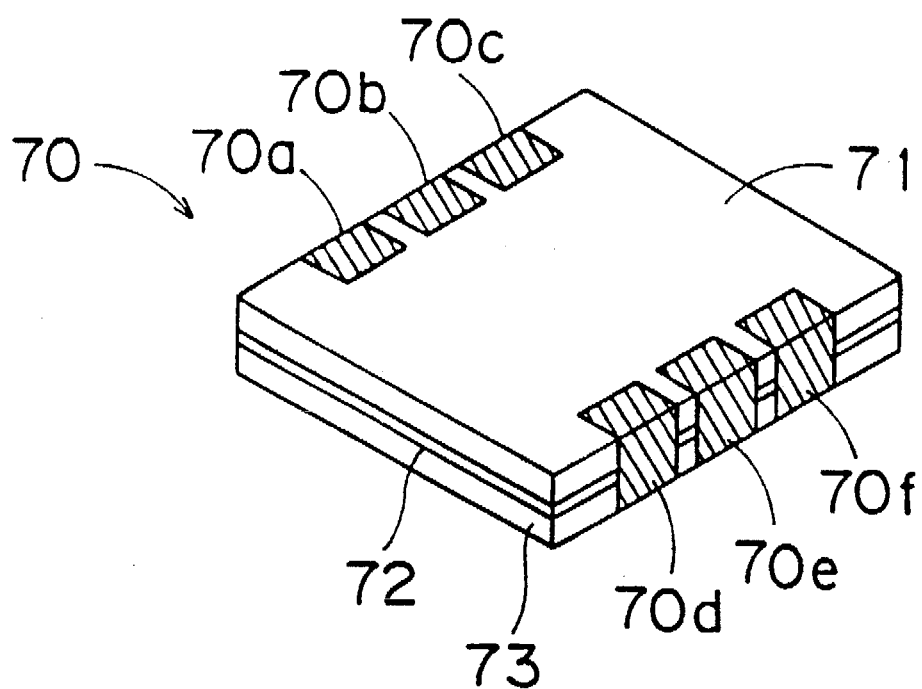
FIG. 35 is a perspective view showing the appearance of a T-connection type filter which is prepared in the second preferred embodiment.
Figure 36:
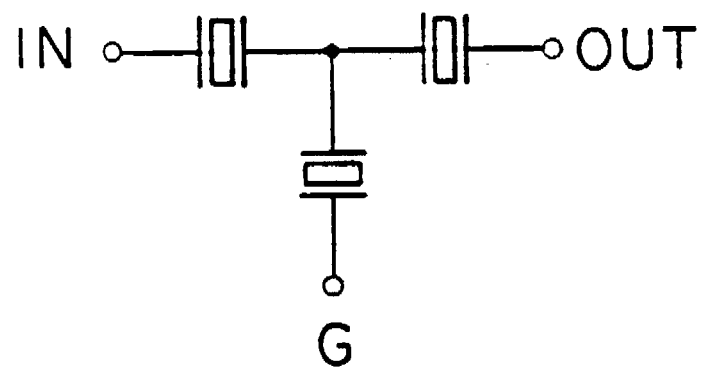
FIG. 36 illustrates the circuit structure of the T-connection type filter which is prepared in the second preferred embodiment.

As clearly understood from FIG. 35, terminal electrodes 70a and 70f are provided on the ladder-type filter 70 which is formed by stacking the aforementioned respective members, in response to the positions provided with the electrodes 28m and 72a to 72d, respectively. Therefore, it is possible to form a T-type filter shown in FIG. 36 by employing the terminal electrode 70c as an input end, connecting the terminal electrode 70b to a ground potential, employing the terminal electrode 70a as an output end and connecting the terminal electrodes 70d to 70f in common.

Figure 37:
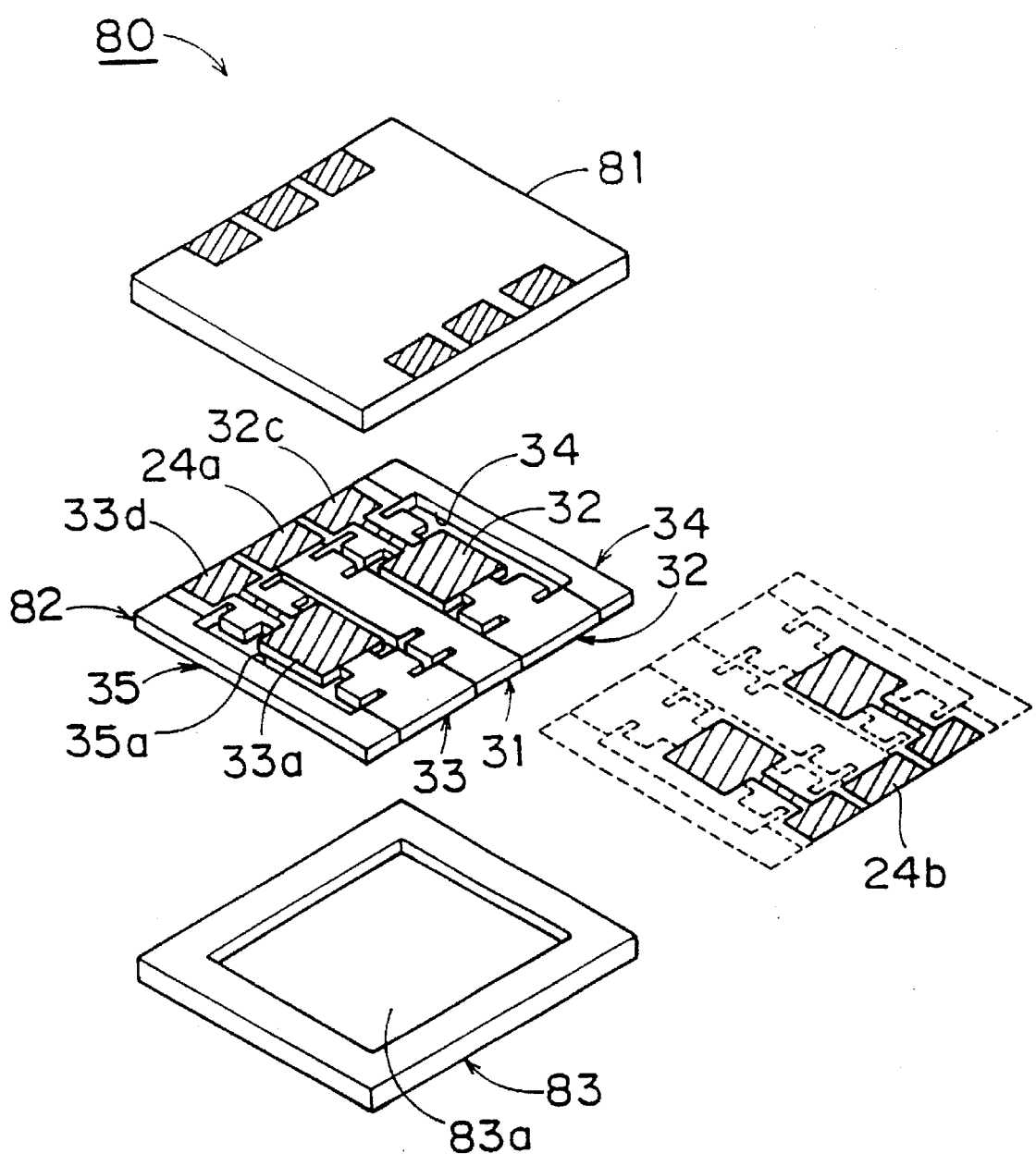
FIG. 37 is an exploded perspective view showing a π-connection type filter which is prepared in the second preferred embodiment.
Figure 38:
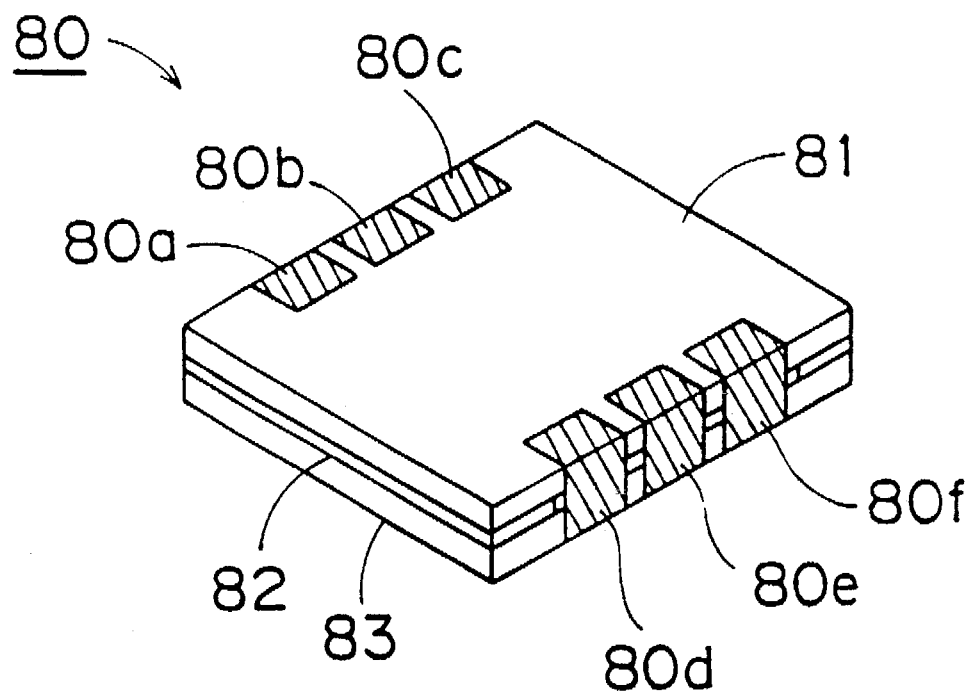
FIG. 38 is a perspective view showing a π-connection type filter which is prepared in the second preferred embodiment.

The aforementioned filter 70 is connected with a π-type connection filter 80 shown in FIGS. 37 and 38.

The π-type filter 80 is formed by stacking a case substrate 81, a resonance plate 82 and a case substrate 83 with each other. The case substrates 81 and 83 are similar in structure to the case substrates 71 and 73 shown in FIG. 34. Namely, a cavity is formed in a lower surface of the case substrate 81, while a cavity 83a is formed in an upper surface of the case substrate 83.

On the other hand, the resonance plate 82 is substantially similar in structure to the resonance plate 24 in the first preferred embodiment. The former is different from the latter in that both of resonance electrodes 32a and 33a provided on upper surfaces of piezo-resonators 32 and 33 having dynamic dampers and utilizing a width expansion modes are drawn out on an edge of the resonance plate 82 while both of those provided on lower surfaces are also drawn out on another edge of the resonance plate 82 as shown by broken lines on the right side of FIG. 37. Other points of the resonance plate 82 are similar to those of the resonance plate 24, and hence corresponding parts are denoted by corresponding reference numerals, to omit redundant description.

Figure 39:
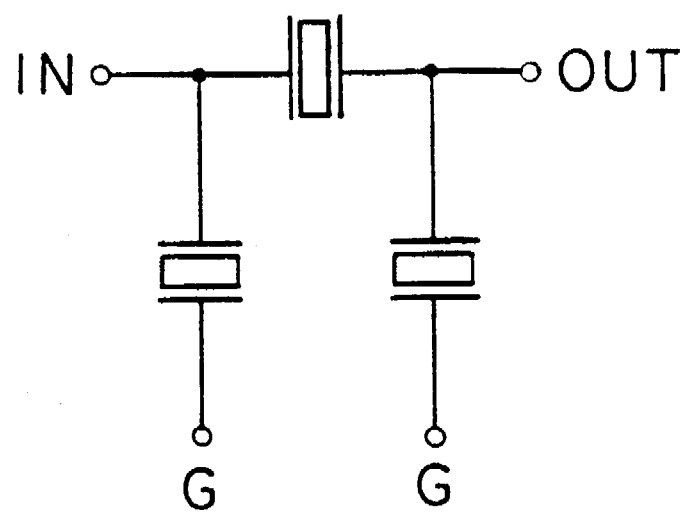
FIG. 39 illustrated the circuit structure of the π-connection type filter which is prepared in the second preferred embodiment.

When terminal electrodes 80a to 80f are formed on side surfaces of the π-type filter 80 so that the terminal electrodes 80a and 80b are connected in common to define an output end, the terminal electrodes 80g and 80f are connected in common to define an input end as shown in FIG. 38, a π-type filter shown in FIG. 39 is formed.

Therefore, it is possible to form a three-stage ladder-type filter by connecting the output end of the aforementioned T-type filter 70 with the input end of the π-type filler 80. In other words, it is possible to form a ladder-type filter of the same stage number as that according to the first preferred embodiment by connecting the T-type filter 70 with the π-type filter 80.

Third Preferred Embodiment

Figure 40:
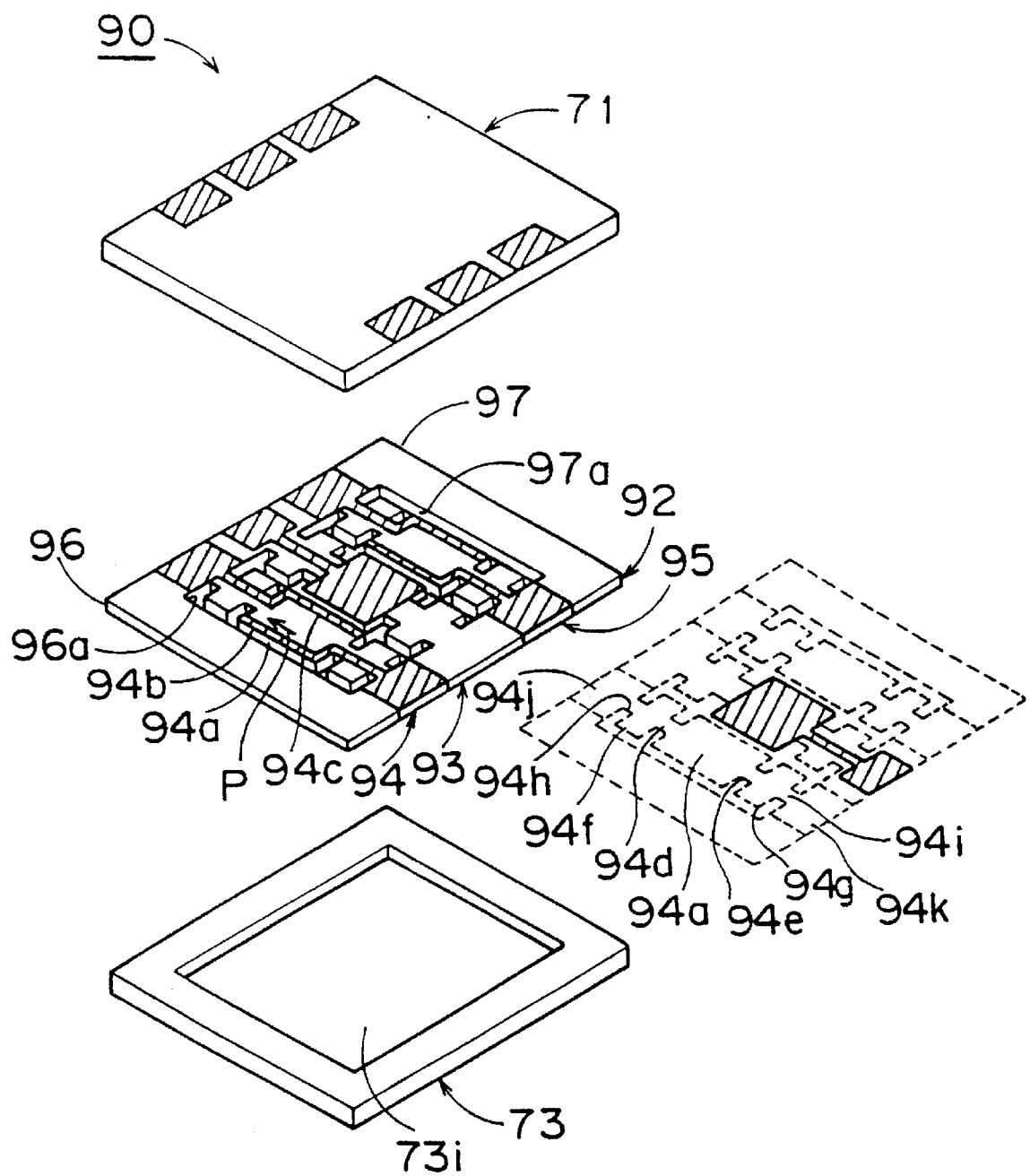
FIG. 40 is an exploded perspective view for illustrating a T-connection type filter which is prepared in a third preferred embodiment.
Figure 41:
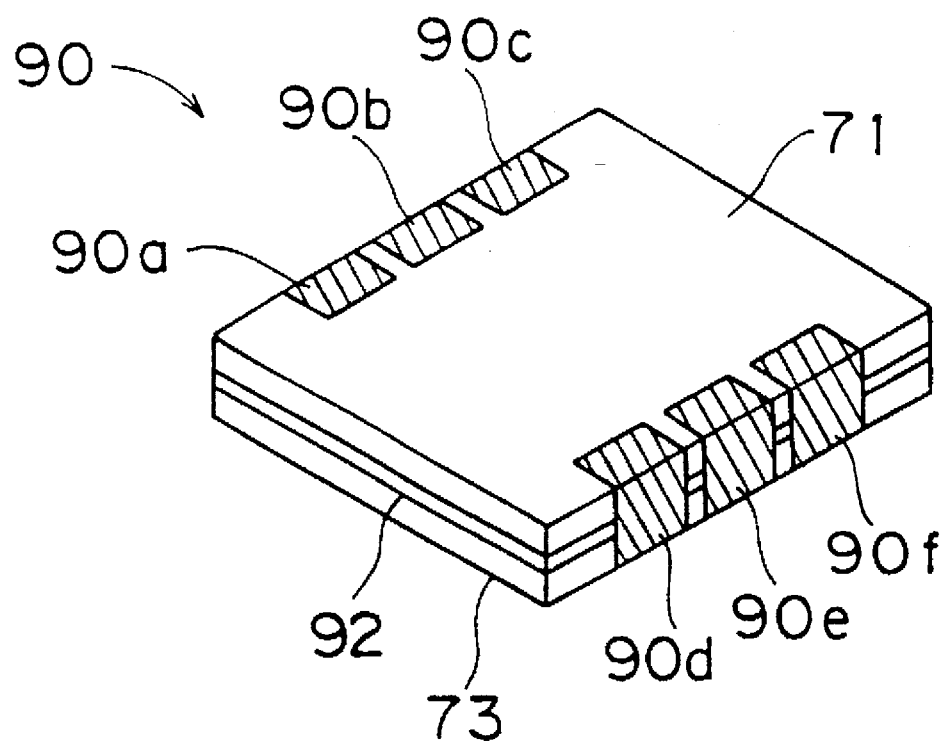
FIG. 41 illustrates the appearance of the T-connection type filter which is prepared in the third preferred embodiment.
Figure 42:
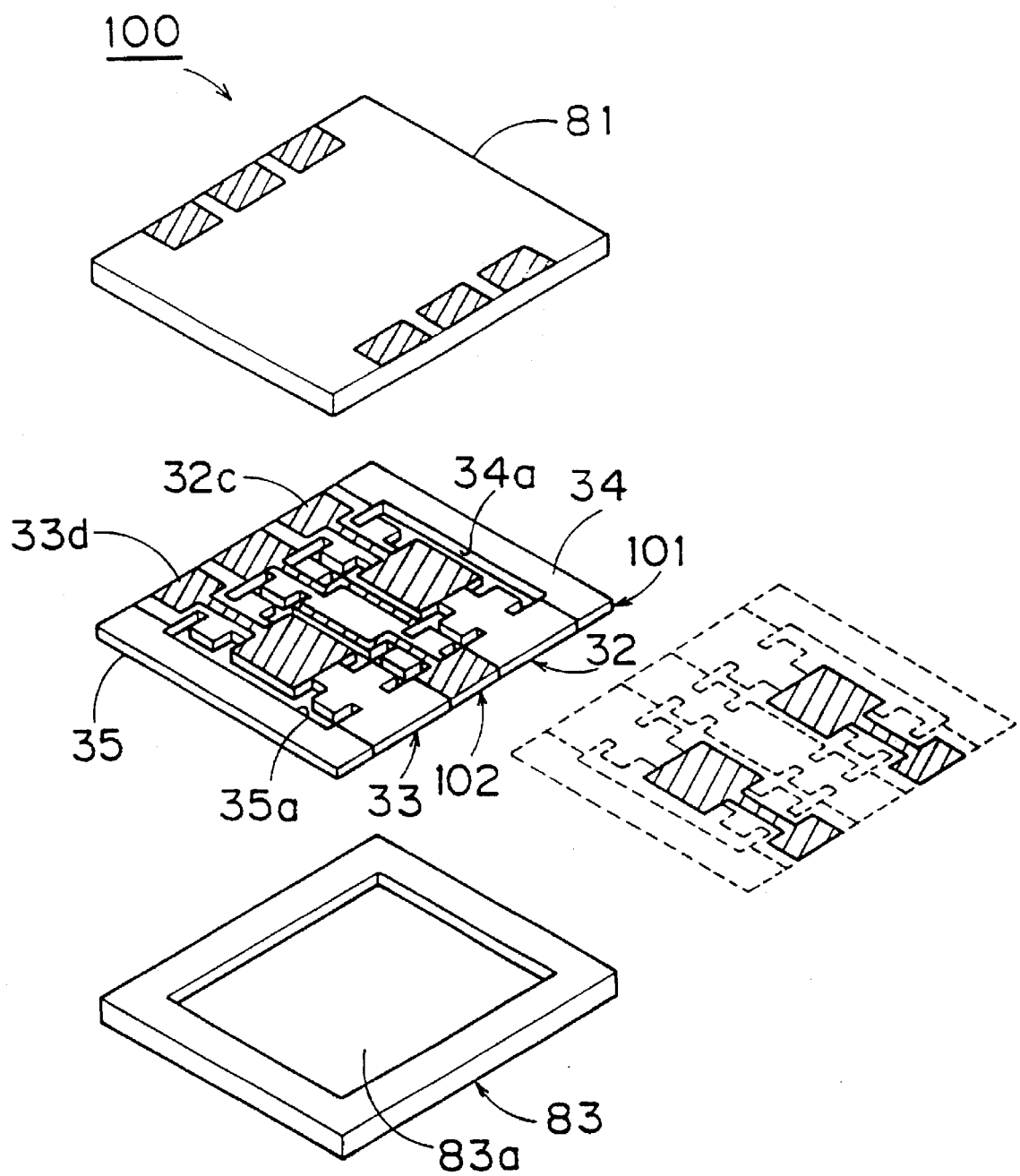
FIG. 42 is an exploded perspective view showing the T-connection type filter which is prepared in the third preferred embodiment.
Figure 43:
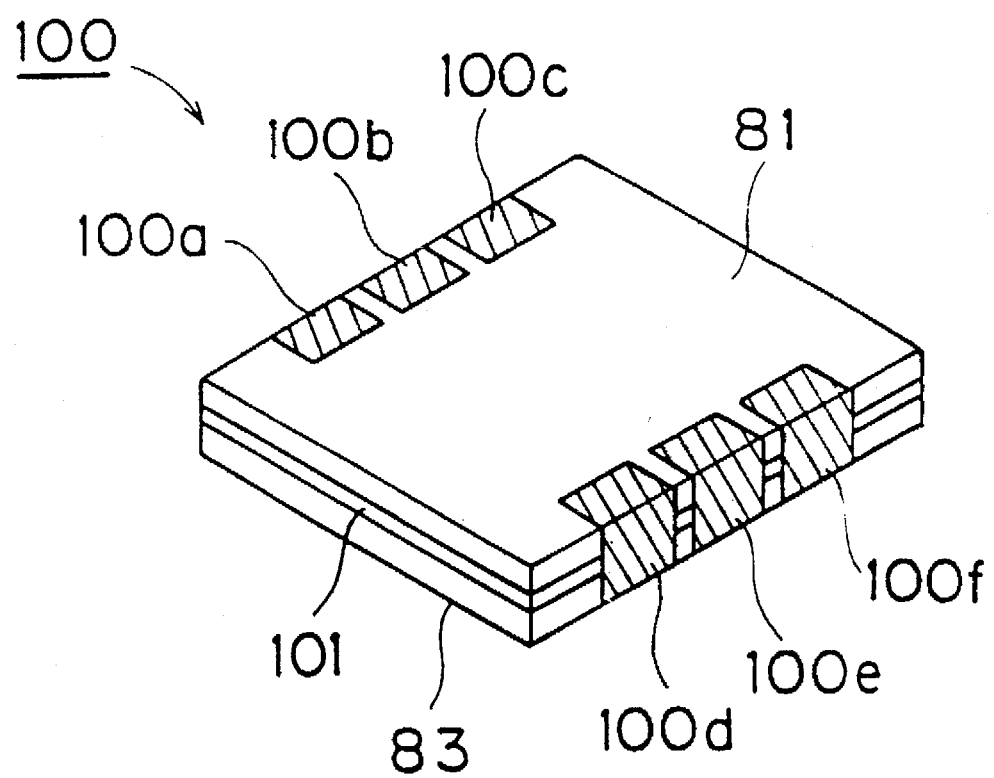
FIG. 43 is an exploded perspective view showing the T-connection type filter which is prepared in the third preferred embodiment.

A ladder-type filter according to a third preferred embodiment of the present invention is formed by connecting a T-type filter 90 shown in FIGS. 40 and 41 with a π-type filter 100 shown in FIGS. 42 and 43, to define a three-stage ladder-type filter similarly to the second preferred embodiment.

The T-type filter 90 shown in FIGS. 40 and 41 is formed by stacking case substrates 71 and 73 and a resonance plate 92 with each other similarly to the T-type filter 70 according to the second preferred embodiment. The resonance plate 92 is provided on its center with a piezo-resonator 93 having dynamic dampers and utilizing a width expansion mode. This piezo-resonator 93 is similar in structure to the piezo-resonator 28 having dynamic dampers and utilizing a width expansion mode employed in the first preferred embodiment.

Piezo-resonators 94 and 95 having dynamic dampers and utilizing a shear mode are bonded to side portions of the piezo-resonator 93 through adhesion of holding parts.

The piezo-resonator 94, which is shaped as shown in FIG. 40 by machining a piezoelectric ceramic plate, has a rectangular plate type resonance part 92a on its center. The resonance part 94a is polarized so that polarization axes thereof are located along the longitudinal direction of the piezoelectric plate. The resonance part 94a is provided on its upper surface with resonance electrodes 94b and 94c, along a pair of opposite edges. When an alternating voltage is applied across the resonance electrodes 94b and 94c, therefore, the resonance part 94a is resonated in a shear vibration mode.

The shape of the piezo-resonator 94 is described with reference to FIG. 40, which shows the contour of the piezo-resonator 94 in broken lines on its right side. Support parts 94d and 94e having relatively narrow widths are coupled to the resonance part 94a, while dynamic dampers 94f and 94g are formed on outer sides of the support parts 94d and 94e, respectively. Further, holding parts 94j and 94k are connected to outer side surfaces of the dynamic dampers 94f and 94g through coupling parts 94h and 94i, respectively. Respective parts provided outside the resonance part 94a are similar to those of the piezo-resonator 28.

The piezo-resonator 95 utilizing a shear mode is identical in structure to the piezo-resonator 94.

Spacers 96 and 97 are pasted to outer sides of the piezo-resonators 94 and 95. The spacers 96 and 97, which are formed to be equal in thickness to the piezo-resonators 93 and 95, have notches 96a and 97a in portions close to the piezo-resonators 94 and 95, respectively. These notches 96a and 97a are adapted to allow vibration of vibrating parts of the piezo-resonators 94 and 95.

It is possible to obtain a T-type filter which is similar to the T-type filter 70 according to the second preferred embodiment, by stacking the resonance plate 92 to be held by the case substrates 71 and 73 and forming terminal electrodes 90a to 90f on end surfaces thereof (see FIG. 41). Namely, it is possible to drive the filter as a T-type filter by employing the terminal electrode 90c as an input end, connecting the terminal electrodes 90d to 90f in common, connecting the terminal electrode 90b to a ground potential and employing the terminal electrode 90a as an output end.

As shown in FIG. 42, on the other hand, the π-type filter 100 is substantially similar in structure to the π-type filter 80 according to the second preferred embodiment. Namely, the π-type filter 100 is formed by stacking case substrates 81 and 83 and a resonance plate 101 to be interposed therebetween. The resonance plate 101 is different from the resonance plate 82 in that a piezo-resonator 102 having dynamic dampers and utilizing a shear vibration mode is provided on its center. The piezo-resonator 102 having dynamic dampers is similar in structure to the piezo-resonator 94 having dynamic dampers employed in the T-type filter 90.

As shown in FIG. 43, it is possible to form the π-type filter 100 by forming terminal electrodes 100a to 100f on a laminate obtained by stacking the case substrate 81, the resonance plate 101 and the case substrate 83. Namely, it is possible to drive the filter 100 as a π-type filter by connecting the terminal electrodes 100a and 100b in common for defining an output end, connecting the terminal electrodes 100c and 100d to ground potentials and connecting the terminal electrodes 100e and 100f in common for defining an input end.

Thus, it is possible to form a three-stage ladder-type filter by connecting the T-type filter 90 with the π-type filter 100, similarly to the second preferred embodiment.

Fourth Preferred Embodiment

Figure 44:
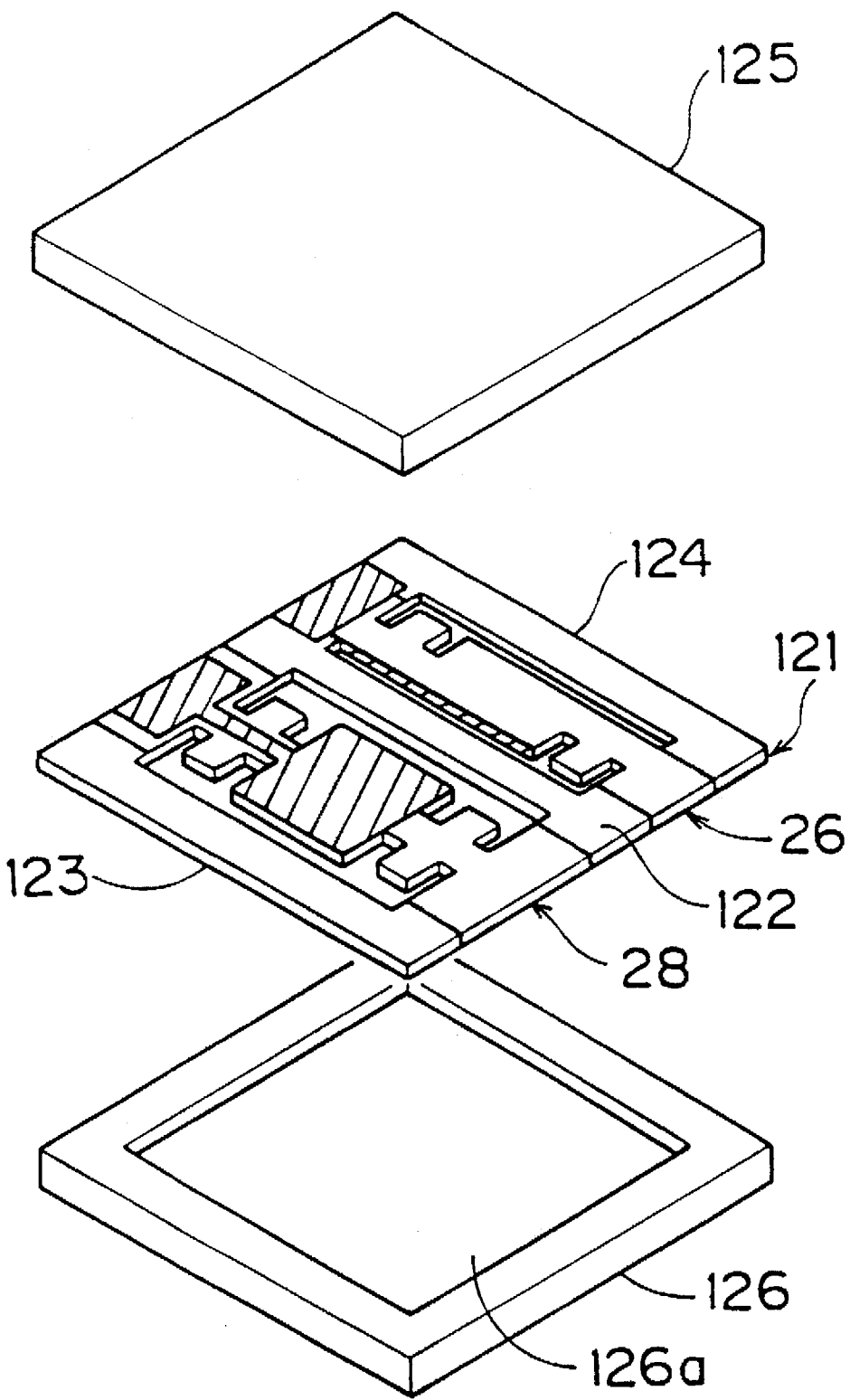
FIG. 44 is an exploded perspective view for illustrating a ladder-type filter according to a fourth preferred embodiment of the present invention.
Figure 45:
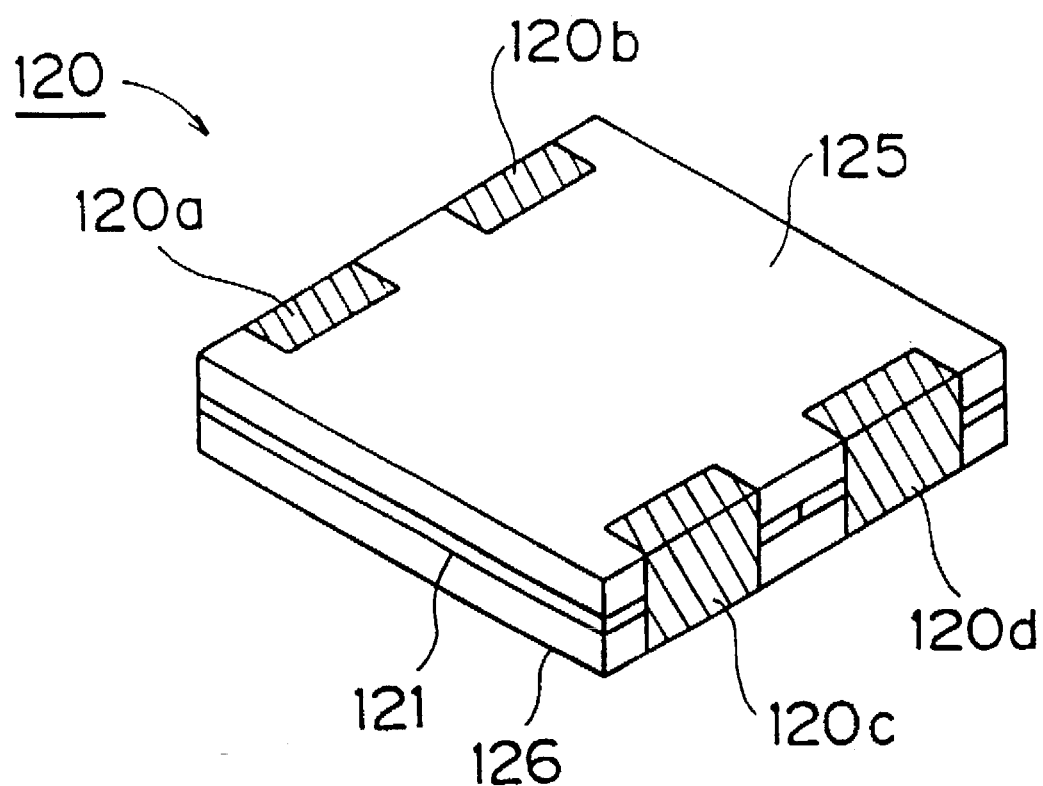
FIG. 45 is a perspective view showing the appearance of the ladder-type filter according to the fourth preferred embodiment.

With reference to FIGS. 44 and 45, a ladder-type filter 120 according to a fourth preferred embodiment of the present invention is now described.

According to this preferred embodiment, piezo-resonators 26 and 28 are integrated with each other as a single resonance plate 121. Namely, the piezo-resonators 26 and 28 are bonded to each other through a spacer 122, while spacers 123 and 124 are bonded to a side portion of the piezo-resonator 27 and an outer side of the piezo-resonator 26 respectively, to define the resonance plate 121. It is possible to obtain a laminate shown in FIG. 45 by stacking case substrates 125 and 126 to vertically hold the resonance plate 121 therebetween.

Figure 46:
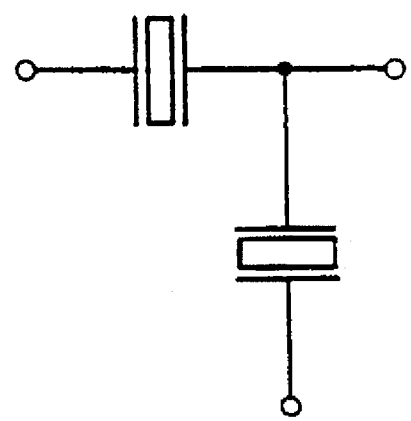
FIG. 46 illustrates the circuit structure of the ladder-type filter according to the fourth preferred embodiment.

A one-stage ladder-type filter is formed by providing terminal electrodes 120a and 120d on opposite end surfaces of the laminate. Namely, it is possible to form a one-stage ladder-type filter as shown in FIG. 46, by connecting the terminal electrode 120a to a ground potential, employing the terminal electrode 120b as an input end and connecting the terminal electrodes 120c and 120d in common or defining an output end. It is also possible to readily form a ladder-type filter having two or more stages, by stacking a plurality of such resonance plates 121 through cavity forming spacers.

Fifth Preferred Embodiment

Figure 47:
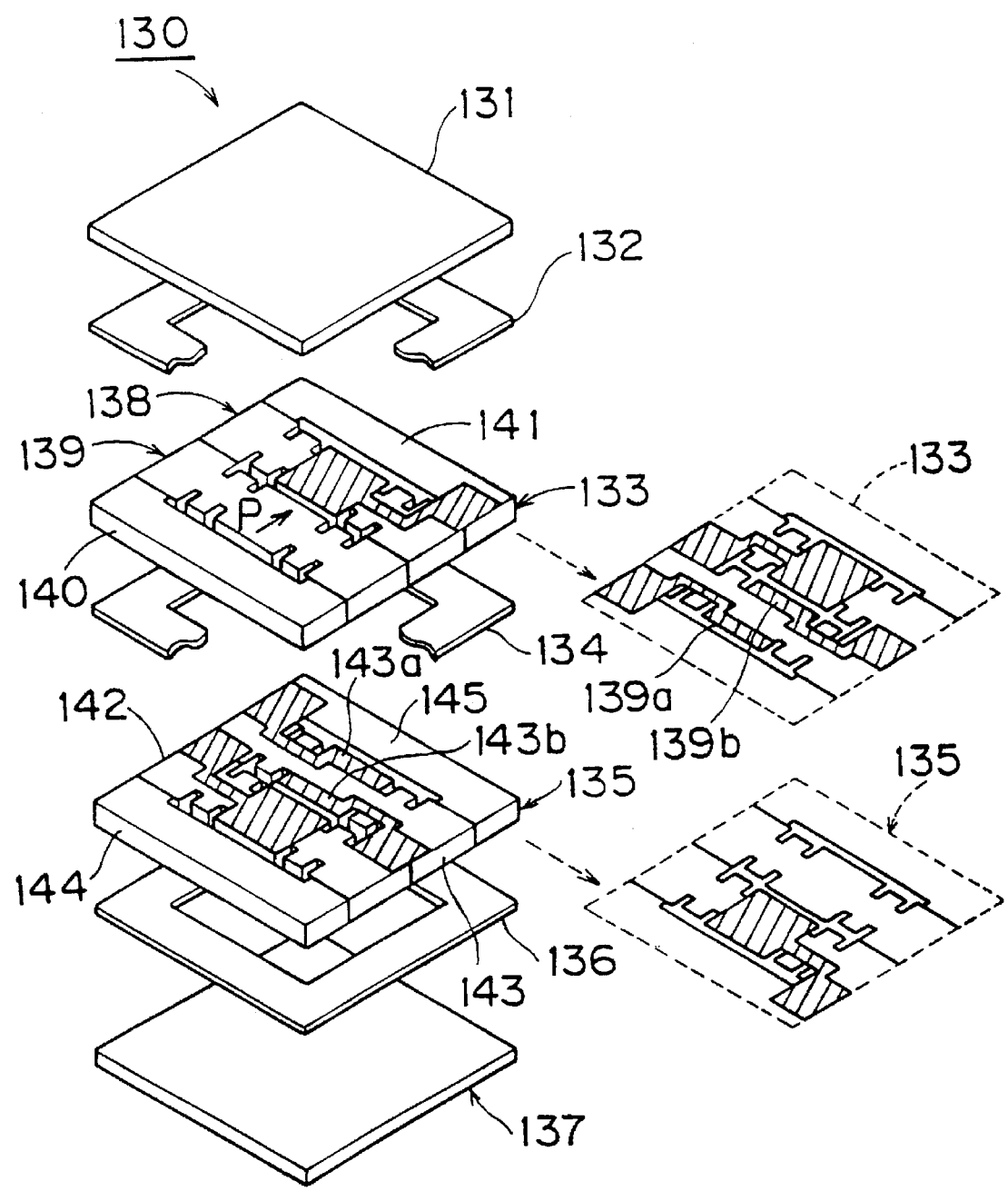
FIG. 47 is an exploded perspective view for illustrating a ladder-type filter according to a fifth preferred embodiment of the present invention.
Figure 48:
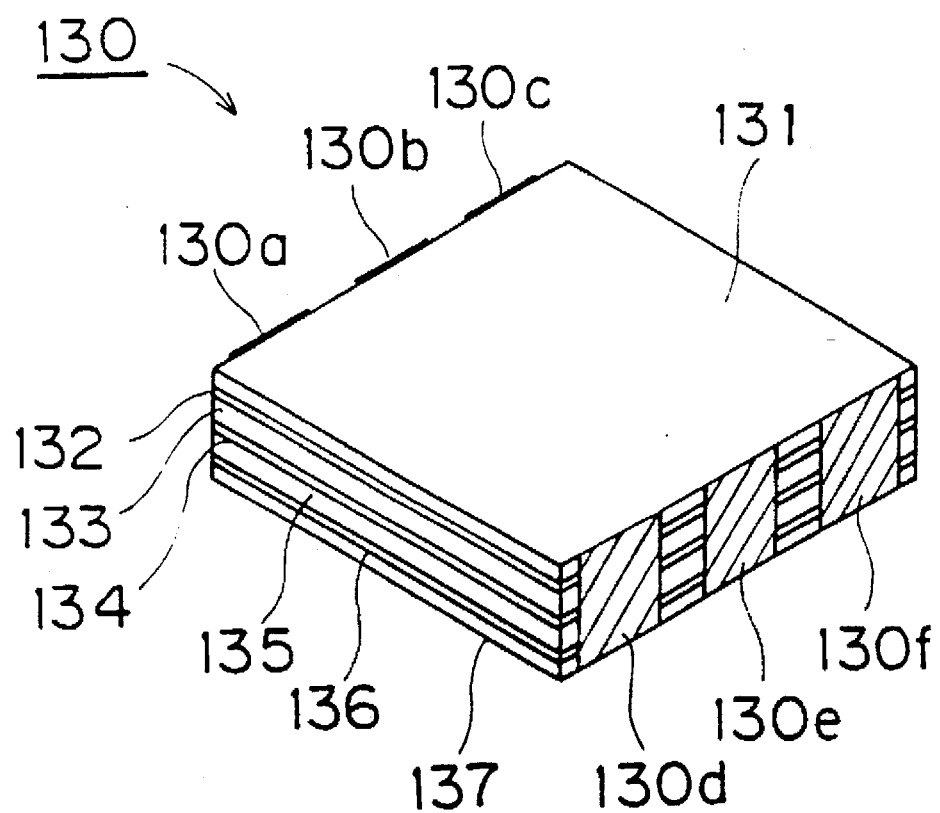
FIG. 48 is a perspective view showing the appearance of the ladder type filter according to the fifth preferred embodiment.

FIG. 47 is an exploded perspective view for illustrating a ladder-type filter 130 according to a fifth preferred embodiment of the present invention, and FIG. 48 is a perspective view showing its appearance.

The ladder-type filter 130 is formed by stacking a case substrate 131, a cavity forming spacer 132, a first resonance plate 133, a cavity forming spacer 134, a second resonance plate 135, a cavity forming spacer 136 and a case substrate 137.

The case substrates 131 and 137 are made of flat plate type insulating ceramics or synthetic resin, while the cavity forming spacers 132, 134 and 136 are formed similarly to those employed in the second preferred embodiment.

The first resonance plate 133 is formed by integrating piezo-resonators 138 and 139 having dynamic dampers and utilizing a width expansion mode by bonding holding parts thereof with each other and pasting spacers 140 and 144 to outer sides of the integrated substance.

The piezo-resonator 138 is formed similarly to the piezo-resonator 28 having dynamic dampers and utilizing a width expansion mode employed in the first preferred embodiment. The piezo-resonator 139 having dynamic dampers, and similarly utilizing a width expansion mode but with a longitudinal effect, is formed by providing resonance electrodes 139a and 139b on a pair of opposite ends on a lower surface of a resonance part in a piezoelectric ceramic plate having a planar shape which is similar to that of the piezo-resonator 138, as shown on a right side of FIG. 47. When an alternating voltage is applied across the resonance electrodes 139a and 139b, therefore, the piezo-resonator 130 operates as a width expansion mode resonator utilizing a piezoelectric longitudinal effect. The resonance electrodes 139a and 139b are drawn out to opposite edges of the resonance plate 133, respectively.

The second resonance plate 135 is formed by pasting holding parts of a piezo-resonator 142 having dynamic dampers of a transverse effect and utilizing a width mode and a piezo-resonator 143 having dynamic dampers and utilizing a longitudinal effect to each other, and further pasting spacers 144 and 145 on both sides thereof. In the second resonance plate 135, a pair of resonance electrodes 143a and 143b are formed on an upper surface of the piezo-resonator 143 having dynamic dampers utilizing a longitudinal effect.

The ladder-type filter 130 according to this preferred embodiment is obtained by stacking the aforementioned respective members and forming external electrodes 130a to 130f on both end surfaces of the laminate as obtained, as shown in FIG. 48.

Figure 49:
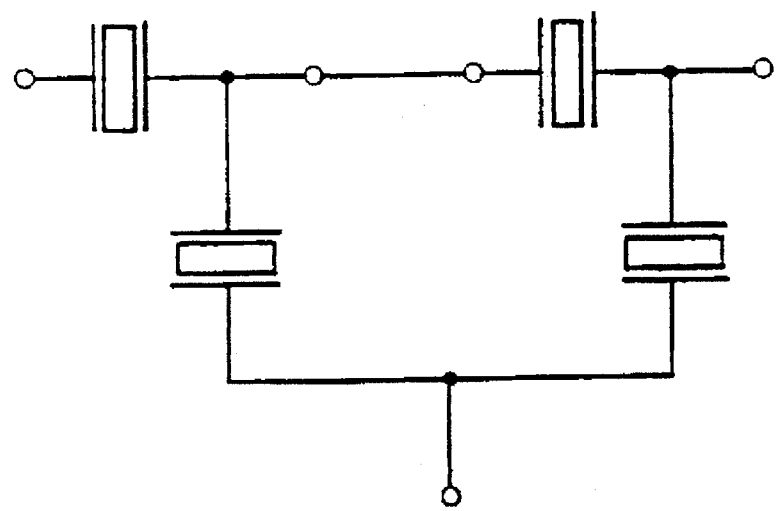
FIG. 49 illustrates the circuit structure of the ladder-type filter according to the fifth preferred embodiment.

Namely, a two-stage ladder-type filter shown in FIG. 49 is obtained by utilizing the external electrode 130c as an input end, connecting the external electrodes 130a and 130d in common for forming an output end, connecting the external electrodes 130e and 130f in common, and connecting the external electrode 130b to a ground potential.

Sixth Preferred Embodiment

Figure 50:
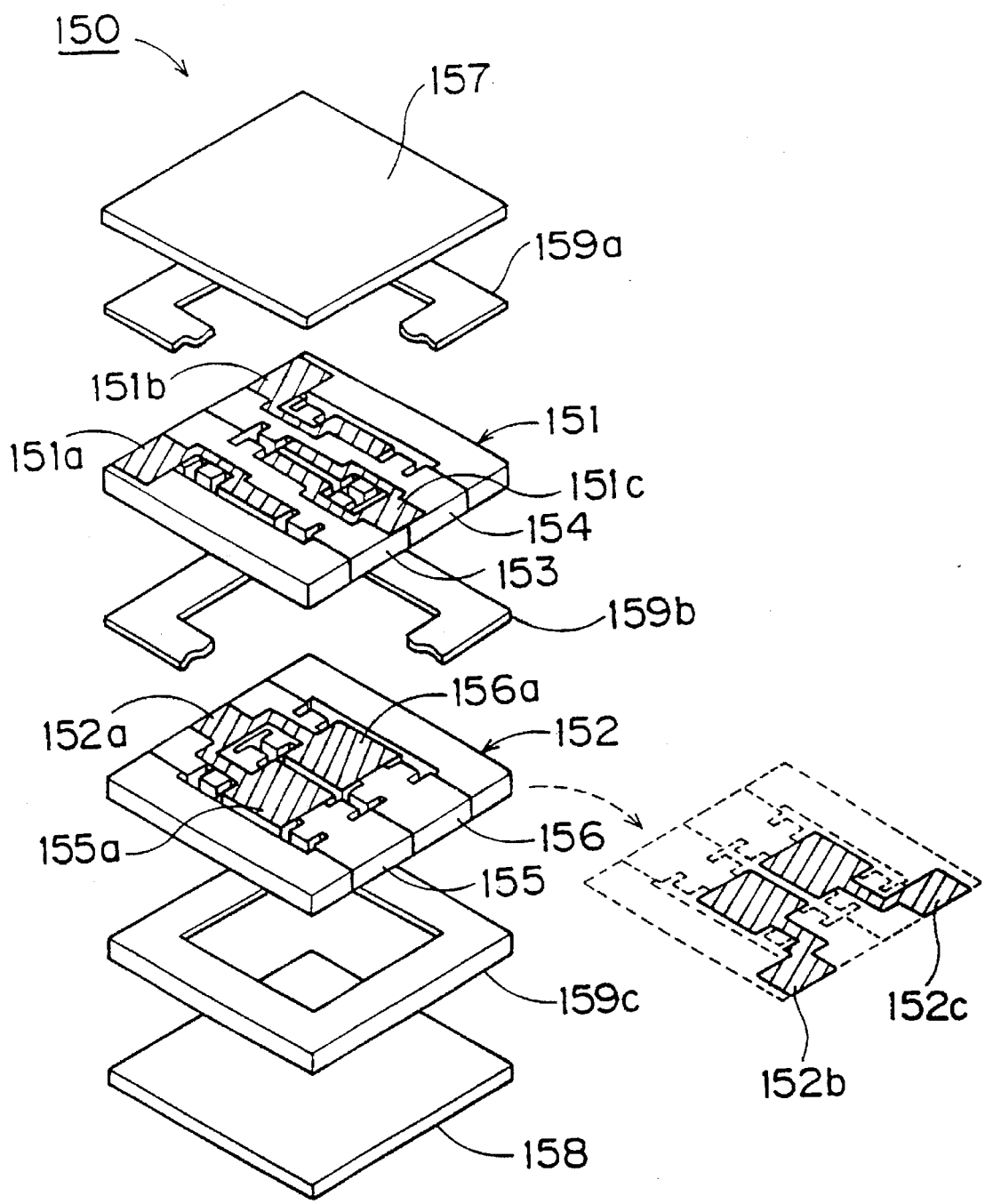
FIG. 50 is an exploded perspective view for illustrating a ladder-type filter according to a sixth preferred embodiment.
Figure 51:
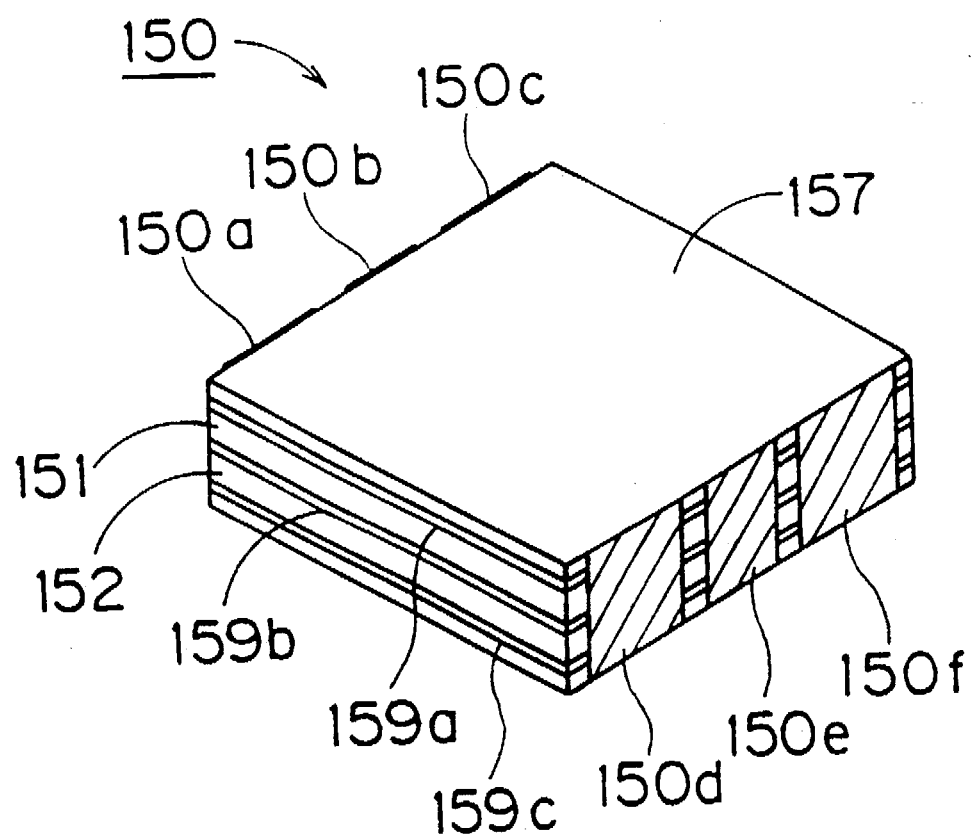
FIG. 51 is a perspective view showing the appearance of the ladder type filter according to the sixth preferred embodiment.

FIG. 50 is an exploded perspective view showing a ladder-type filler 150 according to a sixth preferred embodiment of the present invention, and FIG. 51 is a perspective view showing its appearance.

This preferred embodiment corresponds to a modification of the ladder-type filter 130 according to the fifth preferred embodiment. Therefore, only portions different from those of the fifth preferred embodiment are described.

A first resonance plate 151 is formed by bonding holding parts of piezo-resonators 153 and 154f having dynamic dampers and utilizing a piezoelectric longitudinal effect for integrating the same with each other. The piezo-resonators 153 and 154 are similar in structure to the piezo-resonator 143 employed in the fourth preferred embodiment. On the other hand, a second resonance plate 152 is formed by bonding holding parts of width mode piezo-resonators 155 and 156 having dynamic dampers utilizing a piezo-electric transverse effect for integrating the same with each other.

The piezo-resonators 155 and 156 are similar in structure to the piezo-resonator 138 employed in the fifth preferred embodiment.

In the first resonance plate 151, electrodes 151a and 151b are formed on its upper surface along one edge, and these electrodes 151a and 151b are electrically connected to first resonance electrodes of the piezo-resonators 153 and 154, respectively. On the other hand, an electrode 151c is formed along another edge of the resonance plate 151, and this electrode 151c is electrically connect to second resonance electrodes of the piezo-resonators 153 and 154.

In the second resonance plate 152, an electrode 152a is formed along one edge to be electrically connected to resonance electrodes 155a and 156a of the piezo-resonators 155 and 156. On a lower surface of the resonance plate 152, on the other hand, electrodes 152b and 152c are formed along another edge to be electrically connected to resonance electrodes provided on lower surfaces of the piezo-resonators 155 and 156, respectively.

Numerals 157 and 158 denote case substrates, and numeral 159a to 159c denote cavity forming spacers.

The ladder-type filter 150 according to the sixth preferred embodiment is obtained by forming external electrodes 150a to 150f on a laminate which is obtained by stacking the aforementioned respective members with each other, as shown in FIG. 51.

It is possible to drive the ladder-type filter 150 as a two-stage type filter similarly to the fifth preferred embodiment, by connecting the external electrodes 150a to 150f thereto.

Seventh Preferred Embodiment

Figure 52:
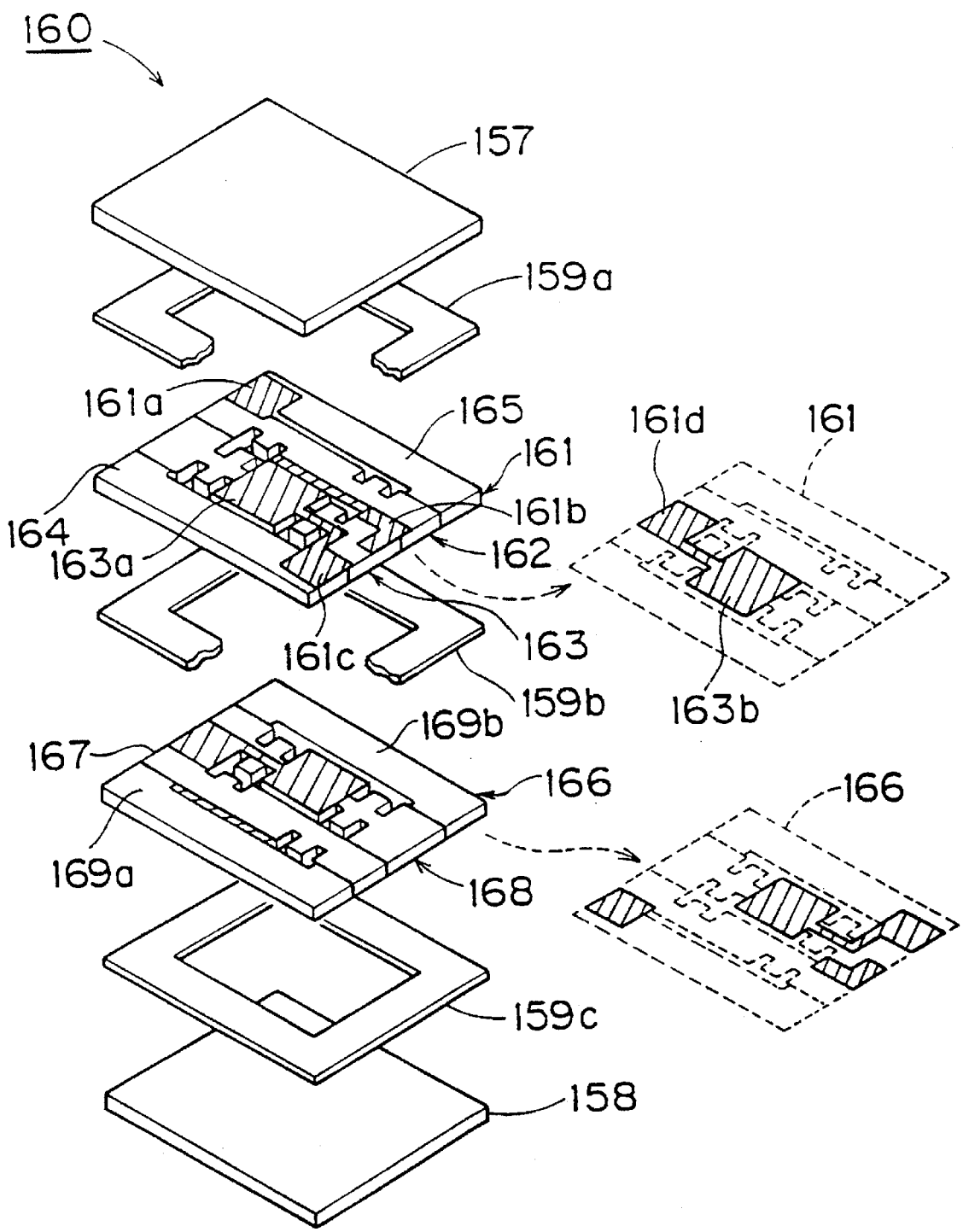
FIG. 52 is an exploded perspective view for illustrating a ladder-type filter according to a seventh preferred embodiment of the present invention.
Figure 53:
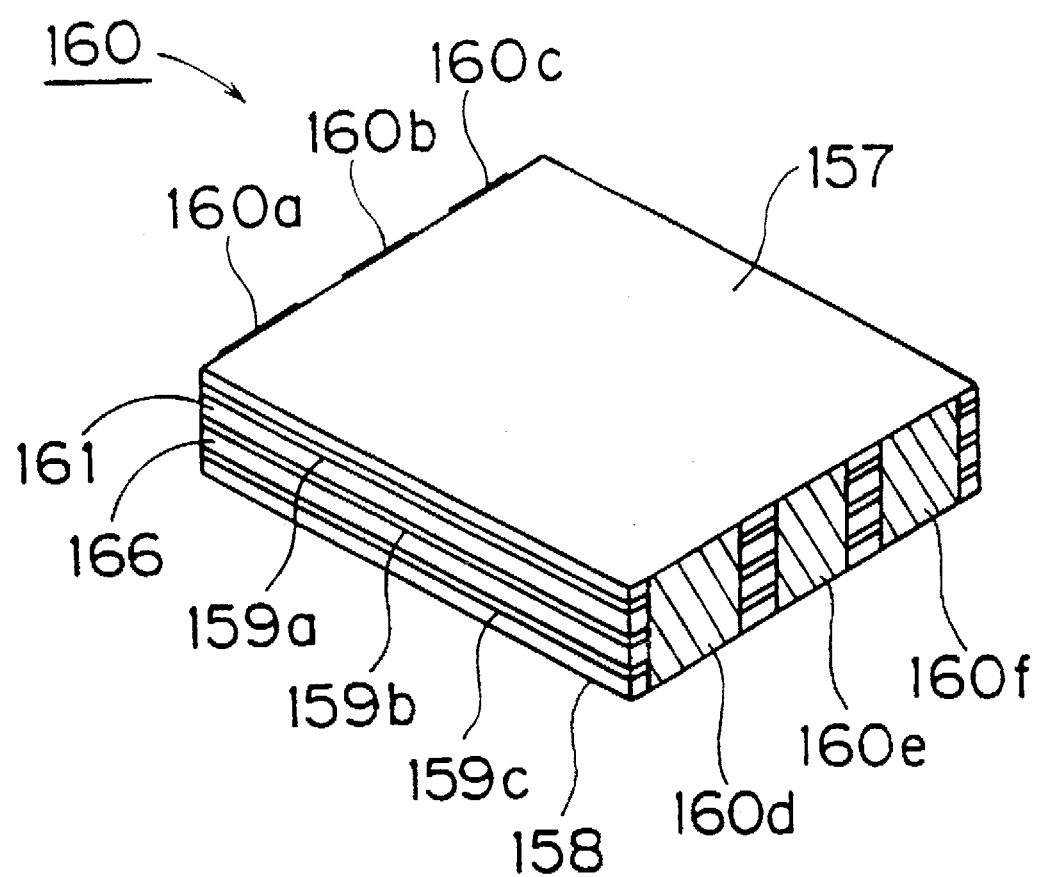
FIG. 53 is a perspective view showing the appearance of the ladder type filter according to the seventh preferred embodiment.

FIG. 52 is an exploded perspective view for illustrating a ladder-type filter 160 according to a seventh preferred embodiment of the present invention, and FIG. 53 is a perspective view showing its appearance.

The ladder-type filter 160 according to this preferred embodiment is similar in structure to that according to the fifth preferred embodiment, except that first and second resonance plates 161 and 166 are different in structure from those of the fifth preferred embodiment.

Referring to FIG. 52, holding parts of a piezo-resonator 162 having dynamic dampers and utilizing a shear mode and a piezo-resonator 163 having dynamic dampers and utilizing a width mode are bonded with each other in the first resonance plate 161, to be integrated with each other. Spacers 164 and 165 are pasted to outer sides of the piezo-resonators 162 and 163, respectively.

The piezo-resonator 162 is similar in structure to the piezo-resonator 26 (see FIG. 17A) utilizing a shear mode, which is employed in the first preferred embodiment. A resonance electrode which is formed on one side surface of the piezo-resonator 162 is electrically connected to an electrode 161a which is formed along one edge of the resonance plate 161. On the other hand, a resonance electrode which is formed on another side surface is electrically connected to an electrode 161b which is formed along another edge of the resonance plate 161.

The piezo-resonator 163 having dynamic dampers and utilizing a width mode is similar in structure to the piezo-resonator 138 employed in the fourth preferred embodiment. A resonance electrode 163a provided on an upper surface of this piezo-resonator 163 is electrically connected to an electrode 161c, which is formed along the same edge as the electrode 161b.

As shown in broken lines on the right side of FIG. 52, on the other hand, a resonance electrode 163b which is formed on a lower surface of the piezo-resonator 163 is electrically connected to an electrode 161d which is formed along one edge of the resonance plate 161 on its lower surface side.

The second resonance plate 166 has a structure corresponding to that obtained by inverting the first resonance plate 161. Holding parts of a piezo-resonator 167 having dynamic dampers and utilizing a shear mode and a piezo-resonator 168 having dynamic dampers and utilizing a width mode are bonded to each other to be integrated with each other, and spacers 169a and 169b are pasted to outer sides of the laminate as obtained.

Since this structure corresponds to that obtained by inverting the first resonance plate 161, electrodes provided on its both major surfaces are vertically inverted as compared with those of the first resonance plate 161.

The ladder-type filter 160 shown in FIG. 53 is obtained by stacking the aforementioned respective members and forming terminal electrodes 160a to 160f on the laminate as obtained. Also in this preferred embodiment, it is possible to drive the ladder-type filter 160 as a two-stage type filter by utilizing the external electrodes 160a and 160d as output ends, utilizing the external electrode 160c as an input end, connecting the external electrode 160b to a ground potential and connecting the external electrodes 160e and 160f in common, similarly to the fifth preferred embodiment.

Eighth Preferred Embodiment

In each of the aforementioned first to seventh preferred embodiments, a laminated ladder-type filter is formed by stacking a plurality of members so that major surfaces of piezo-resonators having dynamic dampers are horizontally directed. However, the inventive ladder-type filter is not restricted to that having a structure obtained by stacking a plurality of piezo-resonators so that major surfaces thereof are horizontally directed. An eighth preferred embodiment of the present invention is directed to such a structure that a plurality of piezo-resonators are stacked with each other so that major surfaces thereof are vertically directed.

Figure 54:
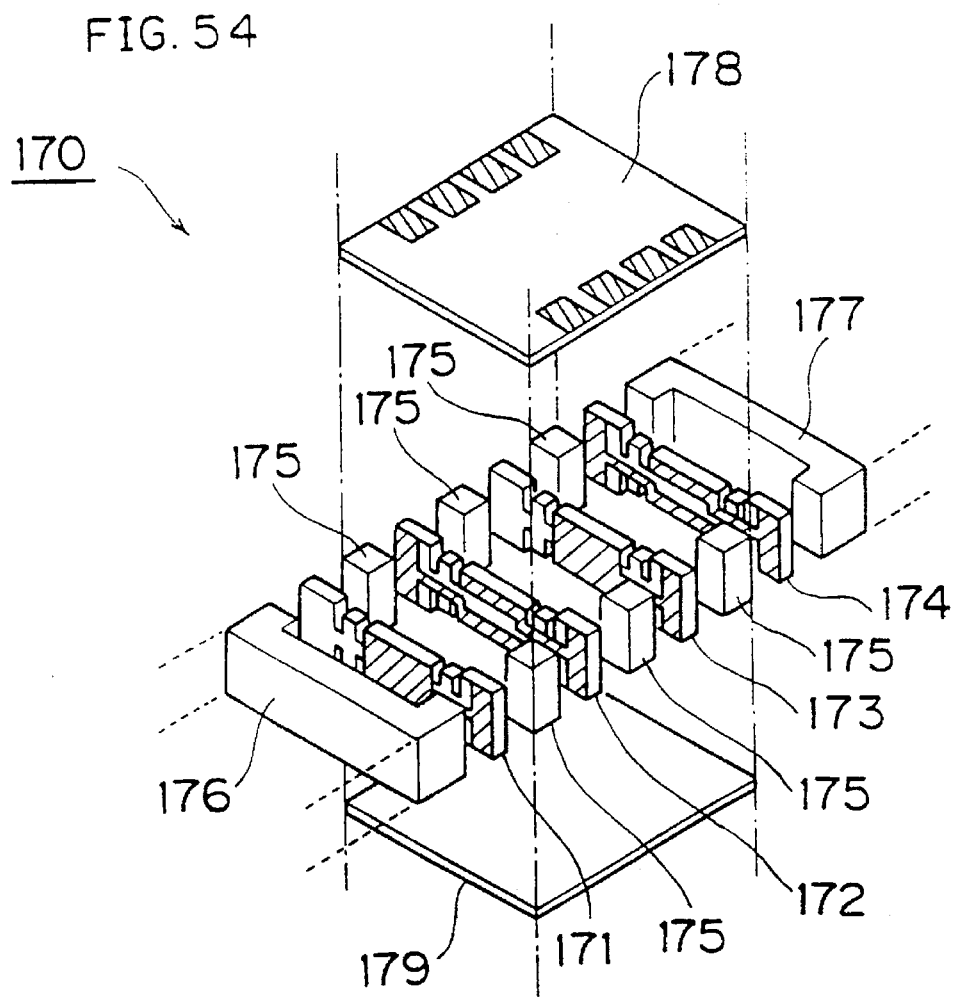
FIG. 54 is an exploded perspective view for illustrating a ladder-type filter according to a eight preferred embodiment of the present invention.

Referring to FIG. 54, a ladder-type filter 170 comprising piezo-resonators 171 and 173 having dynamic dampers and vibrating in a width expansion mode utilizing piezoelectric transverse effect and piezo-resonators 172 and 174 having dynamic dampers and vibrating a width expansion node utilizing a piezoelectric longitudinal effect, which are alternately laterally stacked with each other through spacers 175. Substantially U-shaped spacers 176 and 177 are pasted to outer sides of the piezo-resonators 171 and 174, respectively.

The plurality of spacers 175 and the spacers 176 and 177 are bonded to holding parts of the respective piezo-resonators 171 to 174. In a structure obtained by bonding an integrating the plurality of piezo-resonators 171 to 174 with each other through the spacers 175, 176 and 177, therefore, resonance parts and dynamic dampers of the piezo-resonators 171 to 174 are not inhibited from vibration.

According to this preferred embodiment, case substrates 178 and 179 are stacked on upper and lower surfaces of the structure obtained by bonding and integrating the piezo-resonators 171 and 174 with each other through the spacers 175 to 177.

Figure 55:
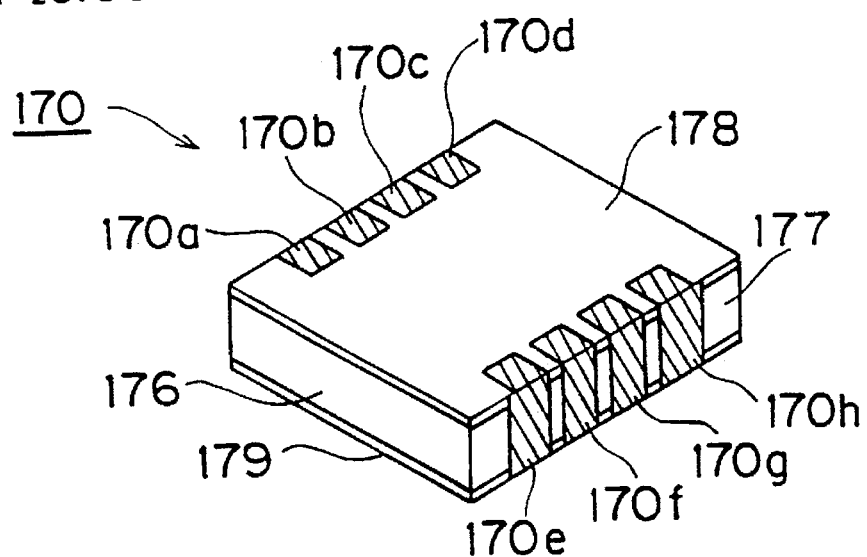
FIG. 55 is a perspective view showing the appearance of the ladder type filter according to the eighth preferred embodiment.

FIG. 55 shows the appearance of the ladder-type filter 170 obtained in the aforementioned manner. Connection with the exterior is attained through terminal electrodes 170a to 170d and 170e to 170h which are formed on end surfaces of the laminate. Namely, it is possible to form a two-stage ladder-type filter by connecting the terminal electrodes 170a and 170g to ground potentials, connecting the terminal electrodes 170b to 170d in common, connecting the terminal electrodes 170e and 170f in common for defining an output end, and employing the terminal electrode 170h as an input end.

Ninth Preferred Embodiment

Figure 56:
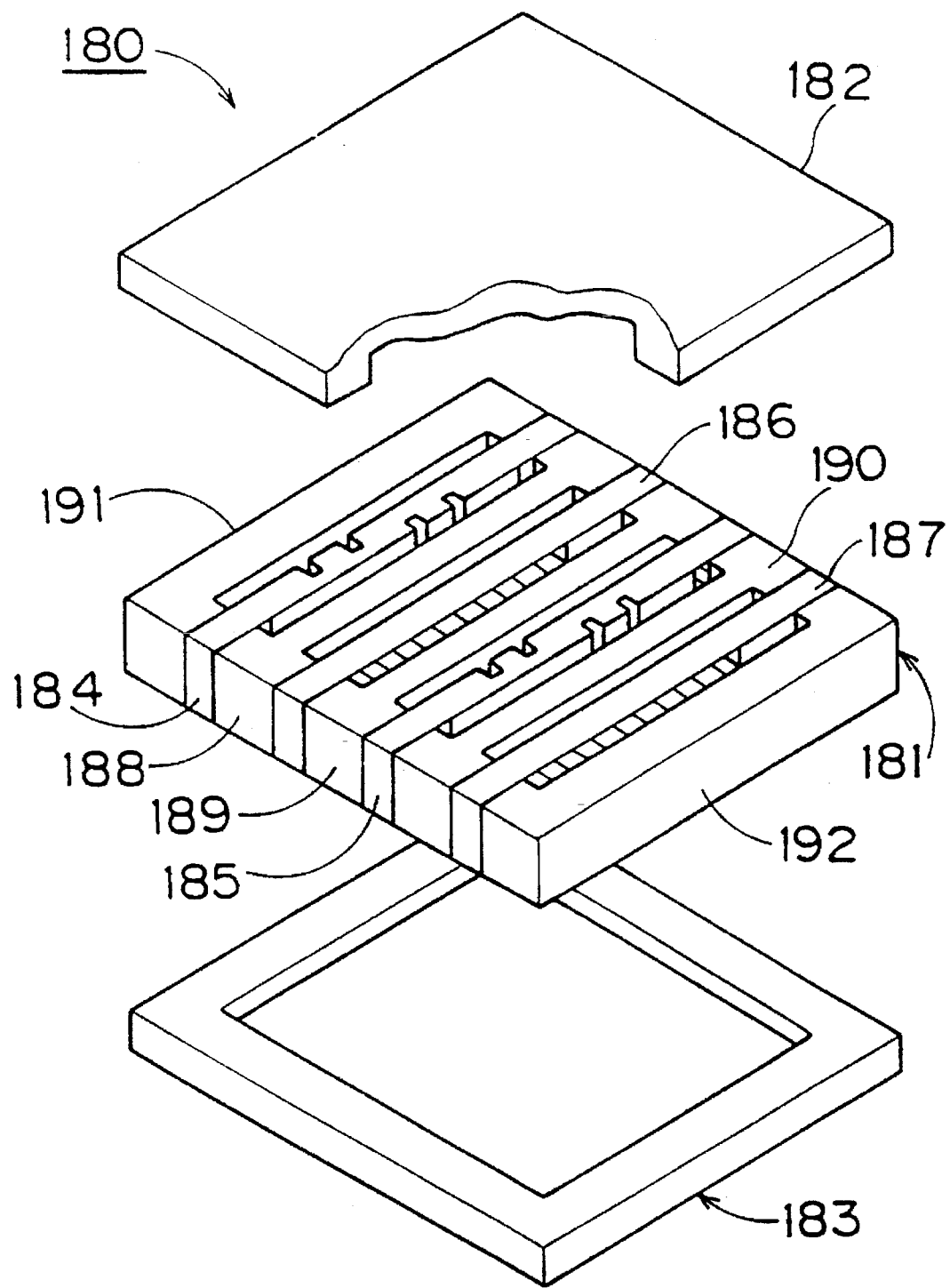
FIG. 56 is an exploded perspective view for illustrating a ladder-type filter according to a ninth preferred embodiment of the present invention.

While the ladder-type filter is formed by a plurality of piezo-resonators having dynamic dampers in each of the aforementioned preferred embodiments, at least one piezo-resonator may be formed by that having dynamic dampers in the ladder-type filter according to the present invention. Such a preferred embodiment is now described with reference to FIGS. 56 and 57.

In a ladder-type filter 180 according to a ninth preferred embodiment of the present invention, case substrates 182 and 183 are stacked on upper and lower portions of a resonance plate 181. The case substrates 182 and 183 are similar in structure to those employed in the first preferred embodiment.

In the resonance plate 181, piezo-resonators 184 and 185 having dynamic dampers and piezo-resonators 186 and 187 of a thickness shear vibration mode utilizing an ordinary TS mode having no dynamic dampers are laterally stacked with each other through cavity forming spacers 188, 189 and 190. The spacers 188 to 190, which are made of insulating ceramics or synthetic resin, are bonded to portions close to both ends of the piezo-resonators 184 to 187.

Further, spacers 191 and 192 are pasted to outermost sides, thereby forming the resonance plate 181. The spacers 191 and 192, which can also be made of insulating ceramics or synthetic resin, are bonded to portions close to both ends on single major surfaces of the piezo-resonators 181 and 187.

Figure 57:
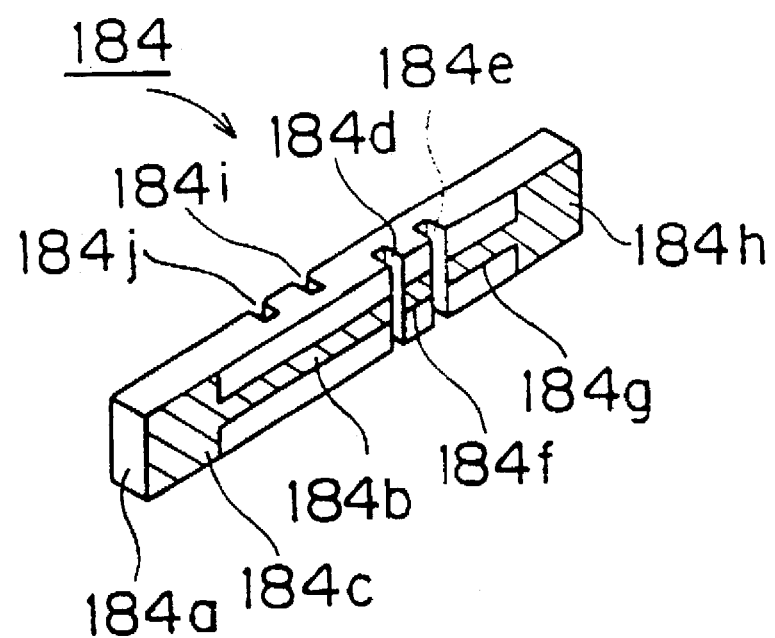
FIG. 57 is a perspective view for illustrating a piezo-resonator which is employed in the preferred embodiment shown in FIG. 56.

As shown in FIG. 57, the piezo-resonator 184 having dynamic dampers and utilizing a shear vibration mode comprises a rectangular plate type piezoelectric ceramic plate 184a and a resonance electrode 184b which is formed on its one major surface. The resonance electrode 184b is electrically connected to an electrode 184c, which is formed on a portion close to one end of the piezoelectric ceramic plate 184a, on the major surface appearing in FIG. 57. According to this preferred embodiment, further, two laterally extending grooves 184d and 184e are formed in the piezoelectric ceramic plate 184a, so that an electrode 184f is formed between the grooves 184d and 184e and electrodes 184g and 184h are formed between the groove 184e and another end of the piezoelectric ceramic plate 184a, respectively. This structure can be obtained by forming the electrodes 184c and 184h of equal areas on both ends of the piezoelectric ceramic plate 184a, forming an elongated electrode for connecting the electrodes 184c and 184h with each other, and thereafter forming the grooves 184d and 184a by dicing or the like.

Also on the other end surface of the piezoelectric ceramic plate 184a, two grooves 184i and 184j are formed on opposite sides of the grooves 184d and 184e through the longitudinal center of the piezoelectric ceramic plate 184a, thereby forming a resonance electrode and electrodes which are connected with the resonance electrode.

Therefore, a portion where the resonance electrodes overlap with each other through the piezoelectric ceramic plate 184a, i.e., a portion held between the grooves 184d and 184e, is defined as a resonance part which is resonated in a shear vibration mode.

Further, piezoelectric ceramic parts located between the grooves 184d and 184e as well as between the grooves 184i and 184j form dynamic dampers, respectively.

The well-known piezo-resonators 186 and 187 of a shear vibration mode utilizing a TS mode are formed to have well-known electrode structures provided with a pair of resonance electrodes overlapping with each other through the rectangular plate type piezoelectric plate on its central portion. The resonance electrodes provided on both major surfaces are drawn out to different end portions, respectively.

The ladder-type filter 180 according to this preferred embodiment is formed by bonding the case substrates 182 and 183 to the upper and lower portions of the resonance plate 181, respectively. It is possible to form a ladder-type filter employing piezo-resonators having dynamic dampers similarly to the aforementioned preferred embodiments, by forming prescribed terminal electrodes on opposite end surfaces of the laminate as obtained. Also in this preferred embodiment, the ladder-type filter is formed by the piezo-resonators having dynamic dampers, whereby the bandwidth can be increased as compared with a ladder-type filter employing piezoelectric tuning fork type resonators.

While each of the first to ninth preferred embodiments has been described with reference to a ladder-type filter employing piezo-resonators having dynamic dampers, the piezo-resonators may be provided with no dynamic dampers.

Tenth Preferred Embodiment

Figure 58:
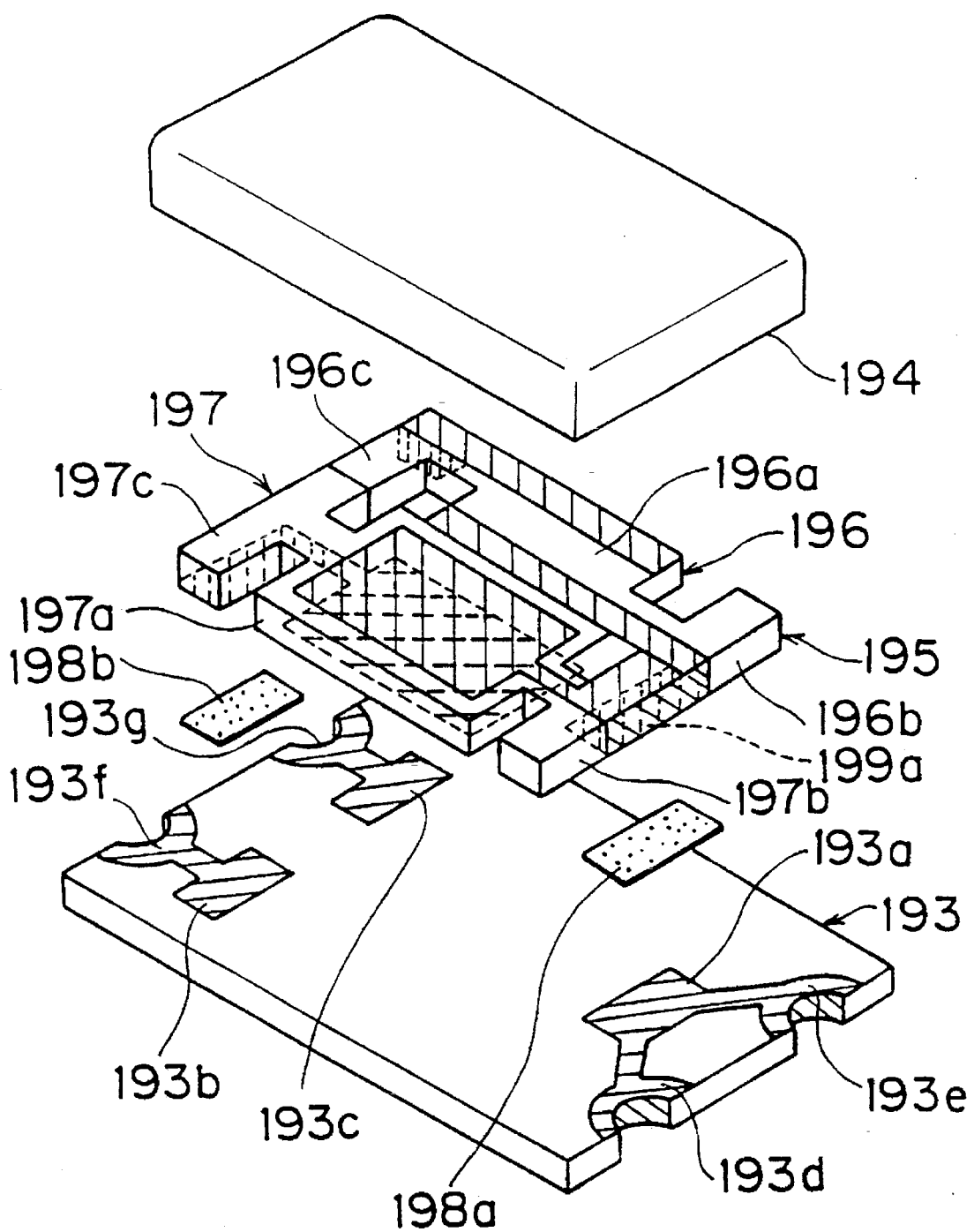
FIG. 58 is an exploded perspective view for illustrating a ladder-type filter according to a tenth preferred embodiment of the present invention.

FIG. 58 is an exploded perspective view showing a ladder-type filter according to a tenth preferred embodiment of the present invention.

According to this preferred embodiment, a resonance plate 195 is arranged in a space which is defined by a base substrate 193 and a cap member 194. The base substrate 193 is made of a proper insulating material such as insulating ceramics such as alumina or synthetic resin. Connecting conductive parts 193a to 193c are formed on the base substrate 193. The connecting conductive parts 193a to 193c are electrically connected to lead electrodes of piezo-resonators as described later, as well as to any ones of external electrodes 193d to 193g which are formed in notches provided on side surfaces of the base substrate 193.

The cap member 194, which is made of a proper material such as synthetic resin or a metal, has an opening in its lower portion. The opening of the cap member 194 is made smaller in area than an upper surface of the base substrate 193. When the lower end surface of the cap member 194 is bonded to the upper surface of the base substrate 193 with an insulating adhesive or the like, therefore, the cap member 194 is integrated with the base substrate 193. Alternatively, the size of the opening of the cap member 194 may be selected so that the opening is in contact with side surfaces of the base substrate 193.

According to this preferred embodiment, the resonance plate 195 is similar in structure to the resonance plate 135 shown in FIG. 47 except that electrode lead parts of the former are slightly different from those of the latter and the resonance plate 195 has no first and second spacer plates 144 and 145. Piezo-resonators 196 and 197 which are similar in structure to the piezo-resonators 142 and 143 shown in FIG. 47 are laterally coupled with each other to allow vibration of piezoelectric vibrating parts 196a and 197a thereof, thereby forming the resonance plate 195.

Thus, laterally coupled two resonators may be integrated with each other to form a resonance plate by only the two resonators according to the preferred embodiments of the present invention.

The piezoelectric vibrating parts 196a and 197a of the piezo-resonators 196 and 197 are substantially similar in structure to those of the piezo-resonators 143 and 142, respectively. However, the piezo-resonators 196 and 197 are provided with no dynamic dampers. Namely, the piezo-resonators 196 and 197 are formed by the aforementioned second and first type piezo-resonators, respectively.

Holding parts 196b, 197b, 196c and 197c of the piezo-resonators 196 and 197 are coupled with each other, so that the piezo-resonators 196 and 197 are integrated with each other.

The resonance plate 195 is fixed to the base substrate 193 by a conductive adhesive. Namely, a lead electrode 199a which is connected to one resonance electrode of the piezo-resonator 196 and a resonance electrode provided on an upper surface of the piezo-resonator 197 is coupled to the connecting conductive part 193a through a conductive adhesive 198a. Similarly, a lead electrode which is electrically connected to a resonance electrode provided on a lower surface of the piezo-resonator 197 is electrically connected and physically coupled to the connecting conductive part 193b through a conductive adhesive 198b. A lead electrode (not shown in FIG. 58) which is formed on a lower surface of the piezo-resonator 196 to be electrically connected to another resonance electrode of the piezo-resonator 196 is also electrically connected to the connecting conductive part 193c through a conductive adhesive.

In this case, it is possible to define spaces for allowing vibration of the piezoelectric vibrating parts 196a and 196b of the piezo-resonators 196 and 197 between the piezo-resonators 196 and 197 and the base substrate 193, by applying the conductive adhesives 198a and 198b in prescribed thicknesses.

The resonance plate 195 may alternatively be pasted onto the base substrate 193 through spacers for ensuring the aforementioned spaces, in place of the conductive adhesives.

Also in the ladder-type filter according to this preferred embodiment, the two piezo-resonators 196 and 197 are laterally coupled and integrated with each other. Thus, it is possible to readily form a chip-type piezoelectric filter which can be reduced in height. Further, the plurality of piezo-resonators 196 and 197 are enclosed in a closed space which is defined between the base substrate 193 and the cap member 194, whereby it is also possible to readily form a ladder-type filter which is excellent in environment resistance such as moisture resistance.

<Third Type Energy Trap Piezo-Resonator>

A third type piezo-resonator employed in the preferred embodiment of the present invention a piezo-resonator utilizing a new vibration mode which has been discovered by the inventor. The newly discovered vibration mode is now described with reference to FIGS. 59 to 63.

Figure 59:
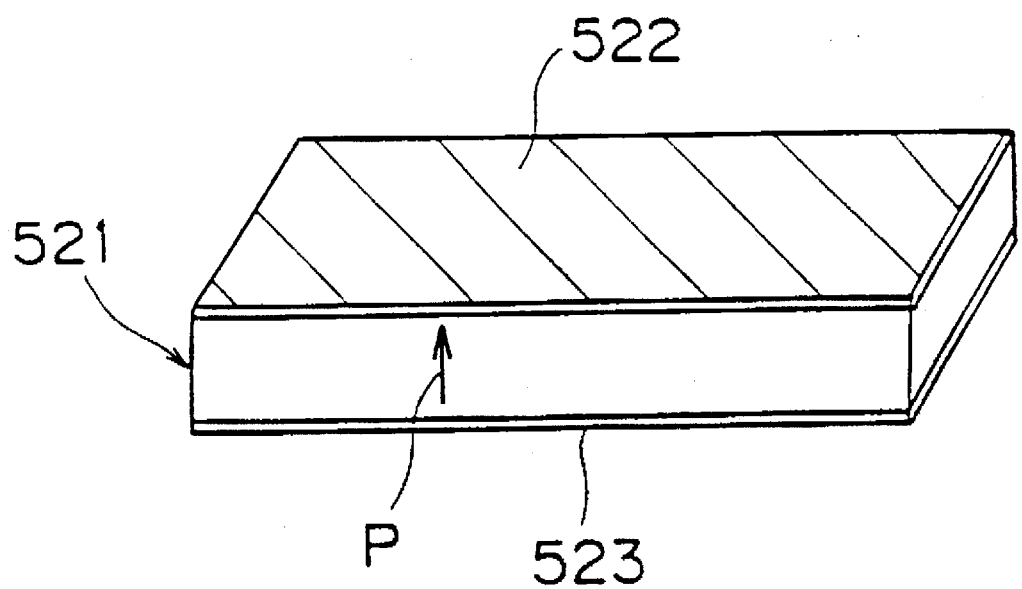
FIG. 59 is a perspective view showing a piezoelectric plate as a model for illustrating a third type piezo-resonator.

Consider a model comprising a rectangular piezoelectric plate 521 and electrodes 522 and 523 which are formed entirely over the major surfaces thereof, as shown in FIG. 59. The piezoelectric plate 521 has a rectangular planar shape provided with rectangular upper and lower surfaces. Further, the piezoelectric plate 521 is uniformly polarized along its thickness, i.e., along arrow P.

Figure 60:
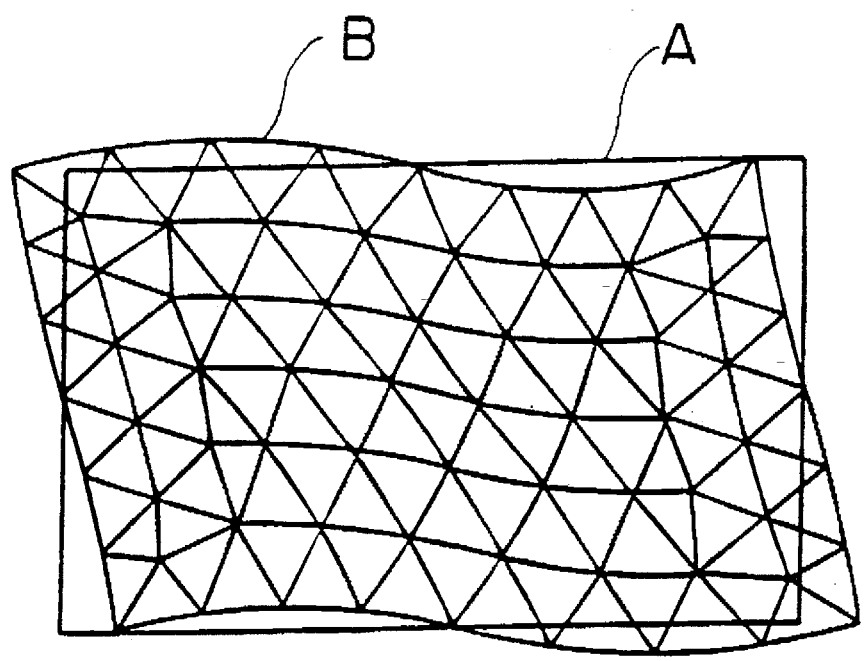
FIG. 60 is a typical plan view showing a displaced state of the piezoelectric plate appearing in FIG. 59 which is analyzed by a finite element method.

It has been recognized that a vibration mode shown in FIG. 60 is excited in a certain range of the planar shape of the piezoelectric plate 521 by analyzing secondary harmonics of bending vibration by a finite element method in a case of applying an alternating voltage across the electrodes 522 and 523 thereby making the piezoelectric plate 521 vibrate. Referring to FIG. 60 showing the vibration mode which was analyzed by the finite element method, the original shape of the piezoelectric plate 521 is shown by lines A, and vibration is repeated between a displaced state shown by lines B and a state opposite to that shown by the lines B.

Figure 61:
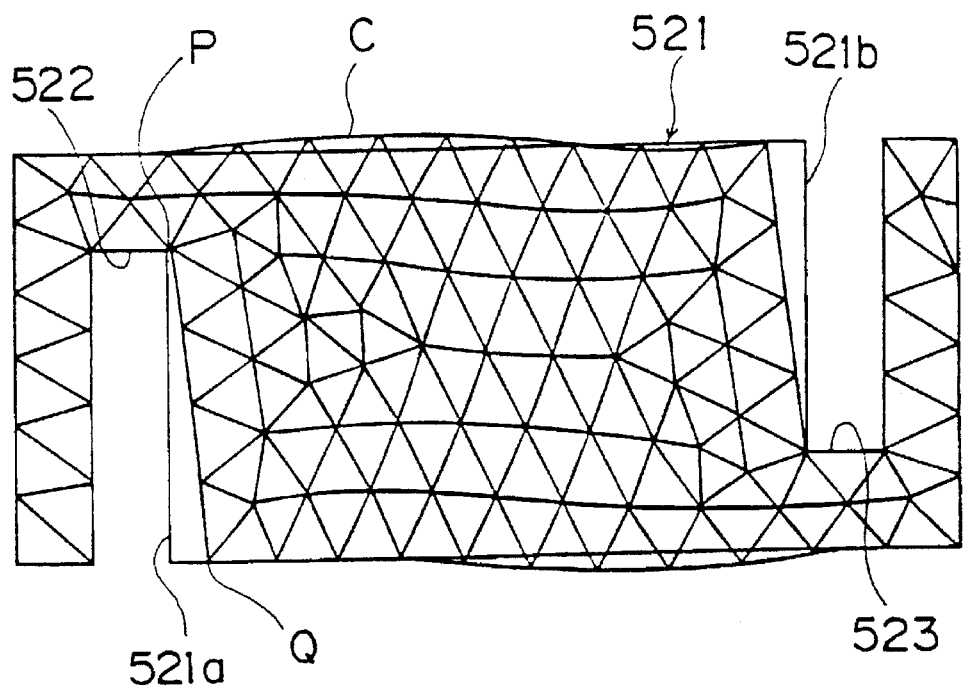
FIG. 61 is a typical sectional view showing a displaced state of the piezoelectric plate appearing in FIG. 59, which is coupled with support parts and holding parts, analyzed by a finite element method.

It has been confirmed that vibrational energy is trapped as shown in FIG. 61 when the piezoelectric plate 521 excited in the aforementioned bending mode vibration of secondary harmonics is held on single ends of a pair of side surfaces along a pair of shorter edges. Referring to FIG. 61 showing displacement distribution analyzed by a finite element method, a coupling part 522 is coupled to a side surface 521a on a shorter side of the piezoelectric plate 521. Another coupling part 523 is coupled to an end of another side surface 521b along another shorter side. In this case, the coupling parts 522 and 523 are coupled to both ends of a diagonal line on an upper surface of the piezoelectric plate 521.

As clearly understood from FIG. 61, no displacement is propagated to portions outward beyond the coupling parts 522 and 523 in a displaced stated C when the coupling parts 522 and 523 are coupled to hold the piezoelectric plate 521 by these parts 522 and 523. In other words, it is understood possible to trap bending mode vibration of secondary harmonics of the piezoelectric plate 521 in a portion up to the coupling parts 522 and 523.

Figure 62:
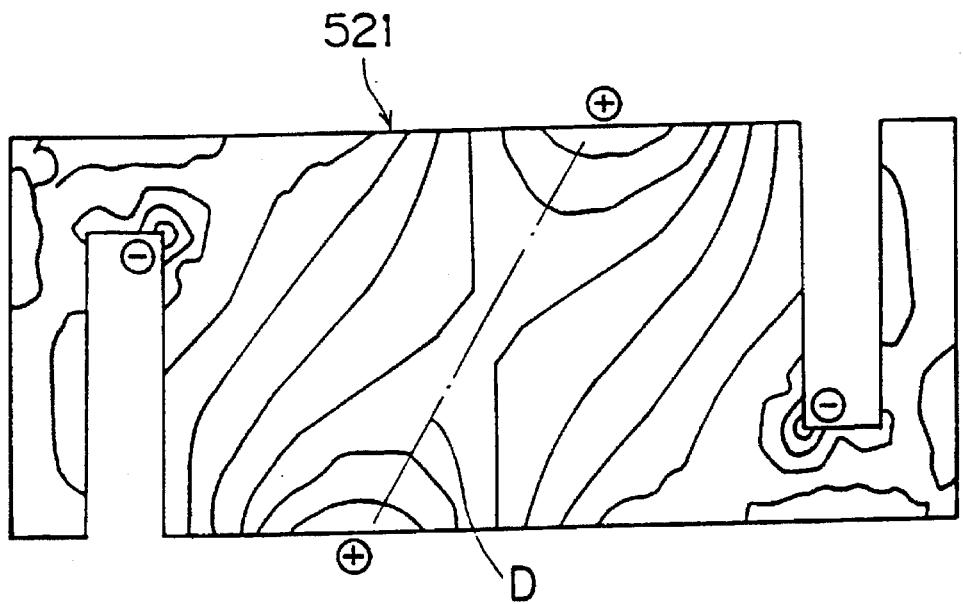
FIG. 62 is a plan view showing charge distribution in the displaced state shown in FIG. 61.

FIG. 62 shows charge distribution in the displaced state C shown in FIG. 61. A region of plus polarity extends on the upper surface of the piezoelectric plate 521 in a direction along a phantom line D, which extends substantially along one diagonal line. Further, portions having strong negative polarity potentials appear in portions close to corners of the other diagonal line.

in order to strongly excite vibration between the displaced state C shown in FIG. 61 and a state reverse thereto by coupling the aforementioned coupling parts 522 and 523, therefore, resonance electrodes may conceivably be formed in response to the charge distribution shown in FIG. 62.

When the coupling parts 522 and 523 are coupled to the rectangular piezoelectric plate 521 and a voltage is applied across electrodes provided on both surfaces, bending mode vibration of secondary harmonics is strongly excited and energy of this vibration is trapped in the portion up to the coupling parts 522 and 523. It has been recognized that such an effect is attained only when the dimensions of the piezoelectric plate 521 are in specific preferred ranges.

The inventor has employed samples of the piezoelectric plate 521 having various dimensions to excite vibration repeated between the displaced state C shown in FIG. 61 and a state reverse thereto in each sample, whereby it has been recognized that such vibration is strongly excited and vibrational energy is effectively trapped in the portion up to the first and second coupling parts 522 and 523 when the ratio b/a is at a value satisfying the above equation (3) assuming that a and b represent lengths of shorter and longer sides of the rectangular surface of the piezoelectric plate 521 respectively and σ represents the Poisson's ratio of the material forming the piezoelectric plate 521. Namely, the inventor has prepared samples from various piezoelectric materials at various ratios b/a, to analyze displaced states by the finite element method, as shown in FIG. 61. As a result, it has been confirmed that the ratio b/a and the Poisson's ratio σ of the material forming the piezoelectric plate 521 may satisfy relation shown in FIG. 63A, in order to effectively trap the aforementioned bending mode vibration of secondary harmonics in the portion up to the coupling parts 522 and 523. From the result shown in FIG. 63A, it is understood that the lengths a and b of the shorter and longer sides may be selected so that the ratio b/a is as follows:

$$b/a = 0.3\sigma + 1.48$$

Further, the inventor has discovered that vibrational energy is trapped similarly to the above also when the ratio b/a is an integral number n times the value (0.3σ+1.48).

Figure 63A:
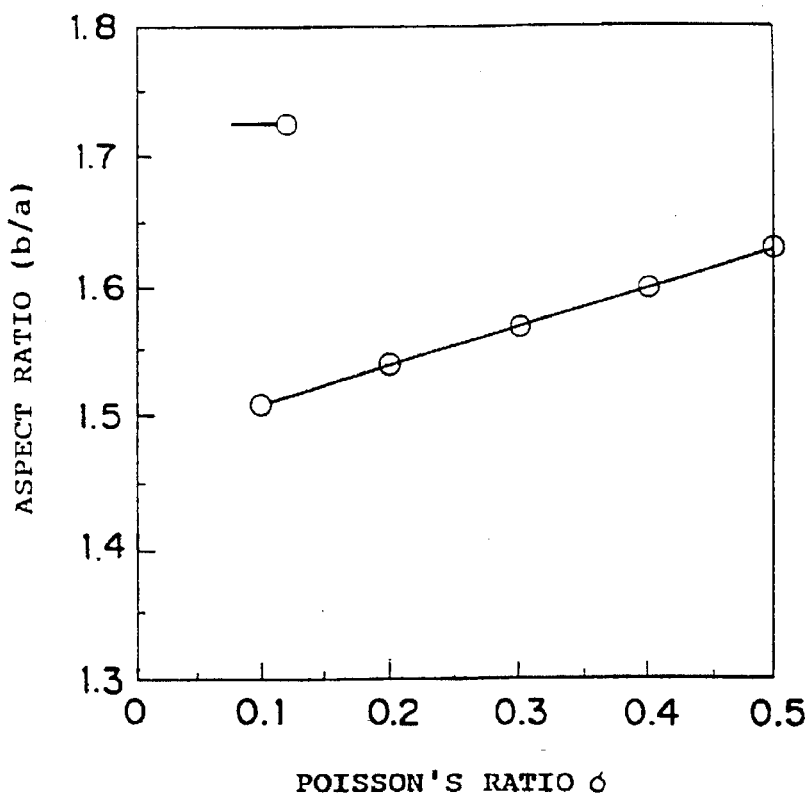
FIGS. 63A and 63B illustrates relation between Poisson's ratios σ of piezoelectric materials and ratios b/a and relation between amounts of relative displacement and values of integers n, respectively.
Figure 63B:
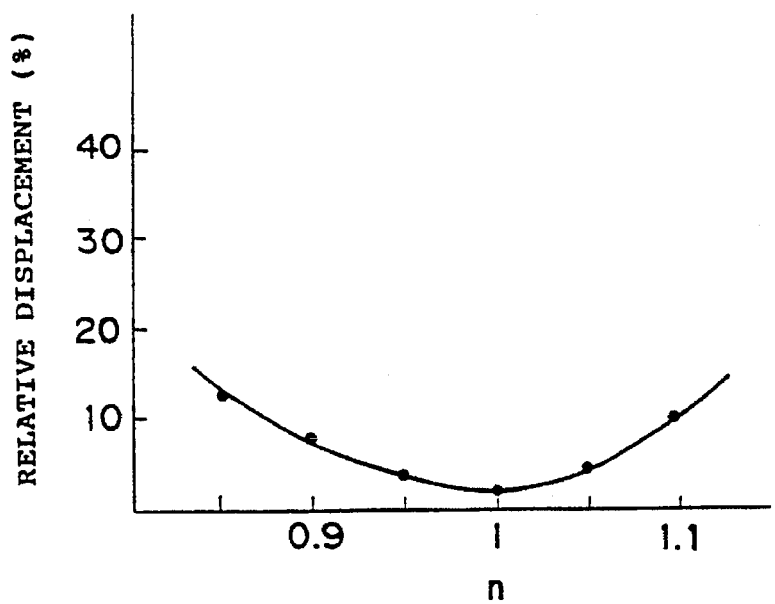

The inventor has further employed a piezoelectric plate comprising a piezoelectric material having a certain Poisson's ratio σ and then the integer was changed to a non-integer number and the non-integer number n was varied in the equation (3) over a range of 0.85 to 1.11, to measure a ratio of an amount of displacement at a point P exhibiting the minimum value to that of a point Q exhibiting the maximum value shown in FIG. 61, i.e., relative displacement (%). FIG. 63B shows the result.

It is clearly understood from FIG. 63B that the relative displacement is not more than 10% when the value for the non-integer number n is in a range of 0.9 to 1.1. On the other hand, it has been recognized that substantially no problem is caused in formation of a resonator when the relative displacement is not more than 10%. Therefore, it is possible to effectively trap vibrational energy in a piezoelectric vibrating part when the ratio b/a is in a range of ±10% from a value satisfying the equation (1).

As hereinabove described, it has been recognized possible to provide a piezo-resonator which is excellent in energy trap efficiency by bringing the ratio b/a into a range of ±10% from a value satisfying the equation (1) in a piezoelectric vibrating part having lengths a and b of shorter and longer sides with a Poisson's ratio σ of the material forming the piezoelectric plate. As to the aforementioned bending mode vibration of secondary harmonics, it has been confirmed that nodal points of this vibration are present in a center of the rectangular surface and centers of side surfaces along both shorter sides when no coupling parts 522 and 523 are coupled to the piezoelectric plate 521.

Example of Third Type Piezo-Resonator

Figure 64:
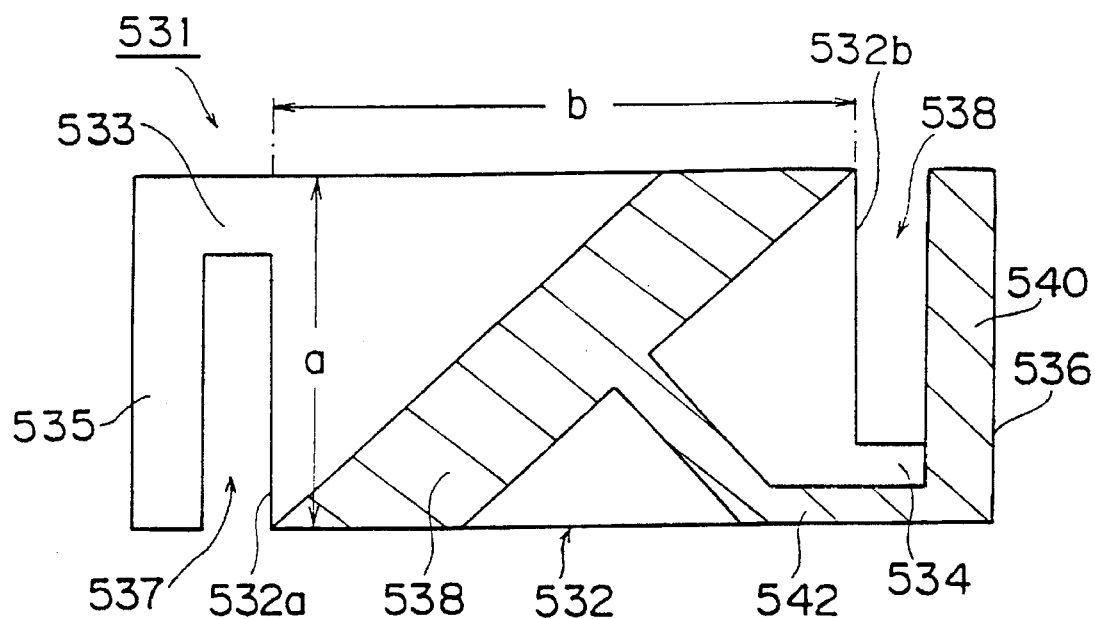
FIG. 64 is a plan view showing an example of the third type piezo-resonator.
Figure 65:
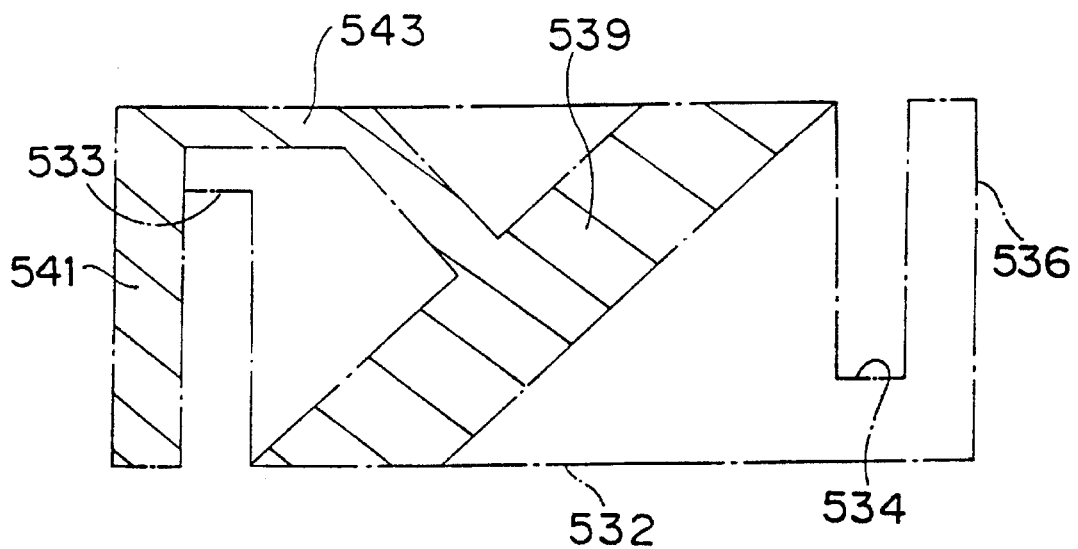
FIG. 65 is a typical plan view showing the shape of an electrode provided on a lower surface of the piezo-resonator shown in FIG. 64, through a piezoelectric plate.

FIG. 64 is a plan view showing an example of a third type piezo-resonator 531, and FIG. 65 is a typical plan view showing a shape of an electrode provided on a lower surface through a piezoelectric plate.

The piezo-resonator 531 has a rectangular piezoelectric plate 532, support parts 533 and 534, and holding parts 535 and 536. The piezoelectric plate 532 is preferably made of a piezoelectric material such as lead titanate zirconate piezoelectric ceramics, for example, and uniformly polarized along its thickness when the same is made of piezoelectric ceramics. This piezoelectric plate 532 has a rectangular planar shape, and the first support part 533 is coupled to an end of a first side surface 532a along a shorter side, while the second support part 534 is coupled to an end of a second side surface 532b along another shorter side. Further, the holding parts 535 and 536 having larger areas than the support parts 533 and 534 are coupled to outer sides of the support parts 533 and 534, respectively.

In the piezo-resonator 531, the piezoelectric plate 532, the first and second support parts 533 and 534 and the first and second holding parts 535 and 536 are formed by preparing a single piezoelectric plate and providing grooves 537 and 538 in this piezoelectric plate. Namely, the piezoelectric plate 532, the first and second support parts 533 and 534 and the holding parts 535 and 536 are integrally formed by the same material. Alternatively, the piezoelectric plate 532, the first and second support parts 533 and 534 and the first and second holding parts 535 and 536 maybe formed by separate members, to be bonded and integrated to and with each other by an adhesive or the like.

The piezoelectric plate 532 has a rectangular planar shape, which is so formed that a ratio b/a is in a range of ±10% from a value satisfying the equation (3) assuming that a and b represent lengths of shorter and longer sides of the rectangular surface and σ represents the Poisson's ratio of the material forming the piezoelectric plate 532.

A first resonance electrode 538 is formed on an upper surface of the piezoelectric plate 532, while a second resonance electrode 539 is formed on a lower surface to be opposed to the first resonance electrode 538 through piezoelectric plate 532. The first and second resonance electrodes 538 and 539 are formed to substantially meet the plus polarity region shown in FIG. 62. Namely, the first and second resonance electrodes 538 and 539 extend in a direction along the phantom line D shown in FIG. 62, i.e., a direction substantially along one of the diagonal lines.

A lead electrode 540 is formed on the second holding part 536, while a lead electrode 541 is formed on a lower surface of the first holding part 535. The first resonance electrode 538 is electrically connected to the lead electrode 540 through a connecting conductive part 542, while the second resonance electrode 539 is electrically connected to the lead electrode 541 through a connecting conductive part 543.

When an alternating voltage is applied across the lead electrodes 540 and 541 in the piezo-resonator 531, the alternating voltage is applied across the first and second resonance electrodes 538 and 539, thereby strongly exciting the aforementioned bending mode vibration of secondary harmonics.

In this case, the ratio b/a of the lengths of the longer and shorter sides of the piezoelectric plate 532 is set in the range of ±10% from the value satisfying the equation (3), whereby vibration is effectively trapped in a portion up to the support parts 533 and 534. Even if the piezoelectric plate 532 is mechanically held through the holding parts 535 and 536, therefore, resonance characteristics are hardly deteriorated. In other words, it is possible to provide an energy trap type piezo-resonator 531 effectively trapping vibrational energy in the portion up to the support parts 533 and 534.

Eleventh Preferred Embodiment

Figure 66:
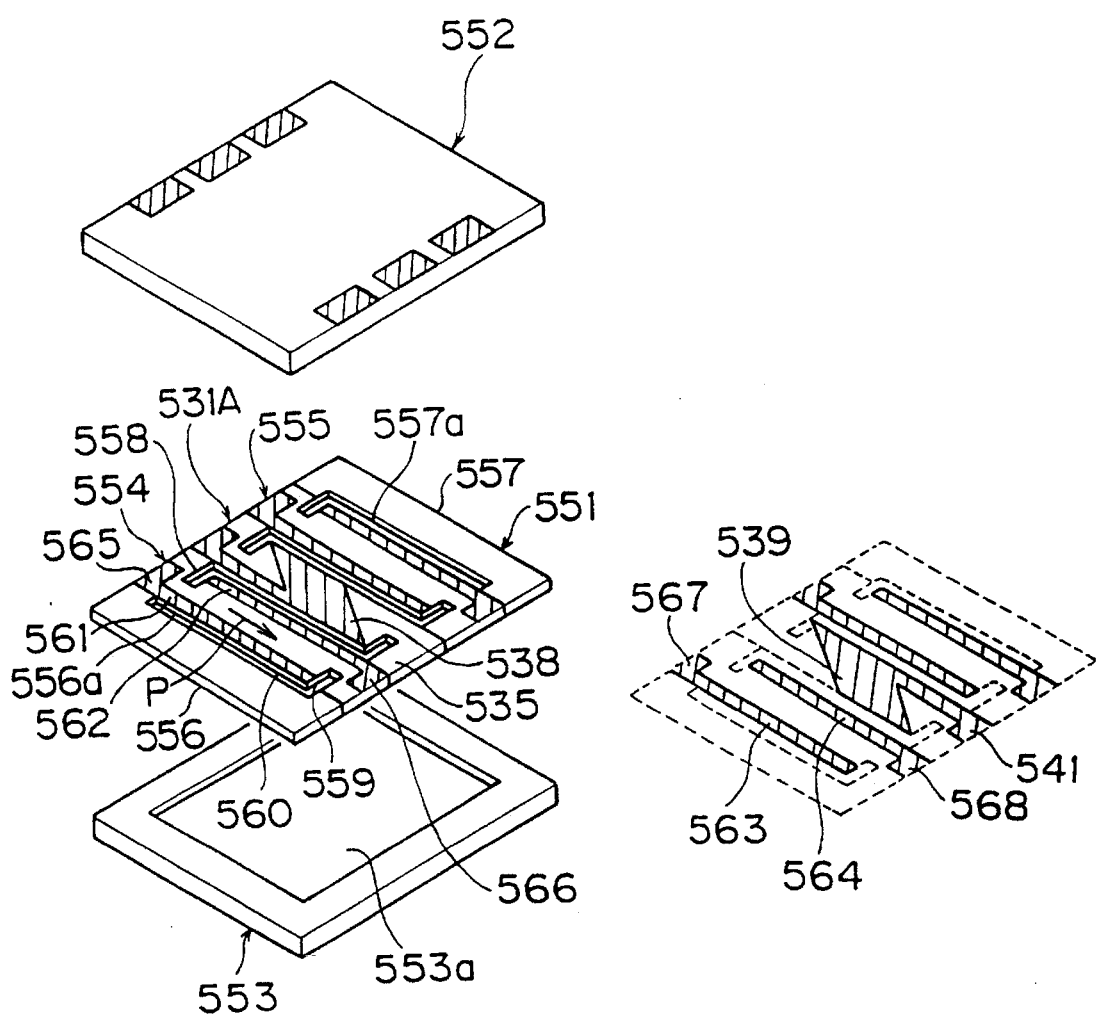
FIG. 66 is an exploded perspective view for illustrating a ladder-type filter according to an eleventh preferred embodiment of the present invention.
Figure 67:
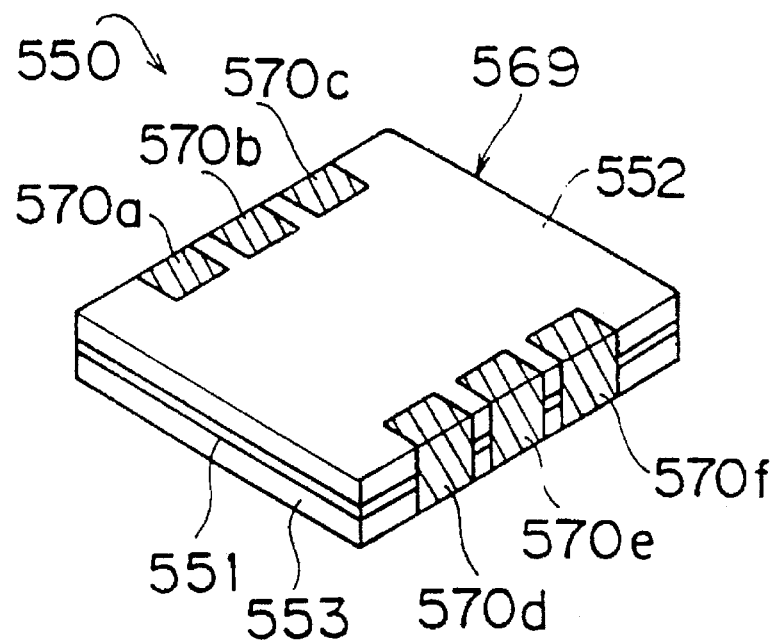
FIG. 67 is a perspective view showing the appearance of the ladder type filter according to the eleventh preferred embodiment.

FIG. 66 is an exploded perspective view showing a ladder-type filter according to an eleventh preferred embodiment of the present invention, and FIG. 67 is a perspective view showing its appearance.

The ladder-type filter according to this preferred embodiment has a resonance plate 551 and case substrates 552 and 553 which are pasted to upper and lower portions of the resonance plate 551.

The resonance plate 551 has a third type piezo-resonator 531A which is similar in structure to the aforementioned piezo-resonator 531. This piezo-resonator 531A is similar in structure to the piezo-resonator 531 shown in FIGS. 64 and 65, except that connecting conductive parts 542 and 543 which are formed on upper and lower surfaces are slightly different in shape. Thus, identical portions are denoted by the same reference numerals, to omit redundant description.

According to this preferred embodiment, energy trap type piezo-resonators 554 and 555 utilizing a shear mode are bonded to outer sides of the piezo-resonator 531A. The piezo-resonator 554 is provided with grooves 558 and 559 which are formed in an elongated rectangular piezoelectric plate, so that a piezoelectric vibrating part 560 is defined by a portion held between the grooves 558 and 559. In the piezoelectric vibrating part 560, the piezoelectric plate is polarized along arrow P, i.e., along the longitudinal direction of the piezo-resonator 554. The planar shape of the piezoelectric vibrating part 560 is selected so as to satisfy the aforementioned equation (3) assuming that a and b represent lengths of shorter and longer sides thereof and σ represents the Poisson's ratio of the material forming the piezoelectric vibrating part 560. The piezo-resonator 554 is further provided on its upper surface with first and second resonance electrodes 561 and 562 along both side edges thereof. The piezo-resonator 554 is also provided on its lower surface with first and second resonance electrodes 563 and 564. FIG. 66 schematically shows electrode shapes on a lower surface of the resonance plate 551, on its right side. In the piezo-resonator 554, the first and second resonance electrodes 561 and 562 are electrically connected to lead electrodes 565 and 566 which are formed on holding parts provided on both ends, respectively. Similarly, the first and second resonance electrodes 563 and 564 are also electrically connected to lead electrodes 567 and 568 respectively on the lower surface of the piezo-resonator 554. The piezo-resonator 555 is similar in structure to the piezo-resonator 554.

When alternating voltages are applied across the first and second resonance electrodes 561 and 562 as well as across the first and second resonance electrodes 563 and 564 in the piezo-resonator 554, the piezoelectric vibrating part 560 is excited in a shear mode. Due to the aforementioned specific shape of the piezoelectric vibrating part 560, resonance energy is effectively trapped in the piezoelectric vibrating part 560. Namely, resonance characteristics are hardly deteriorated even if the piezo-resonator 554 is mechanically held through the holding parts provided outside the grooves 558 and 559.

First and second spacer plates 556 and 557 are bonded to outer dies of the piezo-resonators 554 and 555, respectively. The spacer plates 556 and 557 are formed by U-shaped members, to define clearances 556a and 557a for allowing vibration of resonance parts of the piezo-resonators 554 and 555. The piezo-resonator 531A and the piezo-resonators 554 and 555 are also bonded to each other through clearances for preventing piezoelectric vibrating parts thereof from coming into contact with each other.

The first and second spacer plates 556 and 557 are made of a suitable material such as insulating ceramics such as alumina or synthetic resin, for example. The first and second spacer plates 556 and 557 are formed to be similar in thickness to the piezo-resonators 531A, 554 and 555. Namely, the resonance plate 551 is prepared as a plate-type member having a substantially uniform thickness as a whole.

The first and second case substrates 552 and 553 are made of insulating ceramics such as a alumina or synthetic resin. A cavity 553a having a rectangular planar shape is formed in an upper surface of the second case substrate 553. A similar cavity (not shown in particular) is also formed in a lower surface of the first case substrate 552.

The cavity 553a is adapted to define a space for allowing vibration of vibrating parts of the piezo-resonators 531A, 554 and 555 under the resonance plate 551.

As shown in FIG. 67, the ladder-type filter 550 according to this preferred embodiment is obtained by pasting the resonance plate 551 and the first and second case substrates 552 and 553 to each other by an adhesive or the like. External electrodes 570a to 570c and 570d to 570f are formed on both side surfaces of a laminate 569.

Figure 68:
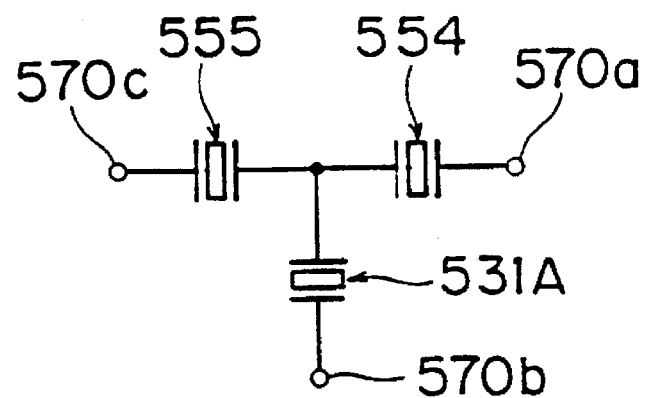
FIG. 68 illustrates the circuit structure of the ladder-type filter according to the eleventh preferred embodiment.

Therefore, it is possible to form a T-type filter shown in FIG. 68 by employing the external electrodes 570c, 570b and 570a as an input end, a terminal which is connected to a reference potential and an output end, respectively, and interconnecting the external electrodes 570d to 570f with each other in the chip-type filter 550. In the circuit shown in FIG. 68, two series resonators 554 and 555 utilizing a shear mode, and a single parallel resonator is formed by the piezo-resonator 531A.

It is possible to form a three-stage ladder-type filter by combining the aforementioned chip-type filter 550 with a chip-type filter having a π-type connection structure as hereafter described.

Twelfth Preferred Embodiment

Figure 69:
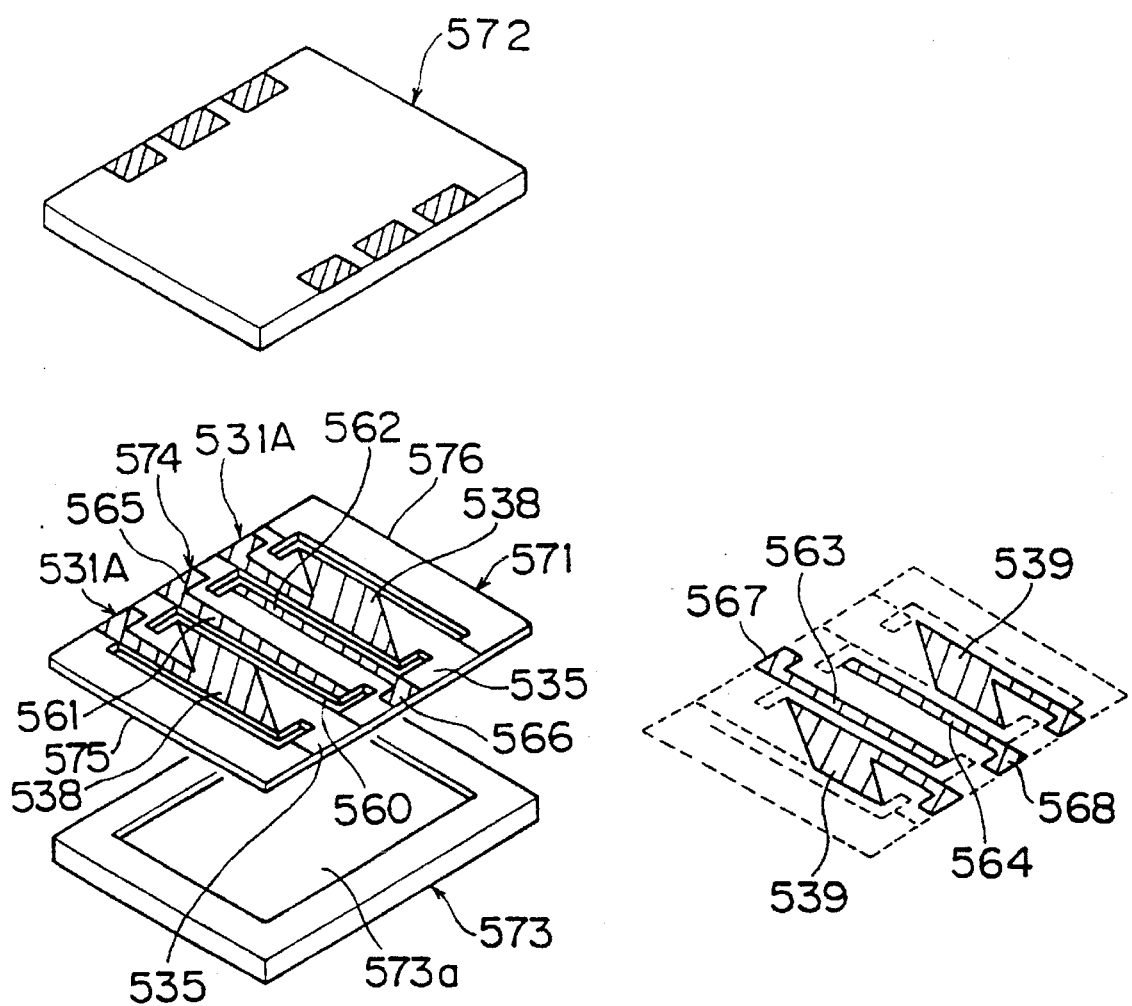
FIG. 69 is an exploded perspective view for illustrating a ladder-type filter according to a twelfth preferred embodiment of the present invention.
Figure 70:
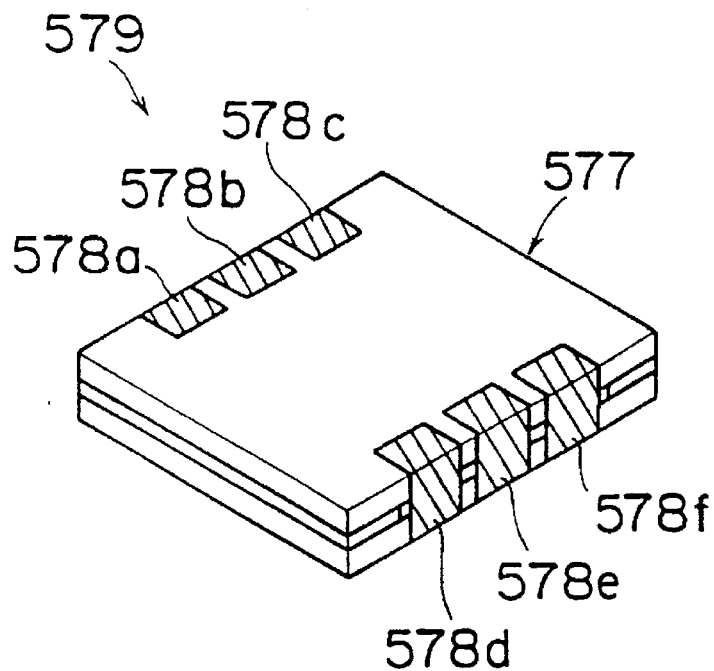
FIG. 70 is a perspective view showing the appearance of the ladder type filter according to the twelfth preferred embodiment.
Figure 71:
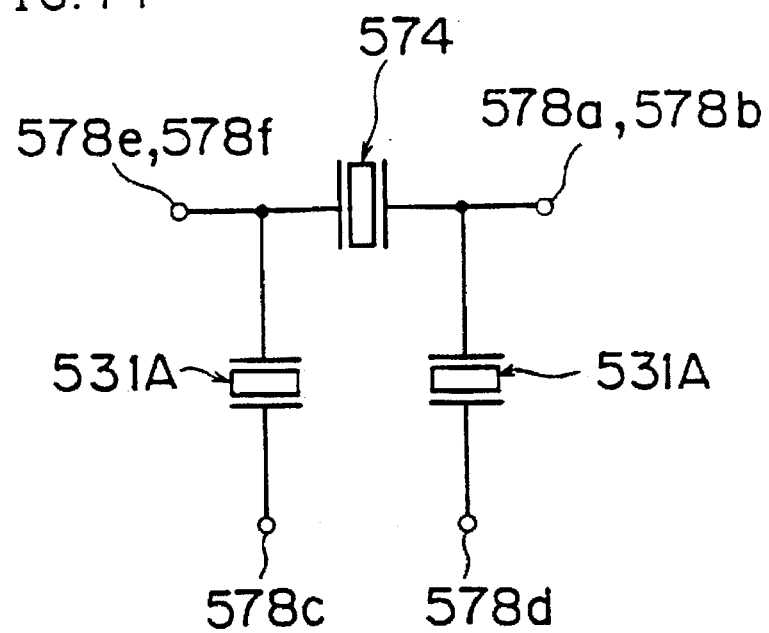
FIG. 71 illustrates the circuit structure of the ladder-type filter according to the twelfth preferred embodiment.
Figure 72:
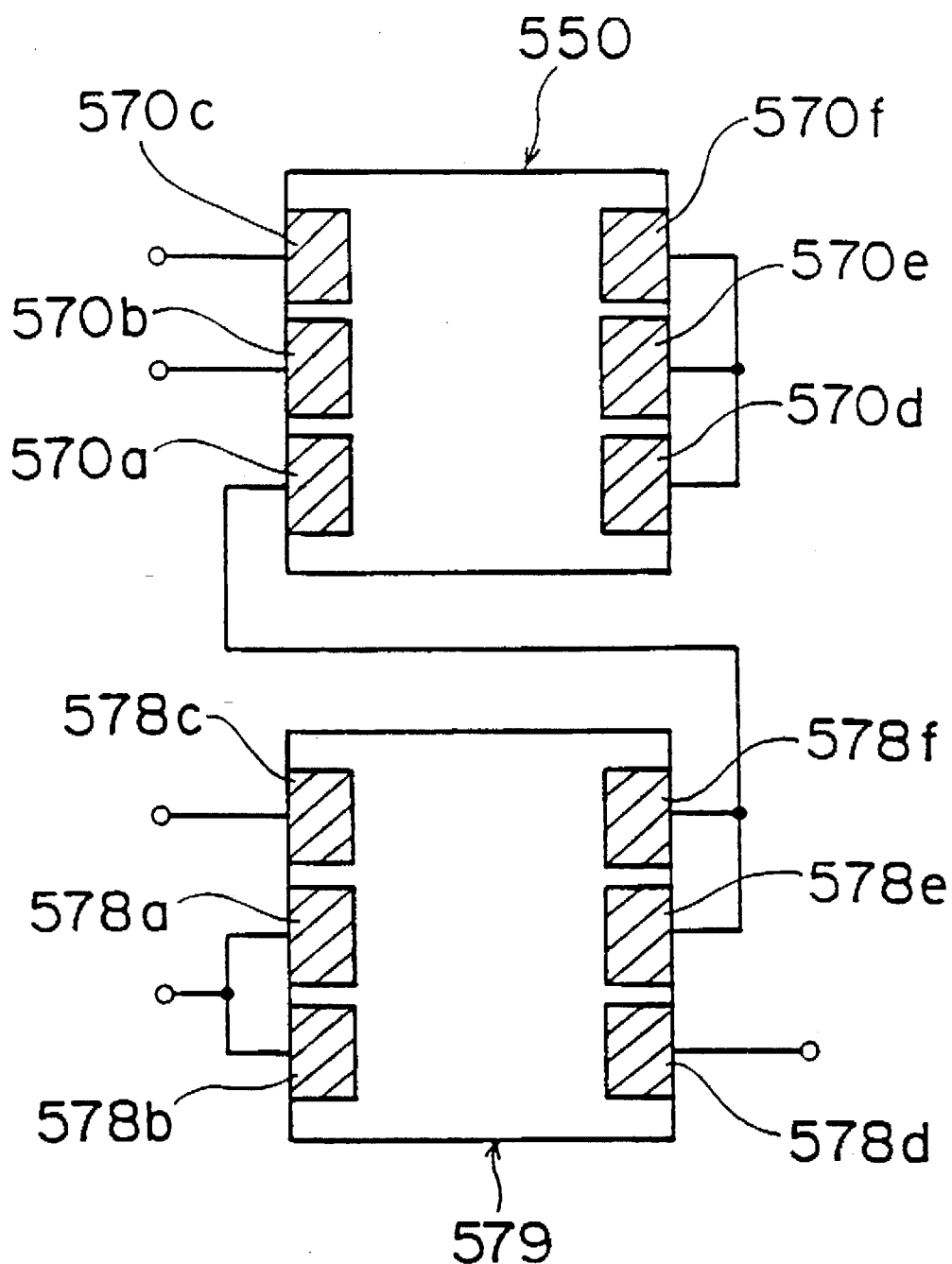
FIG. 72 is a plan view showing the ladder-type filters according to the eleventh and twelfth preferred embodiments which are connected with each other.

FIGS. 69 and 70 are an exploded perspective view for illustrating a chip-like ladder-type filter according to a twelfth preferred embodiment of the present invention and a perspective view showing its appearance, respectively. This ladder-type filter has a π-type circuit structure shown in FIG. 71. Therefore, it is possible to form a three-stage ladder-type filter 550 having a T-type connection structure.

Referring to FIG. 69, first and second case substrates 572 and 573 are stacked on upper and lower portions of a resonance plate 571 in the chip-type filter according to this preferred embodiment. The first and second case substrates 572 and 573 are similar in structure 552 and 553. Namely, a cavity 573a is formed in an upper surface of the case substrate 573, while a cavity is also formed in a lower surface of the case substrate 572.

In the resonance plate 571, a piezo-resonator 574 utilizing a shear mode is arranged on its center, and third type piezo-resonators 531A are connected to both sides of the piezo-resonator 574, respectively. The piezo-resonator 574 is similar in structure to the piezo-resonator 554 utilizing a shear mode employed in the eleventh preferred embodiment. Namely, the ladder-type filter according to the twelfth preferred embodiment has such a structure that the piezo-resonator 574 for forming a series of resonator is arranged on its center and the piezo-resonators 531A for forming parallel resonators are bonded to both sides thereof. Further, first and second spacer plates 575 and 576 are similar in structure to the first and second spacer plates 556 and 557 employed in the eleventh preferred embodiment. Thus, identical portions are denoted by the same reference numerals, to omit redundant description.

In the chip-type filter according to this preferred embodiment, a laminate 577 shown in FIG. 70 is obtained by pasting the case substrates 572 and 573 to the upper and lower portions of the resonance plate 571, respectively. External electrodes 578a to 578c and 578d to 578f are formed on both side surfaces of the laminate 577, respectively. Thus, a chip-like ladder-type filter 579 according to the twelfth preferred embodiment is obtained.

In the ladder-type filter 579, the external electrodes 578a and 578b are connected in common, to define an output above, whereby resonance characteristics of the piezo-resonator are hardly deteriorated even if the same is mechanically supported in the holding parts. Therefore, it is possible to effectuate the resonance characteristics of each piezo-resonator as desired by connecting the same to other members at the holding parts as described with reference to each of the first to twelfth preferred embodiments. Thus, it is possible to reliably provide a ladder-type filter having stable characteristics.

While a first piezo-resonator and an additional piezo-resonator are bonded with each other as needed and first and second spacer plates are bonded to both sides thereof to define a resonance plate in each of the first to twelfth preferred embodiments, the resonance plate may alternatively be integrally formed by the same material. In the preferred embodiment shown in FIG. 29, for example, a rectangular piezoelectric plate may be prepared so that the same is worked with a laser beam or the like to meet the planar shape of the resonance plate 22 and provided with prescribed electrode patterns on both surfaces, thereby obtaining the resonance plate 22. In this case, it is possible to omit bonding portions provided on outer peripheral edges of the resonance plate 22 since the resonance plate 22 is formed by an integral member, thereby improving moisture resistance of the chip-like filter. In other words, it is possible to reliably prevent infiltration of moisture from side portions of the resonance plate 22 in the chip-like filter as obtained.

While a fourth type piezo-resonator utilizing a shear mode is shown in each of the first to third preferred embodiments as a piezo-resonator which is combined with a first type piezo-resonator, this piezo-resonator may alternatively be prepared from another energy trap type piezo-resonator such as that utilizing a width expansion mode or a length expansion mode, for example.

Figure 73:
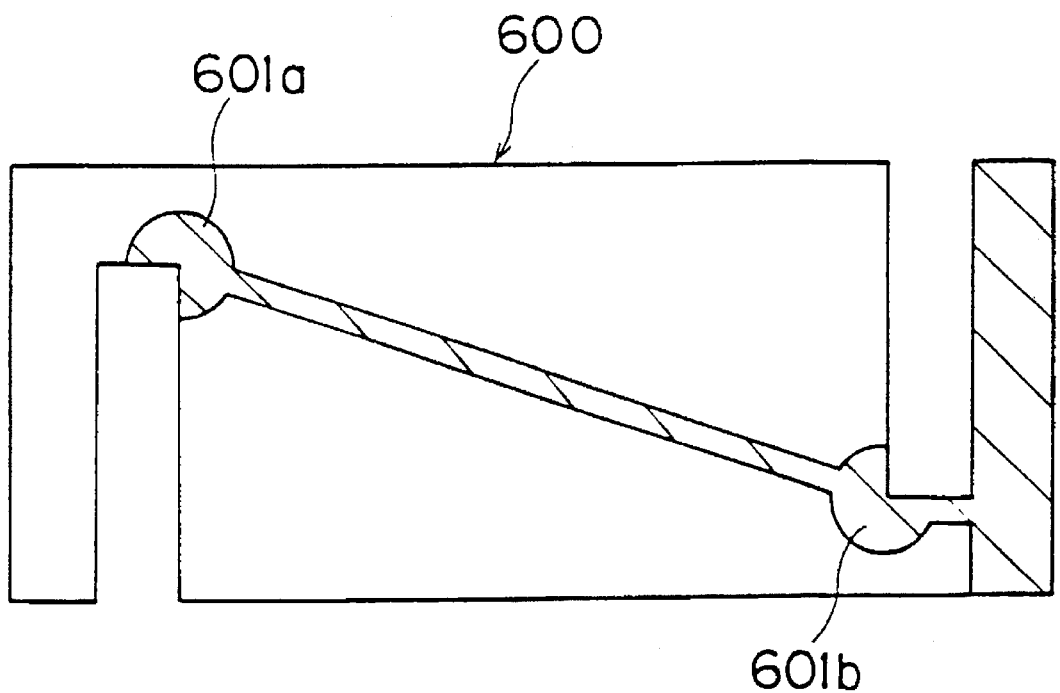
FIG. 73 is a plan view for illustrating another example of the third type piezo-resonator.
Figure 74:
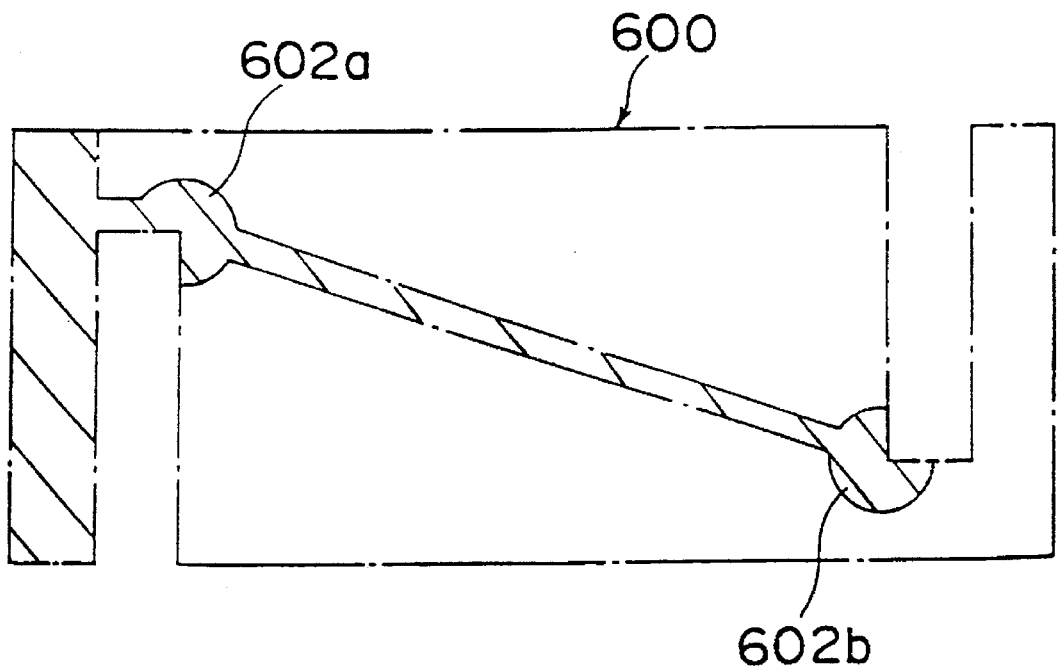
FIG. 74 is a plan view showing the shape of a lower electrode of the third type piezo-resonator through a piezoelectric plate.

Further, the electrode shapes of the third type piezo-resonator are not restricted to those shown in FIGS. 64 and 65. As shown in FIGS. 73 and 74, for example, a pair of first resonance electrodes 601a and 601b may be formed on an upper surface of a piezoelectric vibrating part 600 so that a pair of second resonance electrodes 602a and 602b are formed on a lower surface to be opposed to the first resonance electrodes 601a and 601b, respectively. In this case, the first and second resonance electrodes 601a to 602b are formed in portions having strong minus polarity in the charge distribution shown in FIG. 62. Therefore, bending mode vibration of degree 2n is reliably excited so that energy is trapped in the piezoelectric vibrating part 600, although the same is out of phase with the piezo-resonator 531 shown in FIG. 64.

Although the preferred embodiments of the present invention has been described and illustrated in detail, it is clearly understood that the same is by way of illustration and example only and is not to be taken by way of limitation, the spirit and scope of the present invention being limited only by the terms of the appended claims.

What is claimed is:

1. A ladder-type filter comprising:

at least one series resonator forming a series arm and at least one parallel resonator forming a parallel arm, said series and parallel resonators being mounted adjacent to each other in a horizontal direction and connected to each other along said horizontal direction; wherein at least one of said series and parallel resonators is a first piezo-resonator including:

a plate type piezoelectric vibrator having a pair of opposite rectangular surfaces, and four side surfaces coupling said pair of rectangular surfaces with each other, first and second resonance electrodes located on said pair of rectangular surfaces of said piezoelectric vibrator, and a support part being coupled to an end of each of said side surfaces of said piezoelectric vibrator that is located along a shorter side of each said rectangular surface, and a holding part being coupled to said support part, a ratio b/a being set in a range of +/− 10% from a value satisfying the following equation:

$$b/a = n(0.3\sigma + 1.48)$$

wherein a and b respectively represent lengths of shorter and longer sides of each said rectangular surface, σ represents the Poisson's ratio of the material forming said piezoelectric vibrator and n represents an integer, said first piezo-resonator being arranged and adapted to excite bending mode vibration having a degree of 2m through a piezoelectric transverse effect, wherein m is an integer.

2. A ladder-type filter in accordance with claim 1, further comprising first and second case substrates, at least a coupled structure of said at least two resonators being held between said first and second case substrates.

3. A ladder-type filter in accordance with claim 1, further comprising:

first and second resonance electrodes being provided on said piezoelectric vibrator, and a lead electrode being formed on each said holding part, said first and second resonance electrodes being electrically connected to a respective lead electrode.

4. A ladder-type filter in accordance with claim 3, further comprising a plurality of external electrodes located on an outer surface of said ladder-type filter, said plurality of external electrodes being electrically connected to a respective lead electrode.

5. A ladder-type filter in accordance with claim 1, further comprising a dynamic damper being provided between said piezoelectric vibrator and each said holding part, said dynamic damper having a structure such that a natural resonance frequency of said dynamic damper is substantially equal to a frequency of vibration generated by said piezoelectric vibrator.

6. A ladder-type filter in accordance with claim 1, wherein said support part and said holding part comprise a first support part and a first holding part, the ladder-type filter further comprising a second support part and a second holding part, said first support part and said first holding part being connected to a first side of said piezoelectric vibrator and said second support and said second holding part being coupled onto a second side of said piezoelectric vibrator.

7. A ladder-type filter in accordance with claim 6, further comprising first and second case substrates, at least a coupled structure of said resonators being held between said first and second case substrates.

8. A ladder-type filter in accordance with claim 1, wherein each of said series and parallel resonators includes a piezo-resonator having a plate type piezoelectric vibrator, a plate support part being coupled to said piezoelectric vibrator and a holding part being coupled to said support part arranged on each side of said piezoelectric vibrator.

9. A ladder-type filter in accordance with claim 8, further comprising first and second spacer plates being coupled to both sides of said piezo-resonators being laterally coupled with each other for allowing vibration of said piezo-resonators, thereby forming a resonance plate by said at least two piezo-resonators and said first and second spacer plates.

10. A ladder-type filter in accordance with claim 9, wherein said piezo-resonators and said first and second spacer plates forming said resonance plate are integrally formed by a single unitary member.

* * * * *